United States Patent
Sano et al.

(10) Patent No.: US 7,032,198 B2
(45) Date of Patent: Apr. 18, 2006

(54) METHOD OF OPTIMIZING SIGNAL LINES WITHIN CIRCUIT, OPTIMIZING APPARATUS, RECORDING MEDIUM HAVING STORED THEREIN OPTIMIZING PROGRAM, AND METHOD OF DESIGNING CIRCUIT AND RECORDING MEDIUM HAVING STORED THEREIN PROGRAM FOR DESIGNING CIRCUIT

(75) Inventors: Masahiro Sano, Kawasaki (JP); Toshiaki Sugioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 244 days.

(21) Appl. No.: 10/634,815

(22) Filed: Aug. 6, 2003

(65) Prior Publication Data

US 2004/0107408 A1 Jun. 3, 2004

Related U.S. Application Data

(62) Division of application No. 09/600,144, filed as application No. PCT/JP99/00205 on Jan. 21, 1999, now Pat. No. 6,651,224.

(30) Foreign Application Priority Data

Jan. 26, 1998 (JP) .................................. 10-012545
Sep. 4, 1998 (JP) .................................. 10-251400

(51) Int. Cl.
*G06F 17/50* (2006.01)
(52) U.S. Cl. .................................. 716/5; 716/18; 716/6
(58) Field of Classification Search .................... 716/1, 716/2, 4–15, 18
See application file for complete search history.

(56) References Cited

U.S. PATENT DOCUMENTS 5,410,491 A * 4/1995 Minami .......................... 716/6
5,557,779 A * 9/1996 Minami .......................... 716/6

(Continued)

FOREIGN PATENT DOCUMENTS

JP 64-16120 1/1989

(Continued)

OTHER PUBLICATIONS

Japanese language Office Action dated Apr. 23, 2002, in counterpart Japanese application 10-012545.

(Continued)

*Primary Examiner*—Stacy A. Whitmore
*Assistant Examiner*—Binh Tat

(57) ABSTRACT

A method for designing an integrated circuit such as a VLSI circuit, in particular optimizing delay of a signal transmitting through signal lines connecting a signal supplying source to each of elements, whereby skew can be decreased. The method can include determining whether the signal source satisfies a fan-out restriction if the signal source supplies a signal to all of the driven elements which are directly connected to the signal source, dividing the elements into groups so that the fan-out restriction is satisfied in each of the groups and each of the groups has the same or substantially same load capacity, when the signal source does not satisfy the fan-out restriction, and inserting into each group, a buffer having a size which makes the groups of elements satisfy the fan-out restriction. The dividing and the buffer inserting are repeated until a positive determination is delivered on the fan-out restriction.

13 Claims, 57 Drawing Sheets

U.S. PATENT DOCUMENTS

| | | | |
|---|---|---|---|
| 5,774,371 A * | 6/1998 | Kawakami | 716/10 |
| 6,044,209 A | 3/2000 | Alpert et al. | |
| 6,230,300 B1 * | 5/2001 | Takano | 716/2 |
| 6,272,667 B1 * | 8/2001 | Minami et al. | 716/6 |
| 6,305,001 B1 * | 10/2001 | Graef | 716/12 |
| 6,327,692 B1 | 12/2001 | Brown | |

FOREIGN PATENT DOCUMENTS

| | | |
|---|---|---|
| JP | HEI 4-23347 | 1/1992 |
| JP | 5-47932 | 2/1993 |
| JP | HEI 5-47932 | 2/1993 |
| JP | 5-54100 | 3/1993 |
| JP | HEI 8-6976 | 1/1996 |
| JP | 09-45783 | 2/1997 |
| JP | 9-63291 | 3/1997 |
| JP | 9-63292 | 3/1997 |
| JP | 9-218888 | 8/1997 |
| JP | 10-11494 | 1/1998 |

OTHER PUBLICATIONS

Kannan, Lalgudi, et al., "A Methodology and Algorithms for Post-Placement Delay Optimization," Proc. of the 31st ACM/IEEE Design Automation Conference, 1994 ACM-0-89791-653-0/94/0006, pp. 327-332.

* cited by examiner

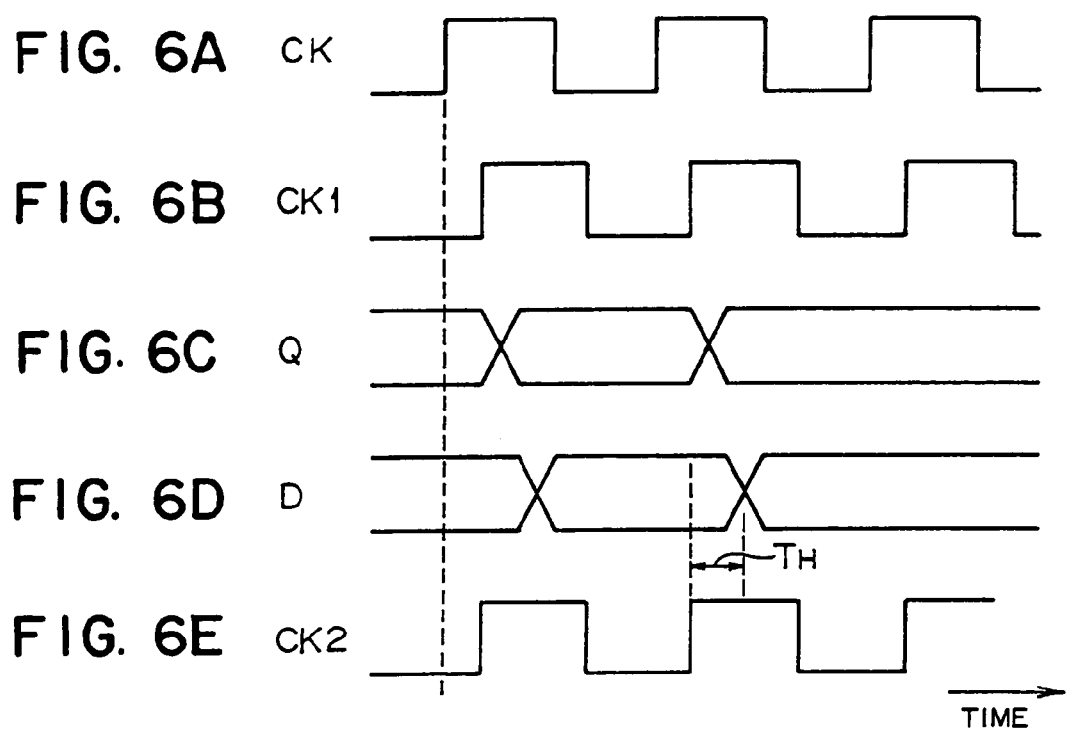

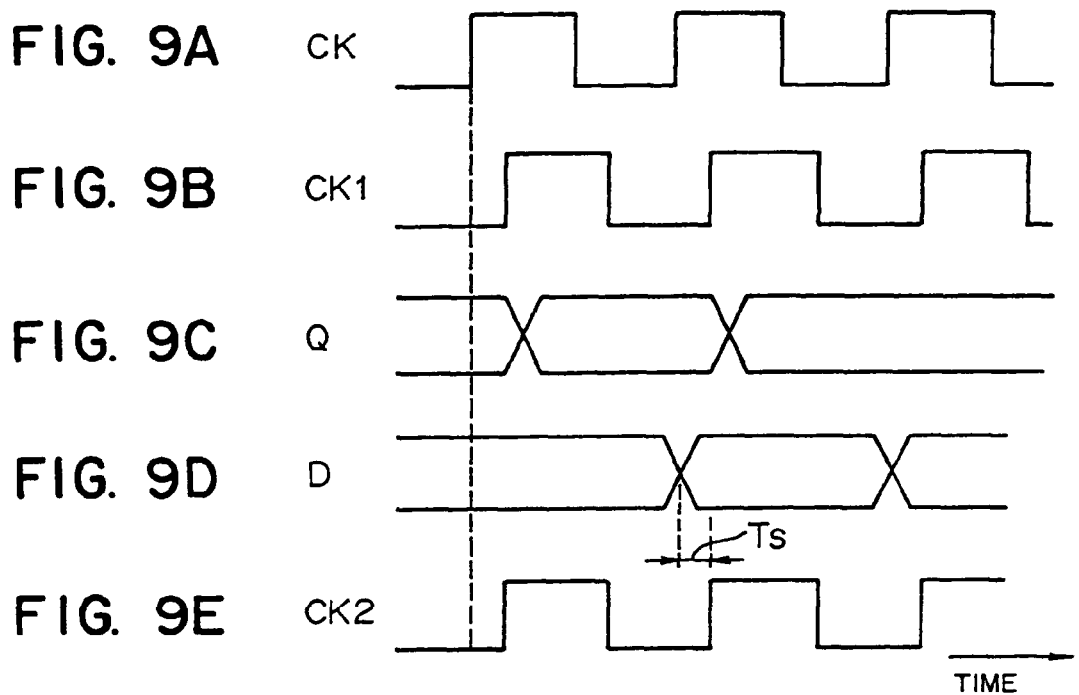

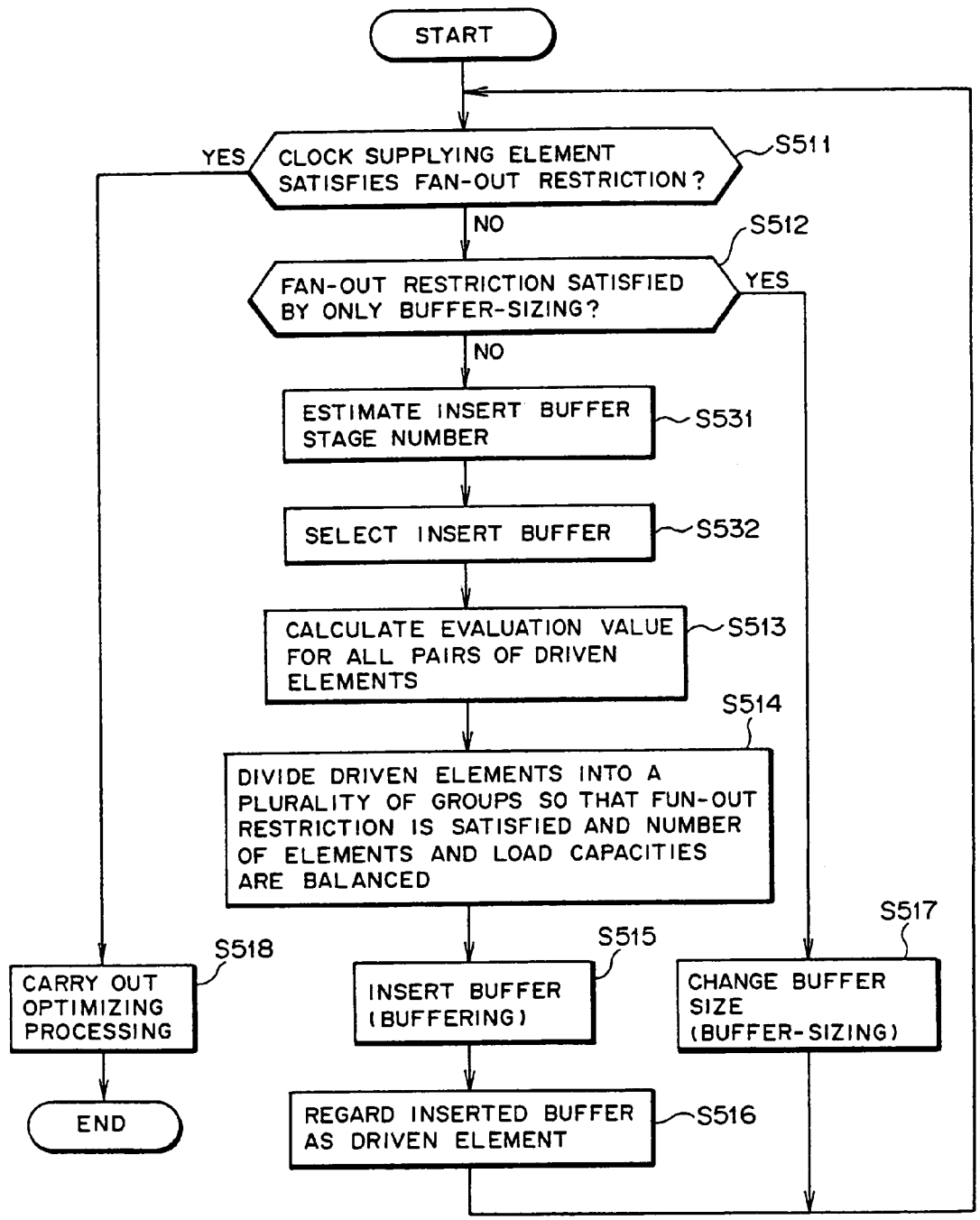

F I G. 54
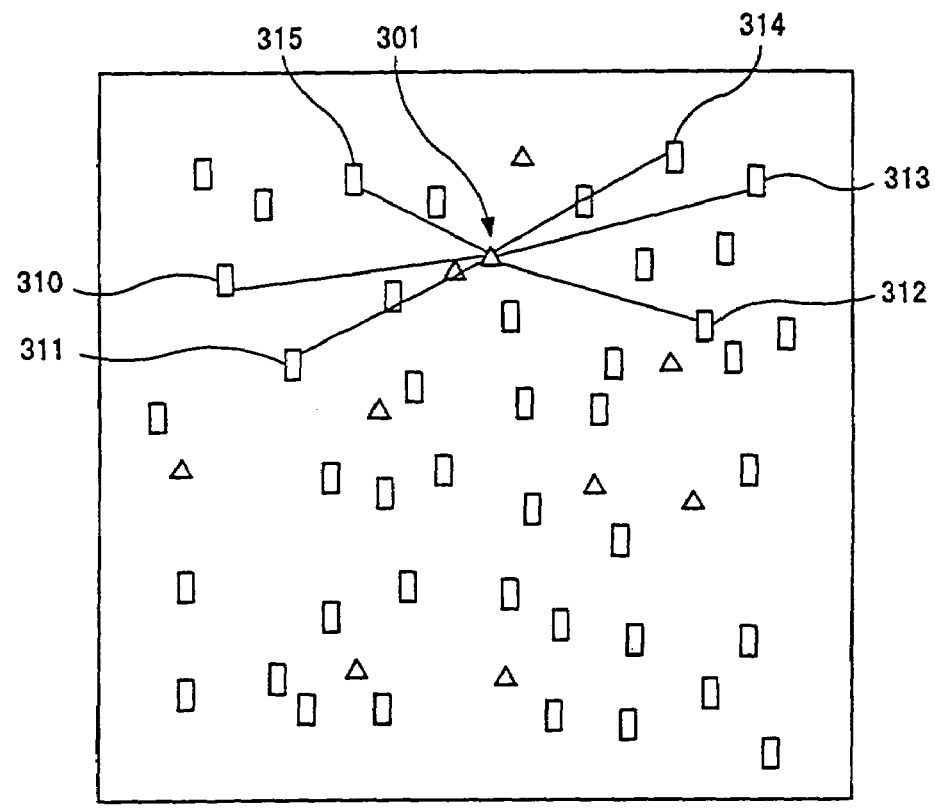
F I G. 55
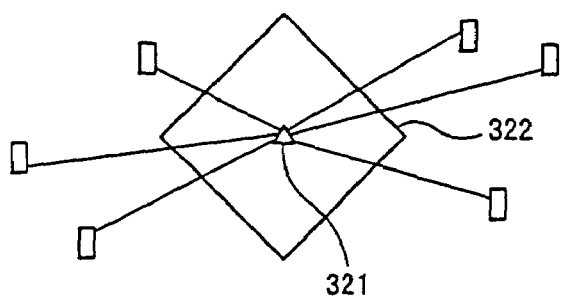

F I G. 62
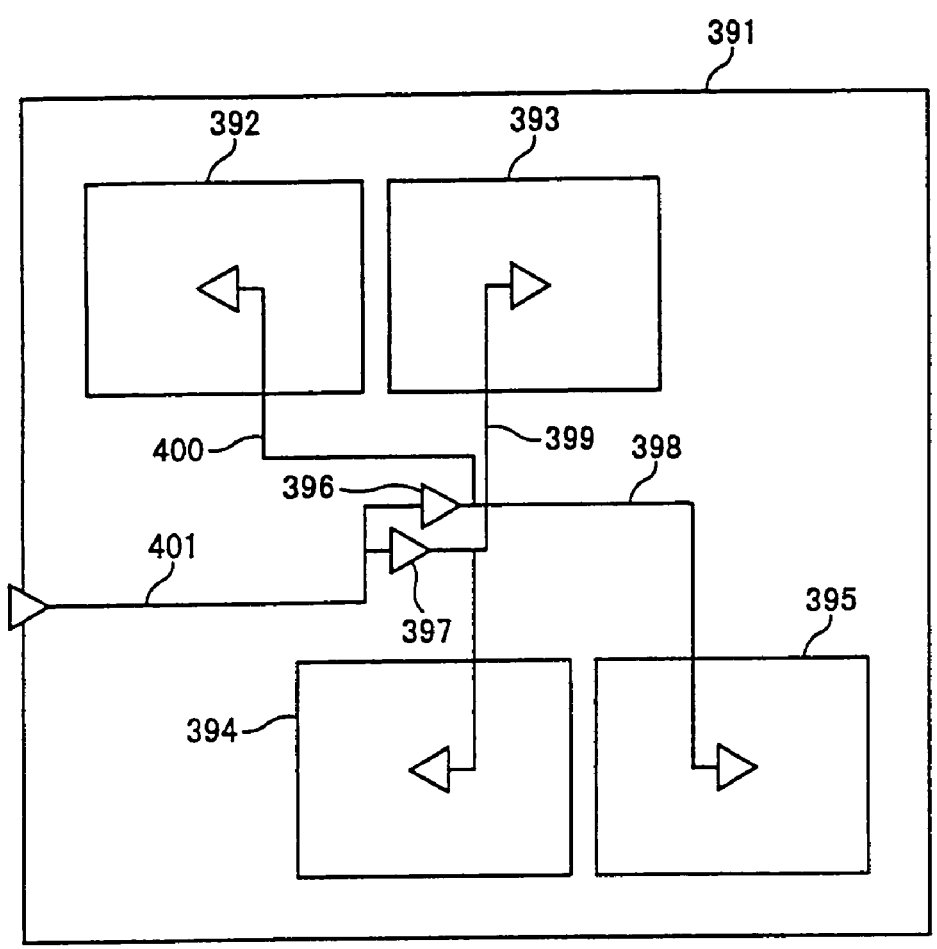

METHOD OF OPTIMIZING SIGNAL LINES WITHIN CIRCUIT, OPTIMIZING APPARATUS, RECORDING MEDIUM HAVING STORED THEREIN OPTIMIZING PROGRAM, AND METHOD OF DESIGNING CIRCUIT AND RECORDING MEDIUM HAVING STORED THEREIN PROGRAM FOR DESIGNING CIRCUIT

This is a DIV of 09/600,144 filed Jul. 12, 2000 now U.S. Pat. No. 6,651,224 which is a 371 of PCT/JP99/00205 filed Jan. 21, 1999.

TECHNICAL FIELD

The present invention relates to a technology utilized when designing a circuit which includes a signal supplying source (e.g., clock signal supplying source) within the circuit and a plurality of elements (e.g., flip-flop cells) supplied with a signal from the signal supplying source.

In more particularly, the present invention relates to a method of optimizing signal lines within the circuit, an optimizing apparatus and a recording medium having stored therein an optimizing program which are utilized when automatically synthesizing signal lines (net) connecting the signal supplying source to each of the elements in which a buffering scheme of a clock system net (signal lines) on an integrated circuit such as a VLSI is improved so that a delay or a skew of a signal from the signal supplying source to each of the elements is optimized.

Further, the present invention relates to a method of designing a circuit and a recording medium having stored therein a program for designing suitable for use in an implementation design of clock paths of an integrated circuit such as an LSI.

BACKGROUND ART

In general, an integrated circuit such as a VLSI has placed a number of driven elements (e.g., flip-flop cells (sometimes referred to as FF)) which are to be driven synchronously in response to a clock signal. The driven elements are supplied with a clock signal through a clock signal line from a clock supplying source (source).

In this case, as shown in FIG. 47, if several ten thousands of FF 502 are connected to a single clock supplying source 501, it will be impossible for all of the elements to be directly driven by the clock supplying source due to a fan-out restriction. In this case, the term fan-out restriction means a condition which shall be satisfied when a driving element (clock supplying source 501) drives driven elements (FF502) connected to the output side of the driving element. In more concretely, if the driving element does not satisfies the following equation in its driving capability, the elements under deriving cannot be driven.

[driving capability of the driving element]>[wiring capacity from the driving element to driven elements on the next stage]+[load of the driven elements on the next stage]

As described above, if several ten thousands of FFs 502 are arranged to driven directly by a single clock supplying source 1, the sum of the wiring capacity and loads of the FFs 502 will become extremely large. For this reason, even if a clock signal has a rising edge which rises as shown in FIG. 48A upon generating from the clock signal supplying source, the clock signal will come to have a rising edge dull as shown in FIG. 48B when the clock signal has traveled the distance from the clock supplying source 501 to each of the FFs 502, with the result that the clock signal becomes incapable of driving each FF 502.

For this reason, in general, an arrangement of buffering has been made as shown in FIG. 49. That is, clock signal lines extending between the clock supplying source 501 to each of the FFs 502 are wired in a tree-like manner (clock tree is synthesized), and a plurality of stages (in the case of FIG. 49, a couple of stages are shown) of buffer elements (sometimes referred to as buffer cell) are inserted and placed in the clock signal lines. If such a buffering is effected, the fan-out restriction will be satisfied in each of the plurality of stages of the buffer elements 503 between the clock supplying source 501 to the plurality of FFs 502.

Further, in order to satisfy the fan-out restriction, taken is a measure known as a buffer-sizing in which each cell provided in a clock system is adjusted or changed in its driving capability. A cell as a target of the buffer-sizing is, in addition to a logic gate or a selector, a buffer element which is provided on a clock signal line as a buffering element as described above. The selector is utilized for selecting a clock signal when a plurality of clock signals are supplied in the circuit under designing.

According to a conventional method of buffering or buffer-sizing, when clock system nets (clock signal lines or clock tree) are synthesized upon designing a circuit, an initial logic is once reduced into a placement based on a netlist obtained by a logic design, and thereafter a portion included in the placement in which the fan-out restriction is not satisfied is subjected to a process of buffering or buffer-sizing so that the portion satisfies the fan-out restriction. If a portion of the placement reduced from the initial logic satisfies the fan-out restriction, the portion is not subjected to the process of buffering or buffer-sizing.

The above-described design scheme is disclosed in, for example, a reference entitled "A Methodology and Algorithms for Post-Placement Delay Optimization" at page 327 to 332 of Proceeding of the $31^{st}$ ACM/IEEE Design Automation Conference written by Lalgudi N. Kannan, Peter R. Suaris, and Hong-Gee Fang.

Recently, an integrated circuit such as a VLSI comes to have a great number of circuit components and hence it is fabricated in a complicated fashion owing to the progress of fabrication technology. With this tendency of technology, a number of elements supplied with a clock signal on the integrated circuit tends to increase, leading to difficulty in designing a clock logic of the integrated circuit.

Further, since a gate is subjected to a microfabrication technology, the integrated circuit device is further requested to process a signal at a higher speed. Thus, it is desired to establish a technology which makes it possible to synthesize a clock tree with a skew reduced. That is, it is desired for the clock signal to reach all driven elements (such as FFs) from a clock supplying source substantially at the same time (ideally exactly at the same time). A scattering of time (of delay) it takes for the clock signal to be transmitted from the clock supplying source to each of the driven elements is known as a clock skew. As described above, as a clock frequency is increased in accordance with the request for the high speed processing, the clock skew is requested to be substantially completely eliminated.

However, as described above, according to the conventional way of buffering, the buffering is carried out only to satisfy the fan-out restriction. Therefore, to reduce the skew by arranging the clock tree in a balanced manner is not taken into account. That is, although the net is subjected to the buffering in such a manner that the driven elements (such as FF elements) are divided into groups so that each of the groups can be driven by a single buffer element, the conventional way of group dividing is effected only to satisfy the fan-out restriction. Therefore, the number of driven elements or the size of load capacity in each group is not taken into consideration. If scattering in the number of elements or load capacity for every group is large, then scattering of wire length from the final stage buffer element to the driven element in each group also becomes large, with the result that it becomes very difficult to adjust the clock skew. Accordingly, in order to satisfy the request of high speed processing, or reduction of the clock skew, which becomes more demanding in recent years, the clock distributing system for distributing the clock to each group shall be arranged in a balanced fashion so as to suppress the scattering in number of elements or the load capacity of every group.

Further, according to the conventional way of buffering, the buffering is not effected in connection with layout information (physical information). Therefore, a layout can result in that a single buffer element is obliged to drive a plurality of flip-flop elements which are remote from the buffer element in terms of physical distance. As a result, there is a fear that a skew adjustment becomes difficult upon arranging layout or that the clock signal line becomes long, which facts lead deterioration in circuit quality.

The present invention is made in view of the above aspect. Thus, a first object of the present invention is to provide a method of optimizing signal lines within a circuit, an optimizing apparatus and a recording medium having an optimizing program stored therein in which delay of signal from a signal supplying source to each of elements is optimized to positively reduce a skew, and it becomes possible to realize a circuit designing which can cope with a request of high speed processing.

Incidentally, as described above, the integrated circuit such as an LSI includes a number of flip-flop cells and buffer cells for driving these flip-flop cells. In general, a single buffer cell is forced to drive a plurality of flip-flop cells through a clock signal line. When a layout of circuit elements and wiring of clock signal lines are determined in an LSI, it is requested to shorten the clock wiring length for reducing a signal propagation delay time and relieving the signal lines from crowded wiring. Further, circuit elements which are designed to be supplied with a clock signal are requested to undergo a suitable circuit element placement so as to suppress a time difference (known as clock skew).

Now a conventional LSI layout method (circuit designing method) will be described in detail with reference to FIGS. 50 to 65.

FIG. 50 is a flowchart useful for describing the conventional LSI layout method (circuit designing method). As shown in FIG. 50, the LSI layout method consists of a logic design step S27, a clock layout step S28 and ordinary net wiring step S29 for wiring signal lines except for the clock signal lines.

The logic design step S27 is composed of step S271 of synthesizing logic and step S272 of creating a clock tree.

In step S271 of synthesizing logic, a hardware description language (HDL) described in a register transfer level (RTL) of elements constituting the LSI is formed into a logic which can be implemented into a layout. Thus, a first netlist (1) formed of modules is created. In clock tree creating step S272, a clock tree before having a buffer cell introduced into the LSI is created based on the first netlist (1).

FIG. 51 is a diagram showing one example of clock tree before having a buffer cell introduced into the integrated circuit. In FIG. 51, reference numeral 281 depicts a module, 282 to 284 small modules, 285 a clock source as a clock supplying source, and 286 to 288 flip-flop cells. Since the circuit of the stage has no buffer cell introduced thereinto, the clock source 285 directly drives the flip-flop cells 286 to 288.

Thereafter, the first netlist (1) is subjected to a buffering processing in which buffer cells are introduced into the clock tree to create a second netlist (2).

FIG. 52 is a diagram showing a clock tree within the module of the LSI having a buffer cell introduced thereinto. As shown in FIG. 52, buffer cells 291 to 296 are additionally introduced into the clock tree of FIG. 51. A number of buffer cells in each module is determined depending on the number of driven flip-flop cells. As shown in FIG. 52, since the number of flip-flop cells 286 and 287 in the small modules 282 and 283 are small, each group of flip-flop cells of the small modules is allocated with a single buffer cell 292 and 293 and driven by the same. However, since the number of flip-flop cells 288 in the small module 284 is larger than the number of flip-flop cells 288 in the small modules 282 and 283, the small module 284 is arranged as a tree structure so that the flip-flop cells in the small module 284 are driven by three buffer cells 294, 295 and 296.

Referring back to FIG. 50, the contents of the second netlist (2) is transferred to clock layout step S28.

Clock layout step S28 is composed of steps S281 to S287.

In step S281, a floorplan is acquired. The floorplan is layout information obtained from a designer of the LSI.

In step S282, the buffer cells and the flip-flop cells are subjected to an initial placement as shown in FIG. 53 based on the floorplan so that the clock wiring length becomes short as far as possible. FIG. 53 is a diagram showing a result of the initial placement of the buffer cells and the flip-flop cells in the LSI module. In FIG. 53, lines are drawn between a buffer cell 301 and each of six flip-flop cell's 310 to 315 so as to indicate that the six flip-flop cells are driven by the buffer cell.

At step S283, clock buffers are placed in a bottom-up fashion. A placement in a bottom-up fashion means that a flip-flop cell farthest from the clock source is given placement with priority. According to the scheme, buffer cells on the clock bus are placed in a bottom-up fashion based on flip-flop cell placement information so that the distance from the buffer cell 301 to each of the flip-flop cells 310 to 315 becomes equal as far as possible. As a bottom-up placement scheme, there can be a scheme in which a buffer cell is placed at the center of the placement area where flip-flop cells driven by the buffer cell are located. Alternatively, there can be a scheme in which a buffer cell is placed at the center of gravity of flip-flop cells which are driven by the buffer cell.

FIG. 54 is a diagram showing an example of placement within an LSI module in which the buffer cell 301 is placed at the center of the placement area where flip-flop cells 310 to 315 driven by the buffer cell 301 are located.

At step S284, in order to determine the restriction in wiring length between the buffer cell to each of the flip-flop cells, a placement restriction area is created for the flip-flop cells. The placement restriction area is a lozenge area having the buffer cell driving the flip-flop cells centered. FIG. 55 is a diagram showing an example in which a placement restriction area 322 having a buffer cell 321 centered. In the next step, a placement processing is retried under consideration of the placement restriction area 322. In this case, the placement of the buffer cell 321 deriving from the bottom-up placement at step S283 is fixed, the flip-flop cells is subjected to the placement restriction based on the placement restriction area created at step S284, and cells other than the clock buffer are again subjected to placement. FIGS. 56 and 57 are diagrams showing a result of retried cell placement. As shown in FIGS. 56 and 57, the buffer cell 321 is located at the center of the placement restriction area 322, and the flip-flop cells 331 to 336 are located within the placement restriction area 322. Rectangular shapes in FIG. 57 indicate flip-flop cells.

At step S286, a special arrangement of wiring is effected on a clock tree final stage net. In this case, three types of processing shown in FIGS. 58 to 60 are carried out. That is, FIG. 58 shows a setting of cluster bar information 351 to 357. FIG. 59 shows a wiring of branch lines each connecting a flip-flop cell and the cluster bar. FIG. 60 shows a route wiring connecting the driving buffer cell 321 to the cluster bars.

Thereafter, a wiring of special arrangement of the net connecting buffers to one another is effected. In this case, as shown in FIG. 61, signal lines are radiated in arbitrary directions from a buffer cell 381 to four buffer cells 282 to 385 which are driven by the buffer cell 381. If the above-described steps S282 to S287 are carried out, then the placement and the wiring of the clock tree will be accomplished so that the signal propagation delay time between a clock source to a flip-flop and the skew value are suppressed to a limit value. Thereafter, a wiring processing for an ordinary net is effected at step S29.

The above-described LSI layout method is a scheme mainly utilized when designing a gate array or an embedded array an ASIC (Application Specific Integrated Circuit). In this scheme, when a process goes to a step after a logic design stage, a clock layout and an LSI implementation design are effected without changing the netlist. According to the above-described conventional method, clock signal lines are subjected to a layout process in such a manner that the clock tree logic is not changed and the clock signal is transmitted while satisfying a condition of a signal propagation delay time and a skew value determined by a user.

However, according to the above-described conventional method, when the processing stays in step S271 in which a logic synthesis (logic design) is effected and in step S272 in which the clock tree is created, the logic design is carried out without taking the placement position of flip-flop cells and clock signal line wiring paths into consideration. For this reason, if the clock layout is effected on the logic information so as to satisfy the clock restricting condition, then wiring becomes crowded and clock wiring and signal wiring after the clock wiring will encounter difficulties which prevent the clock wiring and the signal wiring from being carried out.

The difficulties lying in the process of the clock wiring and the signal wiring will hereinafter be described in detail.

When the clock tree is created at step S272, floorplan and placement of flip-flops are not taken into consideration. Therefore, if the placement step is completed up to the stage of placing buffer cells, as shown in FIG. 62, floorplan blocks 392 and 395 on a semiconductor chip 391 can be placed so as to be remote from each other in spite of the fact that both of the floorplan blocks 392 and 395 are driven by a buffer cell 396. Similarly, floorplan blocks 393 and 394 on the semiconductor chip 391 can be placed so as to be remote from each other in spite of the fact that both of the floorplan blocks 393 and 394 are driven by a buffer cell 397. In this case, signal lines 398 to 401 of a network (hereinafter referred to as net) for driving the floorplan blocks remote from each other become long, with the result that a propagation delay time of the clock signal becomes long and wiring is crowded (first problem).

At step S285 of FIG. 50 in which placement of flip-flops is retried under consideration of placement restriction area, as shown in FIG. 63, if placement restriction areas 430 and 431 are overlaid on one another and the flip-flop cells are subjected to retry of placement, then number of flip-flop cells can be concentrated in the common area of the placement restriction areas 430 and 431 as shown in FIG. 64. Such a concentration of the flip-flop placement will cause crowded wiring (second problem). In FIGS. 63 and 64, reference numerals 410 and 420 depict buffer cells, 411 to 416 flip-flop cells driven by the buffer cell 410, 421 to 426 flip-flop cells driven by the buffer cell 420, and 430 and 431 placement restriction areas on the buffer cells 410 and 420, respectively. FIG. 64 is a diagram showing an example in which the flip-flop cells 411 to 416 are moved into the placement restriction area 430 while the flip-flop cells 421 to 426 are moved into the placement restriction area 431.

Further, if the flip-flop cells are moved from initial placement positions to the placement restriction area, then a signal line of the net which is connected to any component other than a flip-flop cell supplied with clock signal may become long, with the result that wiring except for the clock signal also become crowded (third problem). FIG. 64 contains examples of signal lines 441 to 445 which become excessively long.

Furthermore, as shown in FIG. 61, if a plurality of buffer cells are driven by a single buffer cell, wiring between the buffer cells can contain a crowded portion of wiring in signal lines between buffer cells (fourth problem). FIG. 61 shows an arrangement of a buffer cell 381 and a plurality of buffer cells 382 to 385 driven by the buffer cell 381, wherein wiring between the buffer cell 381 and each of the buffer cells 382 and 383 is crowded.

As a problem other than the problem of crowded wiring, there can be a problem of a skew value of a signal propagation delay time (fifth problem). That is, at step S285 of FIG. 50, the placement processing is retried while the placement restriction of flip-flop cells is effected, and flip-flop cells are collected, whereby the skew value is suppressed. However, a flip-flop cell, for example a flip-flop cell 371 shown in FIG. 60, can be located at a place remote from a cluster of the cell. In this case, a signal line extending to the flip-flop cell becomes long, and hence the propagation delay time of a signal reaching the cell is increased, with the result that the skew becomes large.

Further, at step S272 of FIG. 50 in which the clock tree is created, buffer cells are placed so as to satisfy the fan-out restriction. However, if a placement is effected based on the above scheme, as shown in FIG. 52, there can be formed portions of net having buffer stages from the clock source 285 to a flip-flop cell respectively different from each other, such as the module 282 and the module 284 or the module 283 and the module 284. In this case, a clock path including two stages of buffer and a clock path including three stages of buffer will have signal propagation delay times different from each other, with the result that the sew becomes large (sixth problem).

Furthermore, according to the conventional method shown in FIG. 65, at step S282 of FIG. 50 in which the initial placement is determined, flip-flop cells 451 to 454 are placed while clock paths 457 and 458 extending from clock buffer cells 455 and 456 taken into account. Therefore, wiring paths of data path 359 connecting the flip-flop cells to one another intersects one another, resulting in complicated wiring. In addition, a data path 459, and clock paths 457 and 458 become long, which causes a timing error (seventh problem).

The above-introduced first problem derives from a fact that the layout information is not taken into account when the clock tree is created.

The above-introduced second and third problems derive from facts that the placement restriction areas can be overlaid on one another, and driven cells are forcibly moved into the overlapped portion of the placement restriction areas when the placement is retried.

The above-introduced fourth problem derives from a fact that a wiring between a buffer cell for driving another cell and buffer cells which are driven by that buffer cell is arranged merely as a radiated fashion.

The above-introduced fifth problem derives from a fact that the conventional method employs a scheme that flip-flop cells are merely subjected to a placement retry within the placement restricted area.

The above-introduced sixth problem derives from a fact that if the clock tree includes modules having different buffer stages, then a clock skew causing in the path becomes large.

The above-introduced seventh problem derives from a fact that flip-flop cells are placed upon initial placement with a clock path not disregarded.

Accordingly, a second object of the present invention is to propose a method of designing a circuit and a recording medium having stored therein a program for designing a circuit in which the circuit can be designed such that a clock signal line and signal line other than the clock signal line are short, a wiring of the circuit can be prevented from being crowded, a signal propagation delay time is short, and the scattering of the signal propagation delay time can be properly suppressed.

DISCLOSURE OF THE INVENTION

According to the present invention, in order to achieve the above object, there is proposed a method of optimizing signal lines within a circuit utilized when designing a circuit including a signal supplying source and a plurality of elements which are supplied with a signal from the signal supplying source through signal lines. The method is utilized for optimizing signal distribution through the signal lines connecting the signal supplying source each of the plurality of elements. The method includes a step of determining whether or not the signal supplying source satisfies a fan-out restriction if the signal supplying source supplies a signal to all of the driven elements which are directly connected to the signal supplying source, a step of dividing the plurality of elements into a plural number of groups so that the fan-out restriction is satisfied in each of the groups and that each of the groups has the same or substantially the same load capacity, when it is determined in the determining step that the signal supplying source does not satisfy the fan-out restriction; and a step of inserting into each of the groups divided at the dividing step, a buffer element having a size which makes the groups of elements satisfy the fan-out restriction, wherein the buffer element inserted at the buffer inserting step is regarded as a driven element, and then it is again determined in the determining step whether or not the signal supplying source satisfies the fan-out restriction if the signal supplying source supplies a signal to all of the driven elements which are directly connected to the signal supplying source, and the dividing step and the buffer inserting step are repeatedly carried out until the determining step delivers a determination that the signal supplying source satisfies the fan-out restriction.

If the determining step delivers a determination that the signal supplying source satisfy the fan-out restriction, then an optimizing step may be executed in such a manner that a delay taken place between the signal supplying source and each of the plurality of elements is analyzed, and the signal distribution through the signal lines is optimized by inserting or removing one or more buffer elements, or by changing the buffer size, or by changing the group to which the driven element belongs.

If the determining step delivers a determination that the signal supplying source does not satisfy the fan-out restriction, then an evaluation value calculating step may be carried out in such a manner that an evaluation value is calculated for each of the all pairs of the driven elements on the basis of a circuit performance enhancing factor, and the driven elements are divided into groups in the dividing step so that, of pairs satisfying the fan-out restriction, a pair having the largest evaluation value calculated at the evaluation value calculating step is brought into the same group with priority.

In this case, the above evaluation value calculating step may include the following items No. 1 to No. 6 for calculating the evaluation value.

1. A circuit between two driven elements of each pair is analyzed and a hold error evaluation value is determined as the evaluation value for each pair so that the hold error evaluation value becomes larger with increase of the probability at which the hold error is taken place in each pair.

2. A circuit between two driven element of each pair is analyzed and a setup error evaluation value is determined as the evaluation value for each pair so that the setup error evaluation value becomes larger with increase of the probability at which the setup error is taken place in each pair.

3. A circuit between two driven elements of each pair is analyzed and a hold error evaluation value is determined so that the hold error evaluation value becomes larger with increase of the probability at which the hold error is taken place in each pair, a setup error evaluation value is determined so that the setup error evaluation value becomes larger with increase of the probability at which the setup error is taken place in each pair, and then the hold error evaluation value and the setup evaluation error are added together to create the evaluation value for each pair.

4. A physical distance and a circuit between two driven elements of each pair are analyzed and a distance evaluation value is determined so that the distance evaluation value becomes larger with increase in the physical distance for each pair and a hold error evaluation value is determined so that the hold error evaluation value becomes larger with increase of the probability at which the hold error is taken place in each pair, and then the distance evaluation value and the hold error evaluation value are added together to create the evaluation value for such pair 5. A physical distance and a circuit between two driven elements of each pair are analyzed and a distance evaluation value is determined so that the distance evaluation value becomes larger with increase in the physical distance for each pair and a setup error evaluation value is determined so that the setup error evaluation value becomes larger with increase of the probability at which the setup error is taken place in each pair, and then the distance evaluation value and the setup error evaluation value are added together to create the evaluation value for each pair.

6. A physical distance and a circuit between two driven elements of each pair are analyzed and a distance evaluation value is determined so that the distance evaluation value becomes larger with increase in the physical distance for each pair, a hold error evaluation value is determined so that the hold error evaluation value becomes larger with increase of the probability at which the hold error is taken place in each pair, and a setup error evaluation value is determined so that the setup error evaluation value becomes larger with increase of the probability at which the setup error is taken place in each pair, and then the distance evaluation value, the hold error evaluation value, and the setup error evaluation value are added together to create the evaluation value for each pair.

Further, a buffer stage number adjusting step may be executed in such a manner that one or more buffer elements are inserted into the circuit so that each circuit path extending from the signal supplying source to all of the plurality of elements consists of the same number of cell stages.

On the other hand, according to another aspect of the present invention, there is provided an apparatus for optimizing signal distribution through signal lines which connect a signal supplying source and a plurality of elements which are supplied with a signal from the signal supplying source through the signal lines. The apparatus is utilized when designing a circuit including the signal supplying source and the plurality of elements. The apparatus includes a determining unit for determining whether or not the signal supplying source satisfies a fan-out restriction if the signal supplying source supplies a signal to all of the driven elements which are directly connected to the signal supplying source, a dividing unit for dividing the plurality of elements into a plural number of groups so that the fan-out restriction is satisfied in each of the groups and that each of the groups has the same or substantially the same load capacity when the determining unit determines that the signal supplying source does not satisfy the fan-out restriction, and a buffer inserting unit for inserting a buffer element having a size which makes the groups of elements satisfy the fan-out restriction, into each of the groups divided by the dividing unit, wherein the determining unit regards the buffer element inserted by the buffer inserting unit as a driven element and then determines whether or not the signal supplying source satisfies the fan-out restriction if the signal supplying source supplies a signal to all of the driven elements which are directly connected to the signal supplying source, and the dividing unit and the buffer inserting unit repeat the processing thereof until the determining unit delivers a determination that the signal supplying source satisfies the fan-out restriction.

At that time, the optimizing apparatus may further include an optimizing unit which carries out optimization in such a manner that, if the determining unit delivers a determination that the signal supplying source satisfies the fan-out restriction, the optimizing unit analyzes a delay taken place between the signal supplying source and each of the plurality of elements, and then optimizes the signal distribution through the signal lines by inserting or, removing one or more buffer elements, or by changing the buffer size, or by changing the group to which the driven element belongs.

Moreover, the optimizing apparatus may further include an evaluation value calculating unit which carries out calculation in such a manner that, if the determining unit delivers a determination that the signal supplying source does not satisfy the fan-out restriction, then the evaluation value calculating unit calculates an evaluation value for each of the all pairs of the driven elements on the basis of a circuit performance enhancing factor. Thereafter, the dividing unit divides the driven elements into groups so that, of pairs satisfying the fan-out restriction, a pair having the largest evaluation value calculated by the evaluation value calculating unit is made to belong to the same group with priority.

Furthermore, the optimizing apparatus may further include a buffer stage number adjusting unit for inserting one or more buffer elements into the circuit so that each circuit path extending from the signal supplying source to all of the plurality of elements consists of the same number of cell stages.

According to still another aspect of the present invention, there is provided a recording medium having an optimizing program stored therein. The program is utilized when designing a circuit including a signal supplying source and a plurality of elements which are supplied with a signal from the signal supplying source through signal lines, and the program is executed by a computer for optimizing signal distribution through the signal lines connecting between the signal supplying source and each of the plurality of elements. The computer is made to carry out repeatedly the optimizing program including a procedure of determining whether or not the signal supplying source satisfies a fan-out restriction if the signal supplying source supplies a signal to all of the driven elements which are directly connected to the signal supplying source, a procedure of dividing the plurality of elements into a plural number of groups so that the fan-out restriction is satisfied in each of the groups and that each of the groups has the same or substantially the same load capacity, when it is determined in the determining procedure that the signal supplying source does not satisfy the fan-out restriction, and a procedure of inserting a buffer element having a size which makes the groups of elements satisfy the fan-out restriction, into each of the groups divided at the dividing procedure. When the computer carries out the determining procedure, the buffer element inserted at the buffer inserting procedure is regarded as a driven element, and then it is again determined whether or not the fan-out restriction is satisfied if the signal supplying source supplies a signal to all of the driven elements which are directly connected to the signal supplying source, and the computer repeatedly carries out the dividing procedure and the buffer inserting procedure until the determining procedure delivers a determination that the signal supplying source satisfies the fan-out restriction.

At this time, the optimizing program may cause the computer to execute an optimizing procedure in such a manner that if the determining procedure delivers a determination that the signal supplying source satisfies the fan-out restriction, then a delay taken place between the signal supplying source and each of the plurality of elements is analyzed, and the signal distribution through the signal lines is optimized by inserting or removing one or more buffer elements, or by changing the buffer size, or by changing the group to which the driven element belongs.

Further, at this time, the optimizing program may cause the computer to execute procedures in such a manner that, if the determining procedure delivers a determination that the signal supplying source does not satisfy the fan-out restriction, then an evaluation value calculating procedure is executed for each of the all pairs of the driven elements on the basis of a circuit performance improving factor, and the driven elements are divided into groups in the dividing procedure so that, of pairs satisfying the fan-out restriction, a pair having the largest evaluation value calculated at the evaluation value calculating procedure is made to belong to the same group with priority.

Further, the optimization program may cause the computer to execute a buffer stage number adjusting procedure in which one or more buffer elements are inserted into the circuit so that each circuit path extending from the signal supplying source to all of the elements consists of the same number of cell stages.

According to the above-described method of optimizing signal lines within a circuit, the optimizing apparatus and the recording medium having the optimizing program stored therein of the present invention, a plurality of elements or driven elements (buffer elements) are divided into groups (subset) so that each group has the same or substantially the same load capacity. Therefore, the tree-like wired signal lines can be arranged to have a balance in terms of signal distribution among these groups.

If the tree-like wired signal lines are created with balance as described above, and thereafter optimization of the signal distribution by the signal lines is effected, then it becomes possible to positively arrange the tree-like wired signal lines causing little skew with ease.

Further, according to the above-mentioned scheme of the present invention, the driven elements are divided into groups so that, of all pairs of driven elements satisfying the fan-out restriction, pairs having the largest evaluation value are made to belong to the same group with priority. Therefore, if signal lines of driven elements are divided (by inserting a buffer element), the buffering is effected while taking a circuit quality into consideration as well as satisfying the fan-out restriction. At this time, the tree-like signal lines can be synthesized so as to avoid the hold error or the setup error. In addition, when the signal lines of driven elements are subjected to division by inserting a buffer element, floorplan information or placement information (e.g., layout information, physical information) may also be taken into consideration, whereby the skew can be positively reduced with ease and wire length can be shortened in the stage of layout arrangement.

Furthermore, if one ore more buffer elements are inserted into the circuit so that each of the circuit paths extending from the signal supplying source to all of the plurality of elements consists of the same number of cell stages, then the skew caused by a plurality of elements can be more positively reduced.

As described above, according to the above-described method of optimizing signal lines within a circuit, the optimizing apparatus and the recording medium having the optimizing program stored therein of the present invention, the following effects or advantages can be obtained.

(1) When a signal is distributed through the tree-like arranged signal lines, since the groups of elements are branched by the tree-like wiring with a proper balance, delay of signals from the signal supplying source to each of the elements is optimized and skew can be positively reduced. Thus, it becomes possible to design a circuit which can cope with a demand in high speed processing.

(2) According to the above invention, the tree-like signal lines are arranged with a proper balance and thereafter signal distribution through signal lines is optimized. Thus, it becomes possible to positively arrange a tree-like signal lines causing a small skew with ease. Accordingly, delay of signals from the signal supplying source to each of the elements is positively optimized and skew can be more positively reduced.

(3) According to the present invention, the driven elements are divided into groups so that the circuit quality is maintained high in addition to that each group satisfies the fan-out restriction. Therefore, it becomes possible to create a signal line wiring in which the hold error or the setup error can be positively prevented from being caused. Thus, circuit quality can be dramatically increased. In addition, when the signal lines are wired, floorplan information or placement information is taken into consideration. Therefore, it becomes possible to positively suppress the skew with ease in the step of layout arrangement, with the result that the signal lines can be shortened and the signal distribution can be optimized.

(4) According to the present invention, one ore more buffer elements are inserted into the circuit so that each of the circuit paths extending from the signal supplying source to all of the plurality of elements consists of the same number of cell stages. Therefore, the skew causing by a plurality of elements can be more positively reduced and the signal distribution can be optimized.

On the other hand, according to the present invention, there are proposed a method of designing a circuit and also provided a recording medium having stored therein a program for designing a circuit in which contents of circuit design described in an RTL (Register Transfer Level) is synthesized in a logic level to produce a first netlist, a floorplan is tried to be made on the first netlist, the buffer cells are subjected to placement so as to respond to a clock signal based on the resulting floorplan information, a buffer stage number is examined on the tentative result of the buffer cell placement, and then adjustment is effected on the signal lines so that each signal line from the clock source to a flip-flop cell has the same buffer stage number.

With the above method, the clock buffer cells are placed with the floorplan information taken into account. Therefore, a circuit block of the floorplan remote from the clock supplying source can be prevented from undergoing the buffering arrangement, with the result that the wiring length of the clock path can be suppressed and also the propagation delay time of the clock signal can be suppressed. Further, since the wiring is subjected to a process of adjusting the number of buffer stages, the scattering in clock skew can also be suppressed.

In this case, upon the initial step of placement, cells are subjected to the placement processing based on the netlist and the floorplan information with the net on the clock tree disregarded. Thereafter, processing proceeds to a step in which the flip-flop cells which should be connected to the clock tree are allocated with their decided placement positions.

In this way, a cell and a flip-flop cell connected to any circuit block other than the clock signal net (hereinafter referred to as clock net) are initially subjected to an optimum placement, and then arrangement of the clock net is retried in accordance with the result of the placement. Accordingly, any circuit path other than the clock path can be free from unreasonable close placement, with the result that the wiring can be relieved from being crowded, cells can be placed while the clock net and other net are optimized in wiring efficiency, and time it takes for wiring processing can be shortened. In addition, data buses extending between the flip-flop cells are also placed optimally, and hence the cells can be free from timing error which can be caused after determining a layout.

Further, according to the method of designing a circuit of the present invention, the step for adjusting the number of buffer stage is followed by steps that a final stage net of the clock tree is extracted from the initial placement of the flip-flop cells, the net range of the extracted final stage net, a plurality of nets overlaying on one another in net range are merged together, the merged net is divided that the net range is made free from overlap, and buffer cells are allocated to the divided nets to carry out net reconstruction so as to avoid the net range overlap.

In this way, the clock skew caused at the final stage of the clock tree can be suppressed and the wiring can be relieved from being crowded.

Further, the step for arranging the clock layout includes a step in which a placement position of buffer cells on the clock tree is decided in a bottom-up manner based on the placement result of the flip-flop cells which has been determined in the step in which cells are subjected to the placement processing while the net on the clock tree is disregarded. The step for arranging the clock layout further includes a step in which cluster information for the flip-flop cells is created for each final stage buffer of the clock tree based on the placement information of the flip-flop cells which are driven by a buffer, a step in which placement restriction area information is created with the cells other than the buffer cell centered, and a step in which placement processing is then retried on any cell other than the buffer cells while the retried placement restriction area information and the cluster information are utilized as a restriction value.

In this way, the flip-flop cells are placed so that flip-flop cells belonging to the same group are collected at every cluster group within the placement restriction area. Thus, the propagation delay time of a signal transmitting through the clock path can be shortened, the skew value can be suppressed, and a number of steps for adjusting the timing after fixing the layout can be reduced.

Furthermore, according to the method of designing a circuit of the present invention, after the step in which placement processing is retried on any cell other than the buffer cells while the retried placement restriction area information and the cluster information are utilized as a restriction value, the following steps are provided. That is, cluster information is created for each net of the clock tree from the placement position of the driven cell, the driven cells divided into clusters are connected with wiring to form a cluster wiring in each created cluster, and the driving cell and the clusters are connected by signal routes which extend in a radiating fashion.

In this way, wiring for supplying clock signals can be arranged so as to suppress the skew of clock. Also, the net connecting the buffer cells to each other can be relieved from crowded wiring.

Furthermore, according to the method of designing a circuit of the present invention, after the step in which the placement position of buffer cells on the clock tree is decided in a bottom-up manner, a step of reconstructing the clock tree is provided. In the step of reconstructing the clock tree, a logic changing command is generated to a netlist file upon changing the logic of clock, and a second netlist is changed based on the logic changing command. Thus, a third netlist is created in a step in such a manner that the third netlist contains a clock logic coincident with the clock logic of the layout database.

In this way, coincidence between the logic of the layout database and the logic of the netlist is maintained, with the result that a formal verification or the like can be utilized for guaranteeing the coincidence between the two kinds of logic systems even if the logic of the netlist is subjected to any modification.

As described above, according to the method of designing a circuit and the recording medium having stored therein the program for designing the circuit, the entire wiring can be efficiently arranged, and hence a time it takes for the circuit to carry out processing can be shortened.

Moreover, since the propagation delay time of the clock signal and the skew can be suppressed, probability of occurring timing error after fixing the layout can be reduced, and hence a time it takes for adjusting the timing of signal transmission can be shortened.

Further, according to the present invention, even if the circuit under designing contains a locally congested part in wiring, the congested part can be effectively removed, with the result that the entire wiring of the circuit will have a uniform allowance in wiring density. Thus, the circuit having been subjected to the process according to the present invention can be more densely packed and fabricated with a smaller size on a semiconductor chip.

Furthermore, the circuit having a fixed layout can be subjected to a high-speed verification tool such as a formal verifier for verifying the logic. Therefore, a time it takes for designing and implementing a circuit of an LSI or the like can be shortened.

BRIEF DESCRIPTION OF THE DRAWINGS

FIGS. 6A to 6E are each timing chart for explaining the hold error;

FIGS. 9A to 9E are each timing chart for explaining the hold error;

FIG. 19 is a flowchart illustrative of procedures of a method of optimizing the signal lines within the circuit as the third embodiment of the present invention;

FIG. 54 is a diagram showing an example of a module of an LSI in which a buffer cell is placed at the center of an area where flip-flop cells driven by the buffer cell are placed according to the conventional method;

FIG. 55 is a diagram showing an example in which a placement restriction area is defined so that a buffer cell thereof is placed at the center of the area according to the conventional method;

FIG. 62 is a diagram showing an arrangement of floorplan blocks and a clock tree according to the conventional method;

BEST MODE FOR CARRYING OUT THE INVENTION

Embodiments of the present invention will hereinafter be described with reference to drawings.

A method of optimizing signal lines within a circuit, an optimizing apparatus, and a recording medium having an optimizing program stored therein according to the present invention are mainly applied to a circuit having a tree-structure wiring such as a clock system net. First to third embodiments will be described with a case where the present invention is applied when clock trees are synthesized. However, it should be noted that the present invention is not limited to an application to the tree-structure wiring such as a clock system net but applicable to any circuit.

[1] Description of a First Embodiment.

Figure 1:
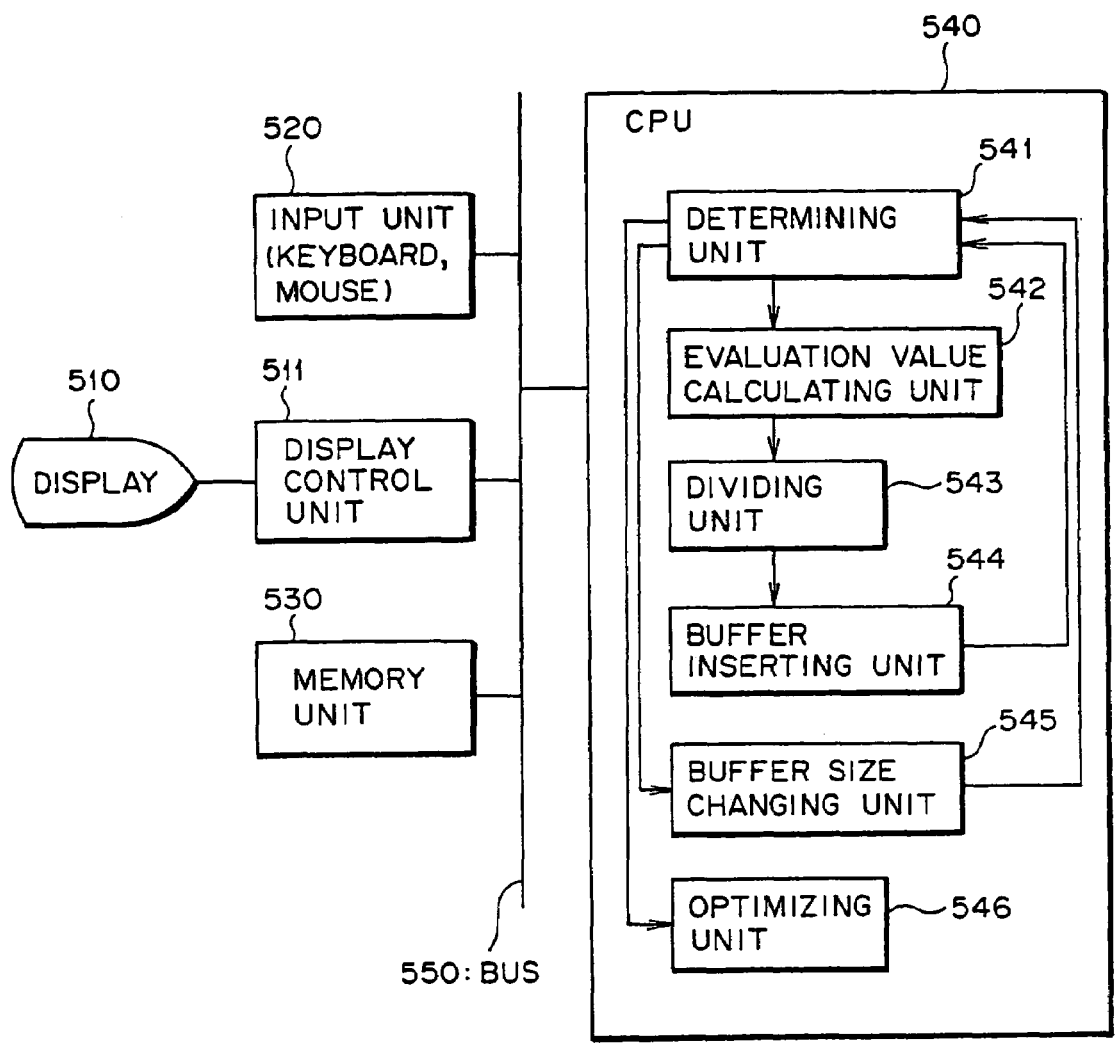
FIG. 1 is a block diagram illustrative of a function of an optimizing apparatus for optimizing signal lines within a circuit as a first embodiment of the present invention.

FIG. 1 is a block diagram showing a functional arrangement of an optimizing apparatus for optimizing signal lines within a circuit as a first embodiment of the present invention. The optimizing apparatus shown in FIG. 1 is utilized when a designer designs a circuit (e.g., a VLSI) including a clock supplying element (clock supplying source) and a number of elements (driven elements; in this case, flip-flops) supplied with a signal from the clock supplying element. When the above-described circuit is designed, the optimizing apparatus optimizes signal distribution through clock signal lines (clock system net) connecting the clock supplying element to the number of FFs in terms of clock distribution. Thus, as shown in FIG. 1, the optimizing apparatus is arranged to include a display 510, a display control unit 511, an input unit 520, a memory unit 530, a general processing unit (processor, computer) having a CPU 540 or the like.

According to the above embodiment, the display 510 is utilized for displaying various information necessary for synthesizing clock trees or a status of synthesis brought about in the midst of optimization processes in terms of clock distribution. The display control unit 511 is utilized for controlling display condition of the display 510. The display control unit 511 controls the display condition of the display 510 by carrying out various display control operation in response to a command from the CPU 540 or a command from the input unit 520.

The input unit 520 is arranged to include a keyboard or a mouse, for example, and operated by an operator (i.e., circuit designer). The input unit 520 is utilized for inputting information as a response to the displayed data on the display 510 or various information necessary for synthesizing clock trees. Therefore, if the operator inputs various information by operating the input unit 520 while referring to the displayed screen of the display 510, operation of optimization in terms of clock distribution can proceed in an interactive manner.

The memory unit 530 includes, in addition to a RAM or ROM provided within an ordinary processing apparatus, an external memory unit such as a disk unit connected to the processing apparatus. Thus, the concept of the memory unit includes all memory units concerning various information storage necessary for the optimizing apparatus of the present embodiment. The memory unit 530 has stored therein information necessary for carrying out processing (e.g., buffering, optimization and so on) in the present embodiment, for example, logic information among FFs placed on the circuit as an object of designing and physical information (e.g., floorplan information, placement information, layout information). Further, the memory unit 530 has stored therein an optimizing program (which will be described later) for optimizing signal lines within the circuit which is installed from the outside.

The CPU 540 carries out, in addition to the overall management of the optimizing apparatus of the present embodiment, executes various processing. According to the arrangement of the present embodiment, particularly, the CPU 540 functions as a determining unit 541, an evaluation value calculating unit 542, a dividing unit 543, a buffer inserting unit 544, a buffer size changing unit 545 and an optimizing unit 546.

The functions of the determining unit 541, the evaluation value calculating unit 542, the dividing unit 543, the buffer inserting unit 544, the buffer size changing unit 545 and the optimizing unit 546 are implemented in such a manner that, the optimizing program is installed from a recording medium such as a hard disk, a magnetic tape, a floppy disk, an optical disk, a magnet-optical disk or a CD-ROM into the processing apparatus (memory unit 530), the installed optimizing program is read to the RAM or the like, and then the program is executed by the CPU 540 to realize operations of the CPU. In this case, the optimizing program of the present embodiment is designed to cause the CPU (computer) 540 to carry out optimization processing onclock distribution through signal lines connecting a clock supplying element to a number of flip-flops. Thus, the CPU 540 provides functions of respective components with reference numerals 541 to 546 attached thereto which are shown in FIG. 1.

The determining unit 541 is utilized for determining whether or not the circuit as a target of designing satisfies the fan-out restriction if the clock supplying element directly supplies to all of driven elements (the driven elements in this case means initially FF, and after the first trial of placement, buffer elements). Further, according to the arrangement of the present embodiment, the determining unit 541 has a function for determining whether or not the fan-out restriction is satisfied (without effecting buffering operation) if only buffer sizing operation is effected on logic gates, selectors or buffer elements assembled into the clock system net.

The evaluation value calculating unit 542 is arranged to calculate an evaluation value based on an enhancing factor of circuit quality of all pairs of driven elements when the determining unit 541 determines the clock supplying element cannot supply a clock signal with the fan-out restriction satisfied and also only effecting the buffer sizing cannot remove the problem that the clock supplying element cannot supply a clock signal with the fan-out restriction satisfied.

Further, as will be described with reference to FIG. 4, the evaluation value calculating unit 542 of the present embodiment analyzes the circuit composed of driven elements constituting a pair on the basis of logic information, and determines a hold error evaluation value so that the hold error evaluation value becomes larger with increase of the probability at which the hold error is taken place in the pair of elements, and then allocates the hold error evaluation value to the pair of elements. The hold error will be described later on with reference to FIGS. 5A to 5C and FIGS. 6A to 6E.

The dividing unit 543 is arranged to divide the number of driven elements into a plurality of groups so that each of the group satisfies the fan-out restriction and the number of elements included in each of the group and load capacity thereof becomes the same or substantially the same when the determining unit 541 determines that the clock supplying element cannot supply a clock signal with the fan-out restriction satisfied and also only effecting the buffer-sizing cannot remove the problem that the clock supplying element cannot supply a clock signal with the fan-out restriction satisfied.

Further, the dividing unit 543 of the present embodiment is arranged to divide the driven elements into groups so that, of pairs satisfying the fan-out restriction, a pair having the largest evaluation value calculated by the evaluation value calculating unit 542 is made to belong (merged) to the same group with priority. The dividing procedure of the driven elements (procedure of clock tree synthesizing processing) will be concretely described with reference to FIGS. 3A to 3E.

The buffer inserting unit 544 is arranged to insert buffer elements with a proper size so that each of the groups divided by the dividing unit 543 satisfies the fan-out restriction.

The buffer size changing unit 545 is arranged to select a proper element from cells which are incorporated into the clock system net (logic gates, selectors, buffer elements and so on) and change the selected element in its driving capability, or in other words, change the size of the cell (buffer-sizing) when the determining unit 541 determines that the clock supplying element cannot supply a clock signal with the fan-out restriction satisfied and also only effecting the buffer sizing cannot remove the problem that the clock supplying element cannot supply a clock signal with the fan-out restriction satisfied.

According to the arrangement of the present embodiment, the determining unit 541 regards the buffer elements inserted by the buffer inserting unit 544 as driven elements (in accordance with the changing result deriving from the buffer size changing unit 545), and again determines whether or not the fan-out restriction is satisfied if the clock supplying element supplies the clock signal directly to all of the driven elements. Thus, the processing of the evaluation value calculating unit 542, the dividing unit 543, the buffer inserting unit 544 and the buffer size changing unit 545 is repeatedly carried out until the determining unit 541 delivers a determination that the clock supplying element can supply a clock signal with the fan-out restriction satisfied.

The optimizing unit 546 is arranged to carry out an optimizing process in such a manner that, if the determining unit 541 determines that the clock supplying element can supply a clock signal with the fan-out restriction satisfied, a delay taken place between the clock supplying element and each of the all FFs is analyzed, and the clock distribution (delay or clock skew) through the clock system net is optimized by inserting or removing one or more buffer elements, or changing the buffer size, or by changing the group to which the driven element belongs.

Now, a procedure of optimization (clock tree synthesizing procedure) carried out by the optimizing apparatus of the first embodiment arranged as described above will be described with reference to a flowchart shown in FIG. 2 (including steps S511 to S518) and FIGS. 3A to 3E. In FIGS. 153A to 3E, there are shown examples in which one clock supplying element (CLOCK) supplies a clock signal to six (a to f) driven elements (FFs).

According to the arrangement of the present embodiment, when the optimizing apparatus is supplied with logic information or physical information about the clock supplying element and FFs which are driven elements (see FIG. 3A), the determining unit 541 determines whether or not the fan-out restriction is satisfied if the clock supplying element supplies a clock signal directly to all of the driven elements (FFs) (determining step S511).

If it is determined that the clock supplying element cannot supply a clock signal with the fan-out restriction satisfied (NO branch of step S511), then the determining unit 541 further determines whether or not to effect a buffer-sizing on the logic gates, the selectors or buffer elements which are incorporated into the clock system net, is sufficient for the clock supplying element to satisfy the fan-out restriction without carrying out buffering (step S512).

Figure 3A:
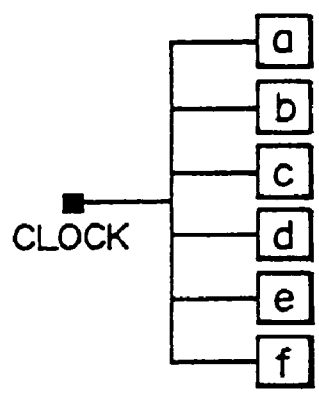
FIGS. 3A to 3E are diagrams illustrative of procedures for carrying out clock tree synthesizing processing according to the first embodiment of the present invention.
Figure 3B:
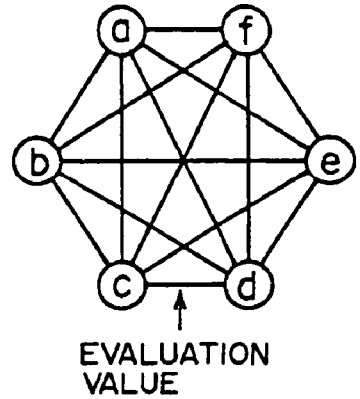

If it is determined that effecting the buffer-sizing is not sufficient for making the clock supplying element supply a clock signal with the fan-out restriction satisfied (NO branch of step S512), then the evaluation value calculating unit 542 calculates evaluation values for every pair of the driven elements (initially FFs) based on an improving factor of the circuit quality (evaluation value calculating step S513; see FIG. 3B). The processing procedure carried out by the evaluation value calculating unit 542 of the present embodiment will be described later on with reference to FIG. 4.

Figure 3C:
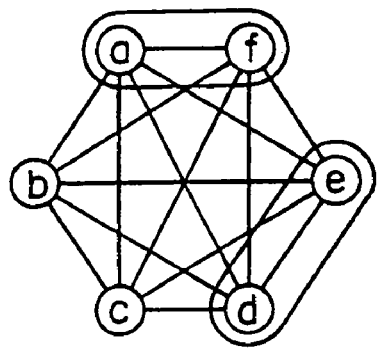
Figure 3D:
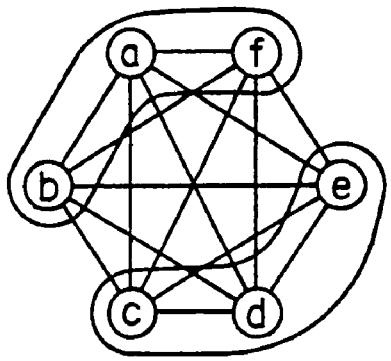

Then, the dividing unit 543 divides the driven elements into groups (subset) so that, of pairs satisfying the fan-out restriction, a pair having the largest evaluation value calculated at the evaluation value calculating unit 542 is made to belong (merge) to the same group with priority (see FIG. 3C). In this case, if it is determined that to make a pair of elements belong to the same group does not results in violation of the fan out-restriction on a buffer element which will be inserted into the group at the later stage, then the pair of elements are made to belong to the same group. Conversely, if it is determined that to make the pair of elements belong to the same group results in violation of the fan-out restriction, then the merge of the pair is canceled and a pair of elements having the next largest evaluation value are subjected to the examination of the merger process. Such a process is repeated until any group cannot be subjected to the merger processing because of the fan-out restriction. Further, the above-described merger processing of the pair of driven elements is carried out with balance taken so that each of the groups deriving from the division and merger has the same or substantially the same number of elements and load capacity. In this way, the driven elements are divided into a plurality of groups (see FIG. 3D and dividing step S514).

After the dividing process is completed, the buffer inserting unit 544 inserts a buffer element having a size satisfying the fan-out restriction for each group which are divided by the dividing unit 543 (buffering; buffer inserting step S515; see FIG. 3E). Thereafter, the buffer element which is inserted at the buffer inserting step is regarded as a driven element and the processing returns to step S511.

On the other hand, at step S512, if it is determined that effecting the buffer-sizing is sufficient for making the clock supplying element be capable of supplying a clock signal with the fan-out restriction satisfied (YES route), then the buffer size changing unit 545 selects a proper element from the cells (e.g., logic gates, selectors, buffer elements and so on) incorporated in the clock system net, and subjects the selected element to the buffer-sizing operation (step S517). Thereafter, the processing returns to step S511.

The above-described processing of from step S512 to S517 is repeated until it is confirmed at step S511 that the clock supplying element can supply a clock signal with the fan-out restriction satisfied.

If step S511 delivers a determination that the signal supplying source can supply a signal with the fan-out restriction satisfied (YES route), then a delay taken place between the clock supplying element and each of the FFs is analyzed, and the delay between the clock supplying element and each FF or the clock skew between the FFs is optimized to the clock distribution through the clock system net, by inserting or removing one ore more buffer elements, or by changing the buffer size, or by changing the group to which the FF belongs (optimizing step S518).

In this way, according to the present embodiment, a buffer inserted in the inserting step is regarded as a driven element, and the same operation (steps S511 to S517) is carried out in a recursive and bottom-up manner. Thus, a clock tree extending between the clock supplying element to each of FFs is formed. Then, optimization in terms of delay between the clock supplying element and each of the FFs is effected on the clock tree and also a clock-skew reduction processing (step S518) is effected.

Now, a procedure of the evaluation value calculating processing carried out at evaluation value calculating step S513 (evaluation value calculating unit 42) will be described with reference to a flowchart (steps A1 to A3) shown in FIG. 4.

According to the present embodiment, utilized evaluation value is reduced into a numerical value determined so as to suppress the hold error.

Figure 5A:
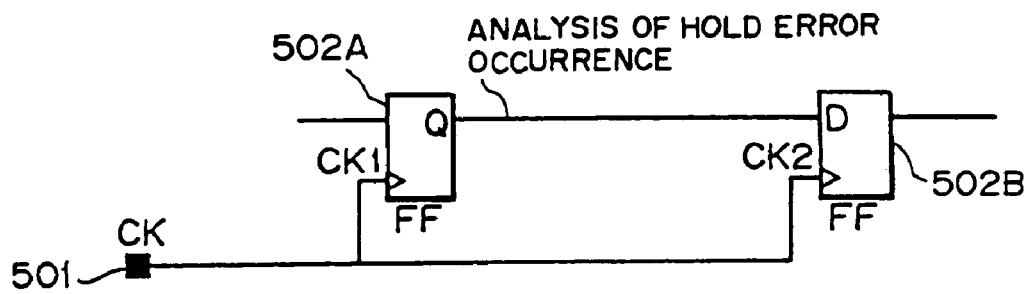
FIGS. 5A to 5C are diagrams for explaining how hold error is taken place.

Now, how the hold error is brought about will be described with reference to FIG. 5A in which there are shown a pair of FFs 502A and 502B which are connected to each other and supplied with a clock signal CK from a clock supplying element 501. As shown in FIGS. 6A to 6E, the FF 502A generates data from an output terminal Q in response to the rising edge of the clock signal supplied to the FF at a clock terminal CK1. The FF 502B tries to hold the data which is sent from the FF 502A to a data terminal D in response to the rising edge of the clock signal supplied thereto at a clock terminal CK2. At this time, if a predetermined time exceeds the time of duration $T_H$ in which the data generated from the FF 502A lasts after the rising edge of the clock signal supplied to the clock terminal CK2, the FF 502B will fail to hold the data sent from the FF 502A. Such an error is known as a hold error. The hold error tends to occur more frequently as the path delay between the FFs 510A and 502B becomes small.

Figure 5B:
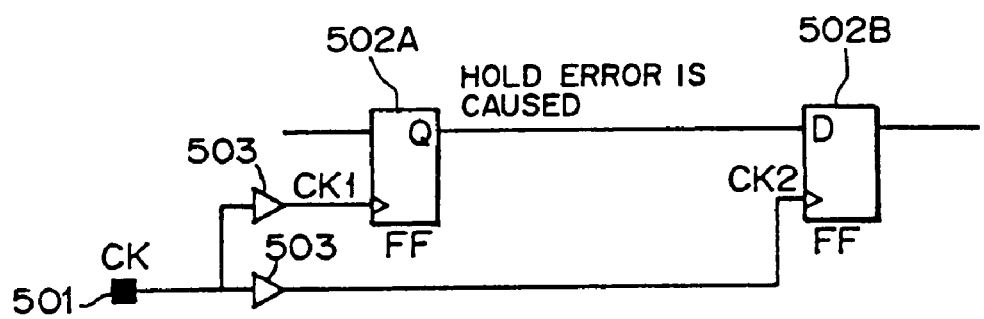
Figure 5C:
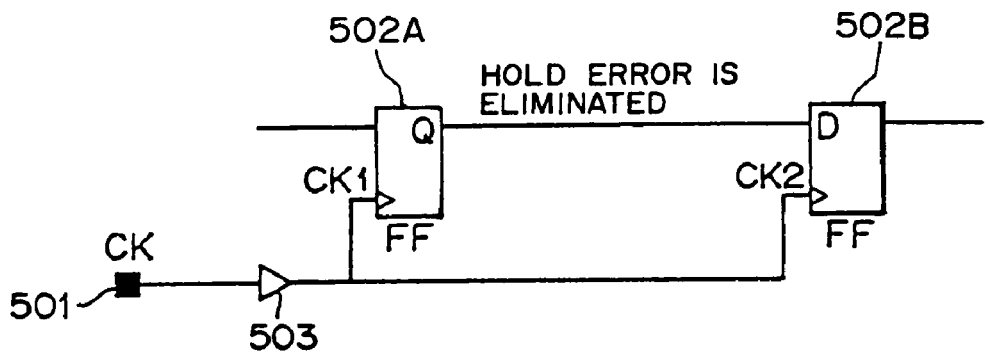

When the pair of FFs are placed in a relation such that the hold error tends to occur in the FF 502B, if the FFs 502A and 502B are arranged to be driven through separate buffer elements 503 and 503 as shown in FIG. 5B, it is difficult to suppress the hold error. Conversely, if the FFs 502A and 502B are arranged to belong to the same group so as to be driven by the same buffer element 503 as shown in FIG. 5C, then it becomes possible to prevent the hold error from occurring.

Figure 4:
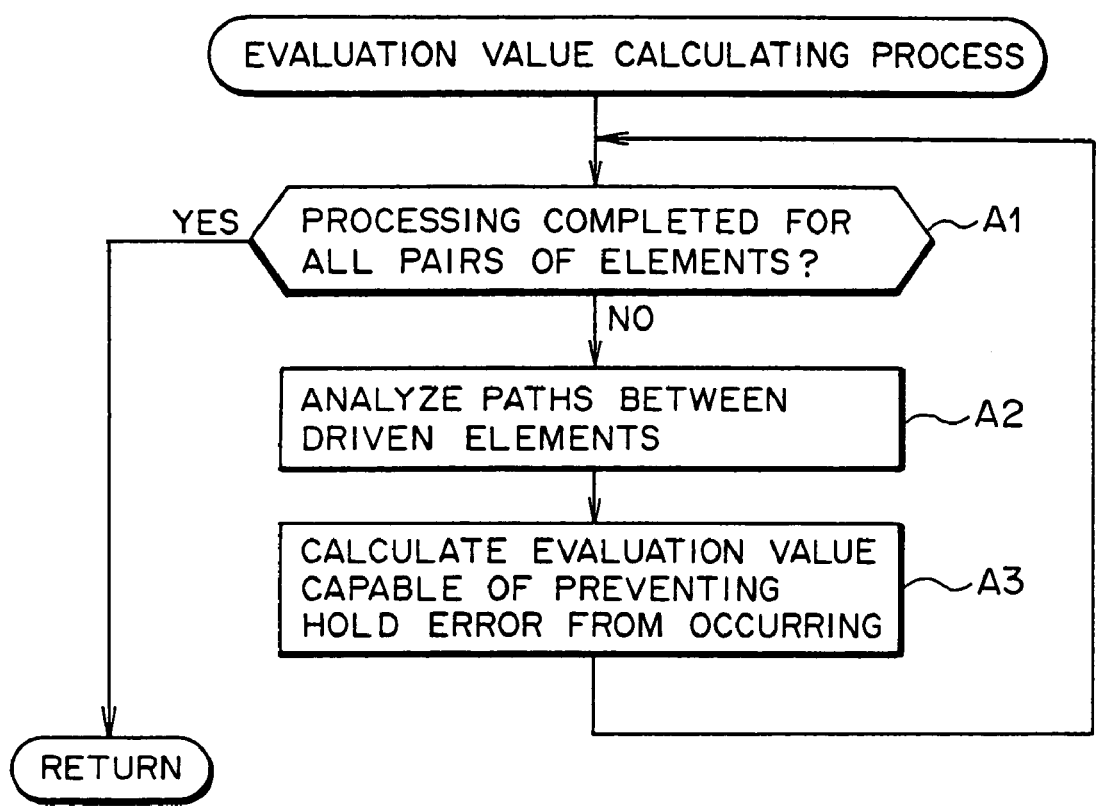
FIG. 4 is a flowchart for explaining a procedure of an evaluation value calculating processing according to the first embodiment of the present invention.

According to the present embodiment, as shown in FIG. 4, a path (circuit) between two driven elements constituting a pair is analyzed (step A2) based on logic information, an evaluation value (hold error evaluation value) is determined so that the value becomes larger with increase of the probability at which the hold error is taken place in the pair of elements, and then the value is allocated to the pair of elements (step A3). Such a calculation processing is carried out over the all pairs of elements (when YES determination is delivered at step A1).

In this way, if a pair is allocated with a high evaluation value (i.e., the pair has a high hold error probability), both of the elements constituting the pair tend to belong to the same group, which fact leads to prevention of the hold error.

As described above, according to the first embodiment of the present invention, the FFs 502, 502A, 502B, 502B and the buffer element 503 are divided into groups so that each group has the same or substantially the same number of elements and load capacity. Therefore, the arrangement of the clock tree (tree-like signal lines) becomes well balanced among these groups in terms of clock distribution. Accordingly, delay of signal from the clock supplying element 501 to each of the FFs 502, 502A, 502B is optimized, clock skew can be positively reduced, and it becomes possible to design a circuit which can cope with the demand in high speed processing.

Further, if the clock tree with a proper balance is successfully created as described above and then clock distribution is optimized, then it is possible to arrange a clock tree with a small clock skew with ease. Therefore, delay of signal from the clock supplying element 501 to each of the FFs 502, 502A, 502B is more positively optimized, and clock skew can be more positively reduced.

Furthermore, according to the present embodiment, the driven elements are divided into groups so that, of pairs satisfying the fan-out restriction, a pair having the largest evaluation value is made to belong to the same group with priority. Therefore, the driven elements can be divided into groups (buffering) while the fan-out restriction is satisfied and the hold error probability is taken into consideration. Accordingly, it is possible to create a clock tree which can positively prevent the hold error from being brought about, with the result that the circuit quality will be remarkably improved.

While in the above-described first embodiment the evaluation value is determined as a numerical value indicating a hold error suppressing property, the evaluation value can be determined in the following manners described as first to fifth modifications.

[1-1] Description of a First Modification of the First Embodiment

A first modification of evaluation value calculating processing carried out at evaluation value calculating step S513 (evaluation value calculating unit 542) will hereinafter be described with reference to a flowchart (at steps A11 to A13) shown in FIG. 7.

According to the first modification of the first embodiment, the evaluation value is determined as a numerical value indicating a setup error suppressing property.

Figure 8A:
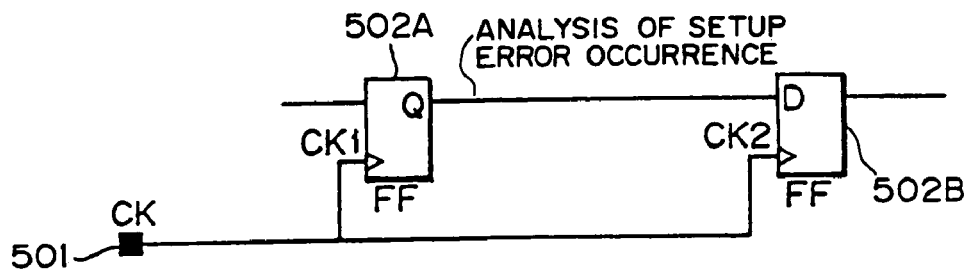
FIGS. 8A to 8C are diagrams for explaining how hold error is taken place.

Now, how setup error is brought about will be described with reference to FIG. 8A in which there are shown a pair of FFs 502A and 502B which are connected to each other and supplied with a clock signal CK from a clock supplying element 501. As shown in FIGS. 9A to 9E, the FF 502A generates data from an output terminal Q in response to the rising edge of the clock signal supplied to the FF at a clock terminal CK1. The FF 502B tries to hold the data sent from the FF 502A to a data terminal D in response to the rising edge of the clock signal supplied thereto at a clock terminal CK2. At this time, if a predetermined time exceeds a time of duration $T_s$ from the timing point at which the data generated from the FF 502A reaches the FF 502B to a timing point of the rising edge of the clock signal, supplied to the clock terminal, the FF 502B will fail to hold the data sent from the FF 502A. Such an error is known as a setup error. The setup error tends to occur more frequently as the path delay between the FFs 502A and 502B becomes large.

Figure 8B:
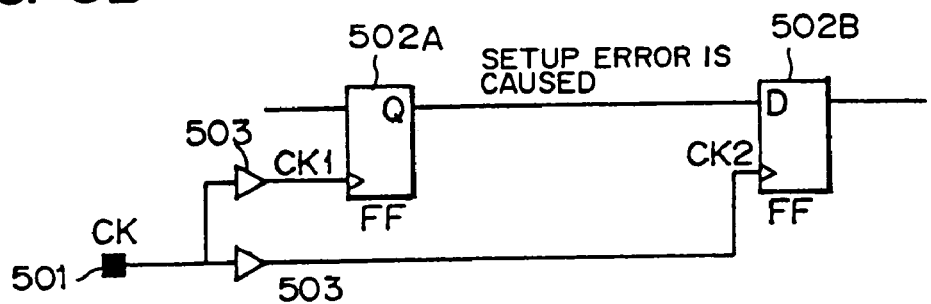
Figure 8C:
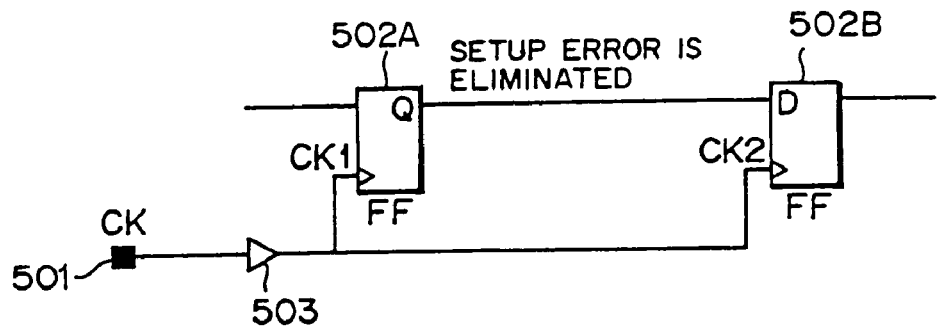

When the pair of FFs are placed in a relation such that the setup error tends to occur in the FF 502B, if the FFs 502A and 502B are arranged to be driven through separate buffer elements 503 and 503 as shown in FIG. 8B, it is difficult to suppress the setup error. Conversely, if the FFs 502A and 502B are arranged to belong to the same group so as to be driven by the same buffer element 503 as shown in FIG. 8C, then it becomes possible to prevent the setup error from occurring.

Figure 7:
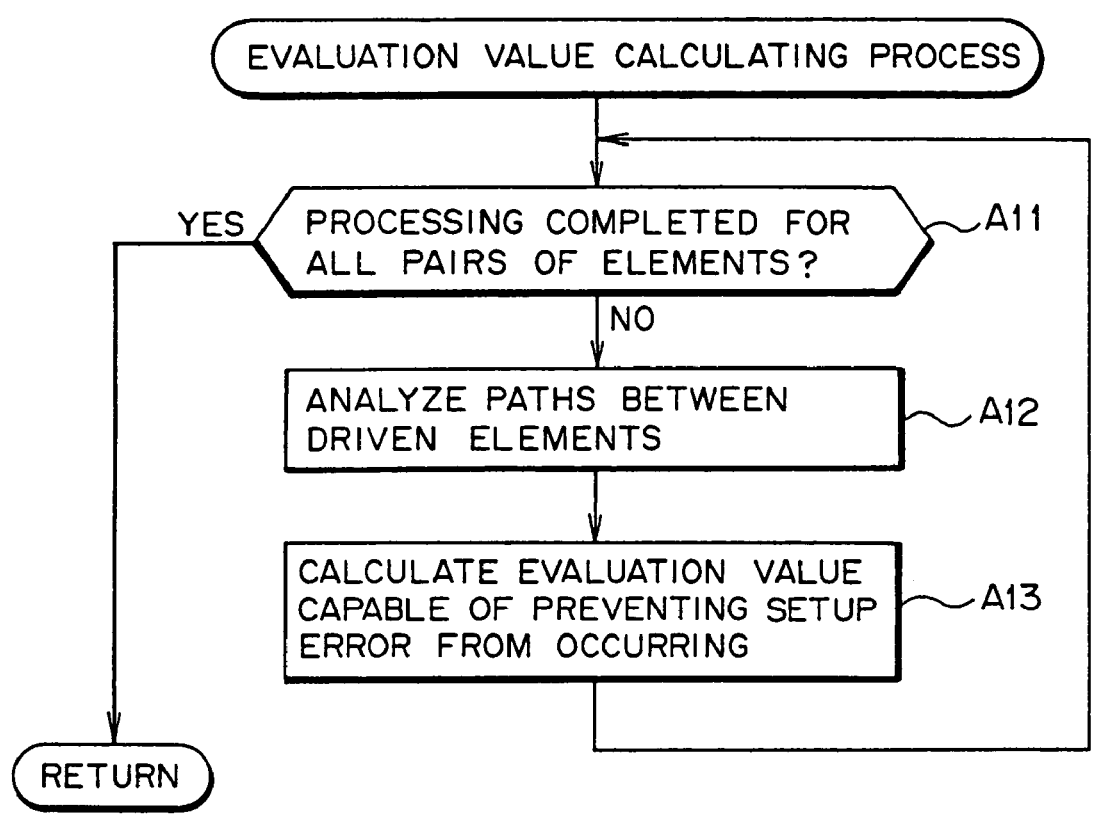
FIG. 7 is a flowchart for explaining a first modification of the evaluation value calculating processing according to the first embodiment of the present invention.

According to the first modification, as shown in FIG. 7, a path (circuit) between driven elements constituting a pair is analyzed (step A12) based on logic information, an evaluation value (setup error evaluation value) is determined so that the value becomes larger with increase of the probability at which the setup error is taken place in the pair of elements, and then the value is allocated to the pair of elements (step A13). Such a calculation processing is carried out over the all pairs of elements (when YES determination is delivered at step A11).

In this way, if a pair is allocated with a large evaluation value (i.e., the pair has a high setup error probability), both of the elements constituting the pair tend to belong to the same group, which fact leads to prevention of setup error. Accordingly, it becomes possible to create a clock tree in which the setup error can be positively prevented from occurrence, and hence the circuit quality can be remarkably increased.

[1-2] Description of a Second Modification of the First Embodiment

A second modification of evaluation value calculating processing carried out at evaluation value calculating step S513, (evaluation value calculating unit 542) will hereinafter be described with reference to a flowchart (at steps A21 to A25) shown in FIG. 10.

According to the second modification of the first embodiment, the evaluation value is determined as a numerical value indicating a hold error suppressing property and a setup error suppressing property.

Figure 10:
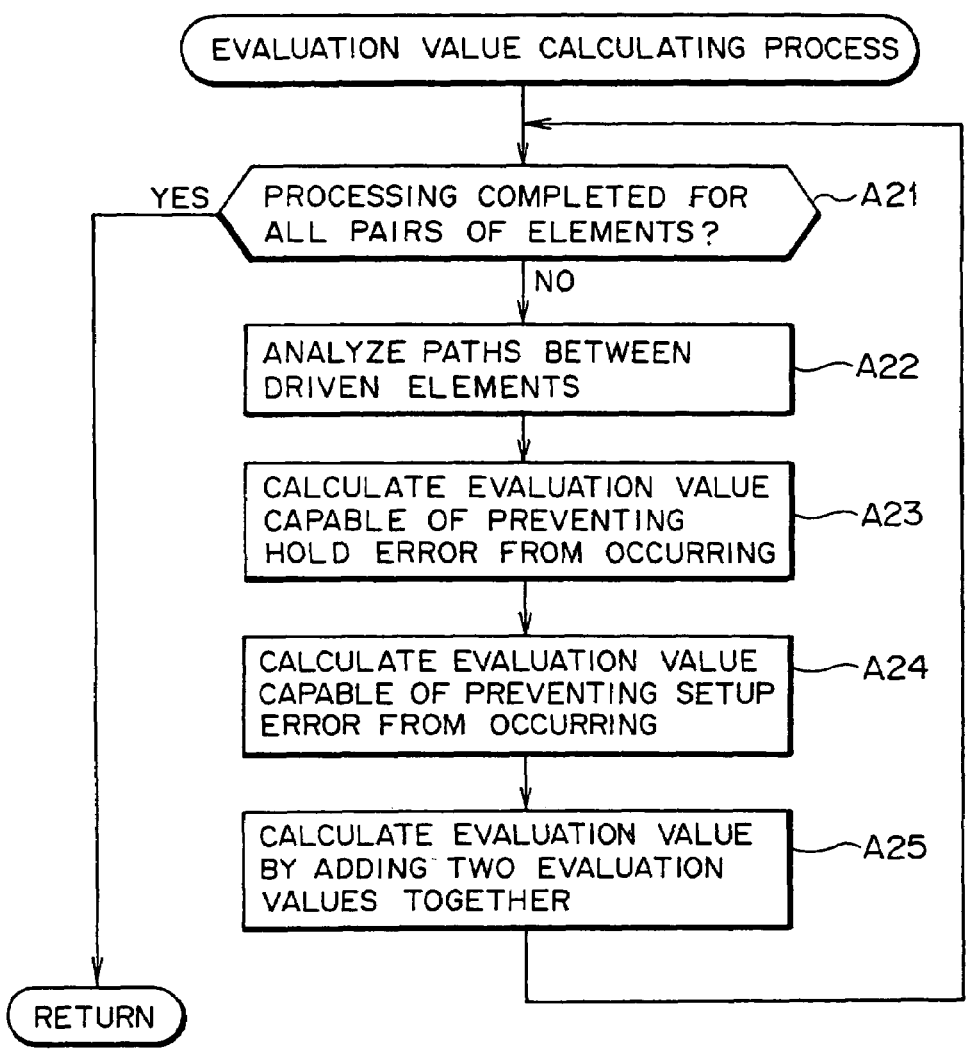
FIG. 10 is a flowchart for explaining a second modification of the evaluation value calculating processing according to the first embodiment of the present invention.

That is, as shown in FIG. 10, a path (circuit) between driven elements constituting a pair is analyzed (step A12) based on logic information, an evaluation value (hold error evaluation value) is determined so that the value becomes larger as the path delay becomes smaller, i.e., with increase of the probability at which the hold error is taken place in the pair of elements (step A23), an evaluation value (setup error evaluation value) is determined so that the value becomes larger as the path delay becomes larger, i.e., with increase of the probability at which the setup error is taken place in the pair of elements (step A24). Then, the two values are added together and the resultant value is allocated to the pair of elements (step A25). Such a calculation processing is carried out over the all pairs of elements (when YES determination is delivered at step A21).

In this way, if a pair is allocated with a large evaluation value (i.e., the pair has a high hold error probability or a high setup error probability), both of the elements constituting the pair tend to belong to the same group, which fact leads to prevention of hold error and setup error. Accordingly, it becomes possible to create a clock tree in which the hold error and the setup error can be positively prevented from occurrence, and hence the circuit quality can be remarkably increased.

[1-3] Description of a Third Modification of the First Embodiment

A third modification of evaluation value calculating processing carried out at evaluation value calculating step S513 (evaluation value calculating unit 542) will hereinafter be described with reference to a flowchart (at steps A31 to A36) shown in FIG. 11.

According to the third modification of the first embodiment, the evaluation value is determined as a numerical value indicating a hold error suppressing property and a wiring length reducing property.

Figure 11:
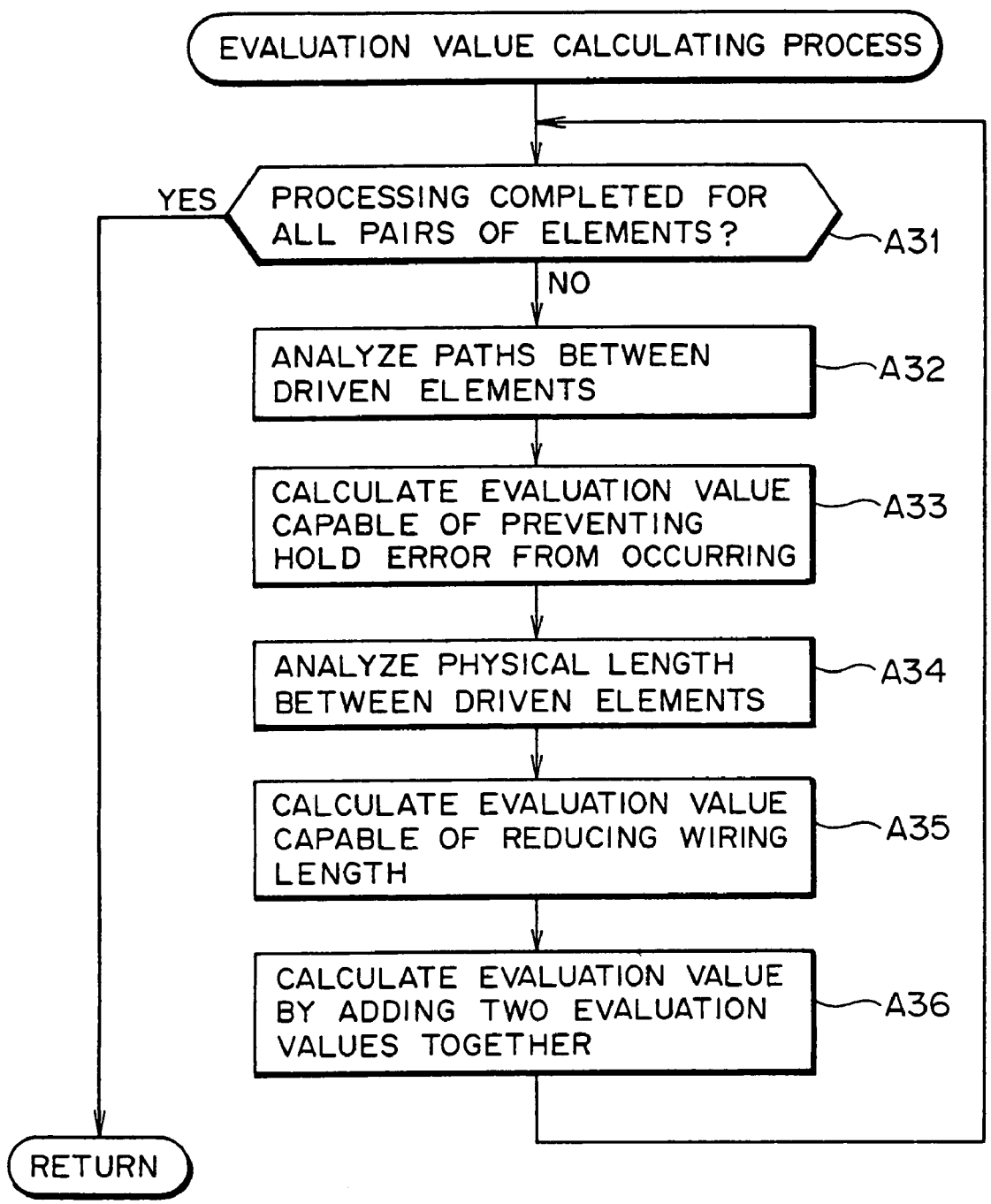
FIG. 11 is a flowchart for explaining a third modification of the evaluation value calculating processing according to the first embodiment of the present invention.

That is, as shown in FIG. 11, a path (circuit) between driven elements constituting a pair is analyzed (step A32) based on logic information, an evaluation value (hold error, evaluation value) is determined so that the value becomes larger as the path delay becomes smaller, i.e., with increase of the probability at which the hold error is taken place in the pair of elements (step A33).

Thereafter, the physical distance between driven elements constituting the pair is analyzed (step A34) based on floor-plan information or placement information (layout information, physical information) and the evaluation value (physical distance evaluation value) is determined so that the value becomes larger as the physical distance becomes short (step A35).

Then, the two values are added together and the resultant value is allocated to the pair of elements (step A36). Such a calculation processing is carried out over the all pairs of elements (when YES determination is delivered at step A31).

In this way, if a pair is allocated with a high evaluation value (i.e., the pair has a high hold error probability or the elements of the pair are placed close to each other), the elements of the pair tend to belong to the same group, which fact leads to prevention of hold error and reduction of wire length.

Figure 12A:
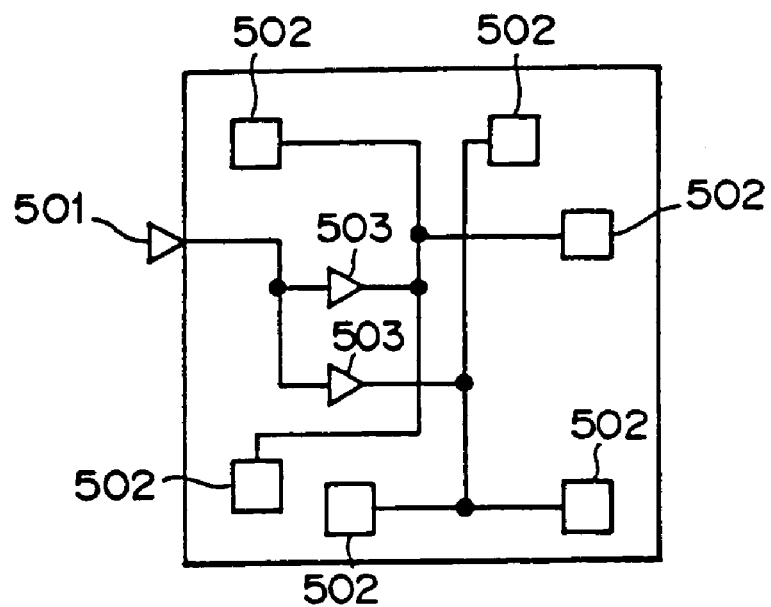
FIG. 12A is a diagram illustrative of a buffering result where a physical distance between driven elements is not taken into consideration.
Figure 12B:
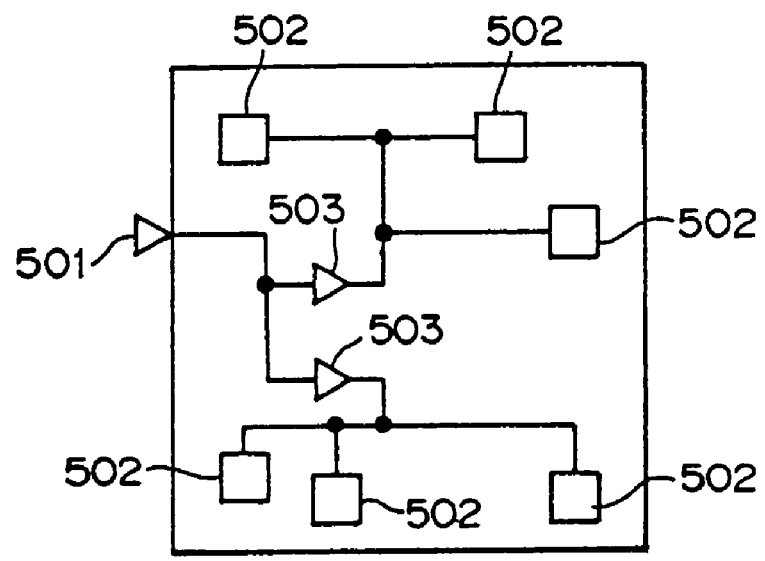
FIG. 12B is a diagram illustrative of buffering result where a physical distance between driven elements is taken into consideration.

If the placement of the elements is designed without taking the physical distance between the elements into consideration, as for example shown in FIG. 12A, a clock tree extending from a clock supplying terminal 501 to an FF 502 is formed irrespective of the placement of the FF 502. Thus, the signal line for supplying a clock signal can be extremely long. Conversely, as described above, if the placement of the elements is designed with taking the physical distance between the elements into consideration, as for example shown in FIG. 12B, the clock tree is formed while FFs 502 placed close to each other are made to belong to the same group. Thus, the wiring length of the clock signal lines can be reduced.

Accordingly, it becomes possible to create a clock tree in which the hold error can be positively prevented from occurrence, and hence the circuit quality can be remarkably increased. In addition, the clock skew can be positively suppressed with ease, wiring length can be shortened, and signal distribution can be more positively optimized.

[1-4] Description of a Fourth Modification of the First Embodiment

A fourth modification of evaluation value calculating processing carried out at evaluation value calculating step S513 (evaluation value calculating unit 542) will hereinafter be described with reference to a flowchart, (at steps A41 to A46) shown in FIG. 13.

According to the fourth modification of the first embodiment, the evaluation value is determined as a numerical value indicating a setup error suppressing property and a wiring length reducing property.

Figure 13:
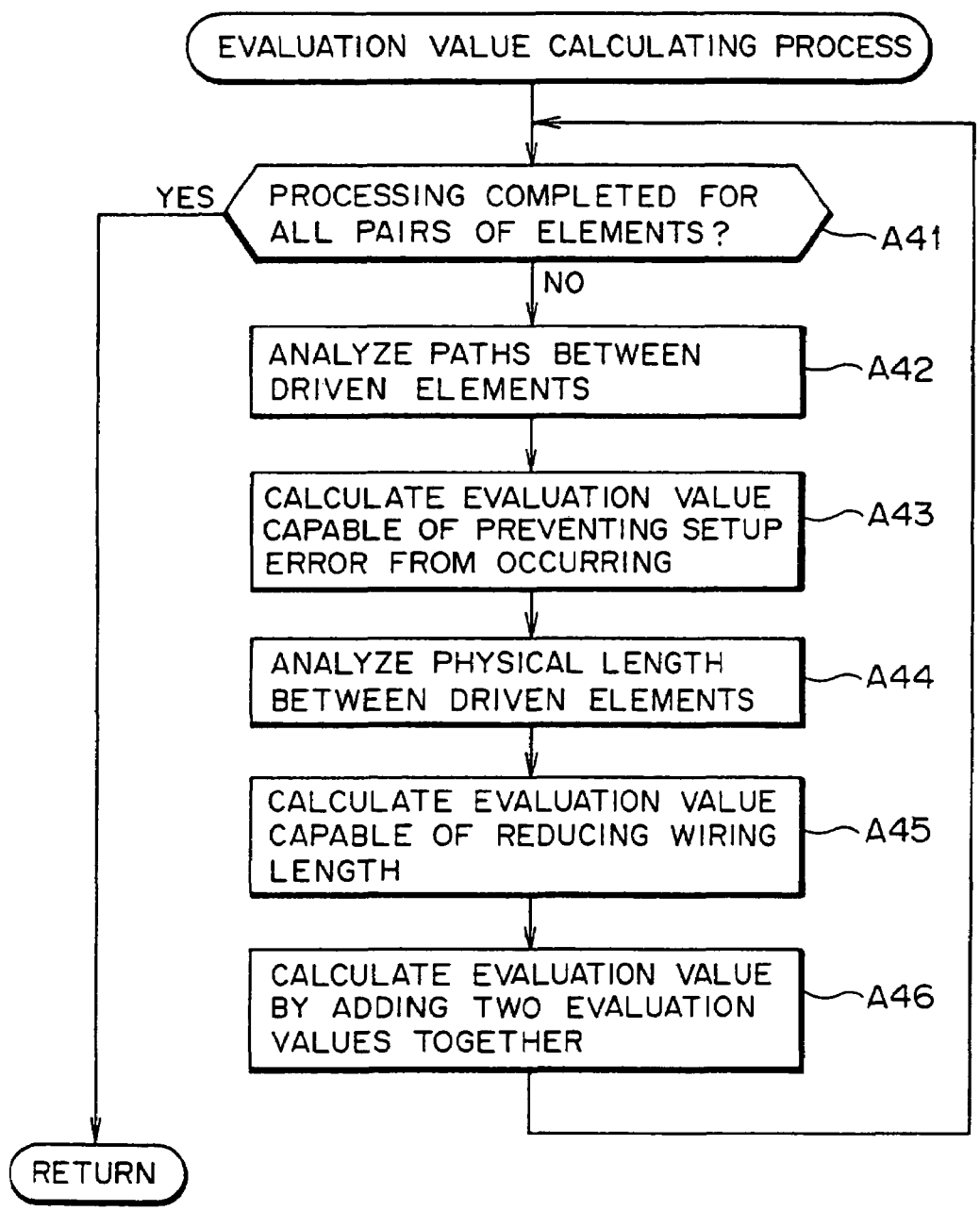
FIG. 13 is a flowchart for explaining a fourth modification of the evaluation value calculating processing according to the first embodiment of the present invention.

That is, as shown in FIG. 13, initially a path (circuit) between driven elements constituting a pair is analyzed (step A42) based on logic information, an evaluation value (setup error evaluation value) is determined so that the value becomes larger as the path delay becomes large, i.e., with increase of the probability at which the setup error is taken place in the pair of elements (step A43).

Thereafter, the physical distance between driven elements constituting the pair is analyzed (step A44) based on floorplan information or placement information (layout information, physical information) and the evaluation value (physical distance evaluation value) is determined so that the value becomes larger as the physical distance becomes short (step A45).

Then, the two values are added together and the resultant value is allocated to the pair of elements (step A46). Such a calculation processing is carried out over the all pairs of elements (when YES determination is delivered at step A41).

In this way, if a pair is allocated with a high evaluation value (, i.e., the pair has a high setup error probability or the elements of the pair are placed close to each other), the elements of the pair tend to belong to the same group, which fact leads to prevention of setup error and reduction of wire length.

Accordingly, it becomes possible to create a clock tree in which the hold error can be positively prevented from occurrence, and hence the circuit quality can be remarkably increased. In addition, the clock skew can be positively suppressed with ease, wiring length can be shortened, and signal distribution can be more positively optimized.

[1-5] Description of a Fifth Modification of the First Embodiment

A fifth modification of evaluation value calculating processing carried out at evaluation value calculating step S513 (evaluation value calculating unit 542) will hereinafter be described with reference to a flowchart (at steps A51 to A57) shown in FIG. 14.

According to the fifth modification of the first embodiment, the evaluation value is determined as a numerical value indicating a hold error suppressing property, a setup error suppressing property and a wiring length reducing property.

Figure 14:
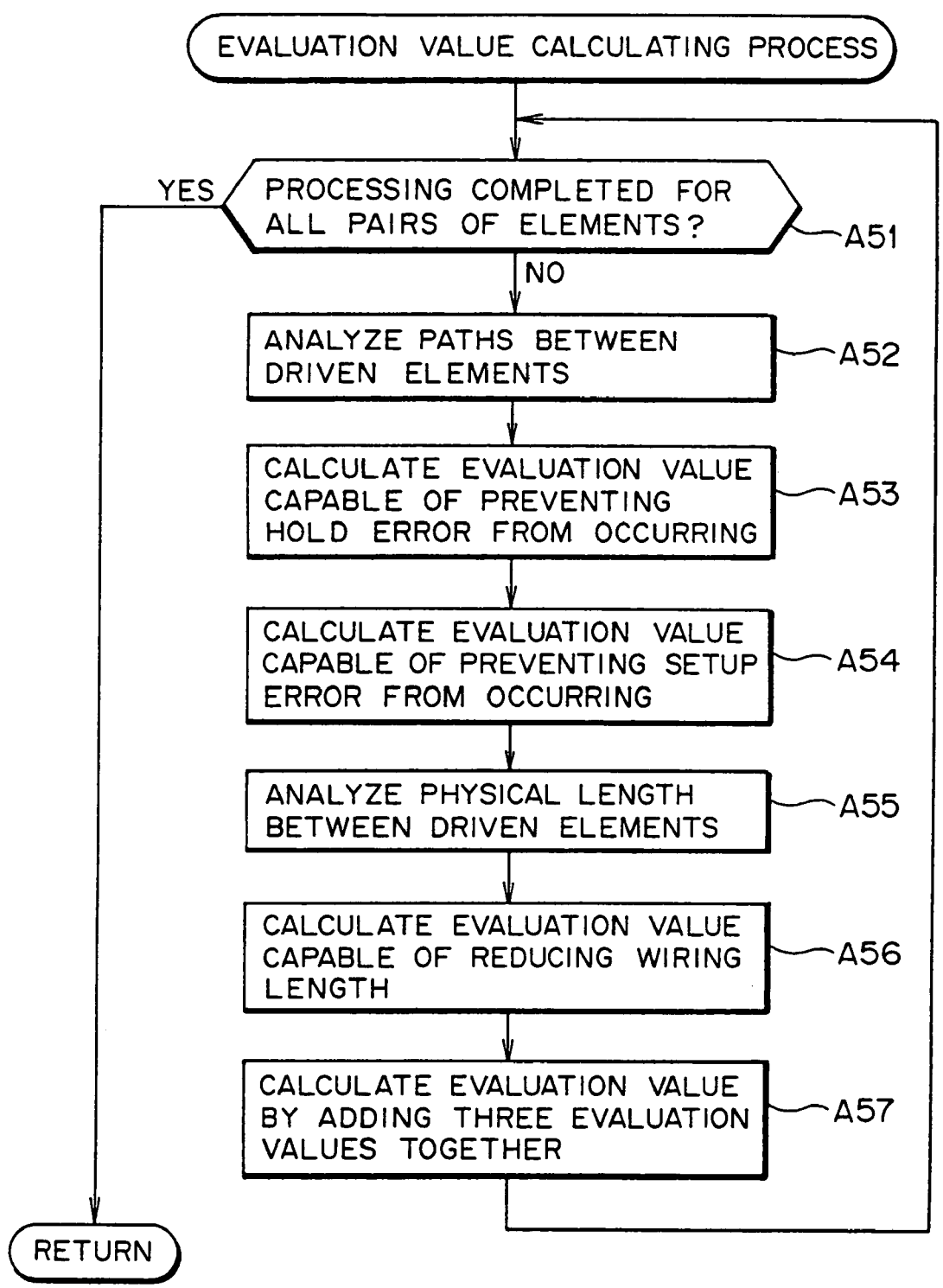
FIG. 14 is a flowchart for explaining a fifth modification of the evaluation value calculating processing according to the first embodiment of the present invention.

That is, as shown in FIG. 14, initially a path (circuit) between driven elements constituting a pair is analyzed (step A52) based on logic information, an evaluation value (hold error evaluation value) is determined so that the value becomes larger as the path delay becomes small, i.e., with increase of the probability at which the hold error is taken place in the pair of elements (step A53), and an evaluation value (setup error evaluation value) is determined so that the value becomes larger as the path delay becomes large, i.e., with increase of the probability at which the setup error is taken place in the pair of elements (step A54).

Thereafter, the physical distance between driven elements constituting the pair is analyzed (step A55) based on floorplan information or placement information (layout information, physical information) and the evaluation value (physical distance evaluation value) is determined so that the value becomes larger as the physical distance becomes short (step A56).

Then, the three values are added together and the resultant value is allocated to the pair of elements (step A57). Such a calculation processing is carried out over the all pairs of elements (when YES determination is delivered at step A51).

In this way, if a pair is allocated with a high evaluation value (, i.e., the pair has a high hold error probability or a high setup error probability or the elements of the pair are placed close to each other), the elements of the pair tend to belong to the same group, which fact leads to prevention of hold error, setup error and reduction of wire length.

Accordingly, it becomes possible to create a clock tree in which the hold error and the setup error can be positively prevented from occurrence, and hence the circuit quality can be remarkably increased. In addition, the clock skew can be positively suppressed with ease, wiring length can be shortened, and signal distribution can be more positively optimized.

[2] Description of a Second Embodiment

Figure 15:
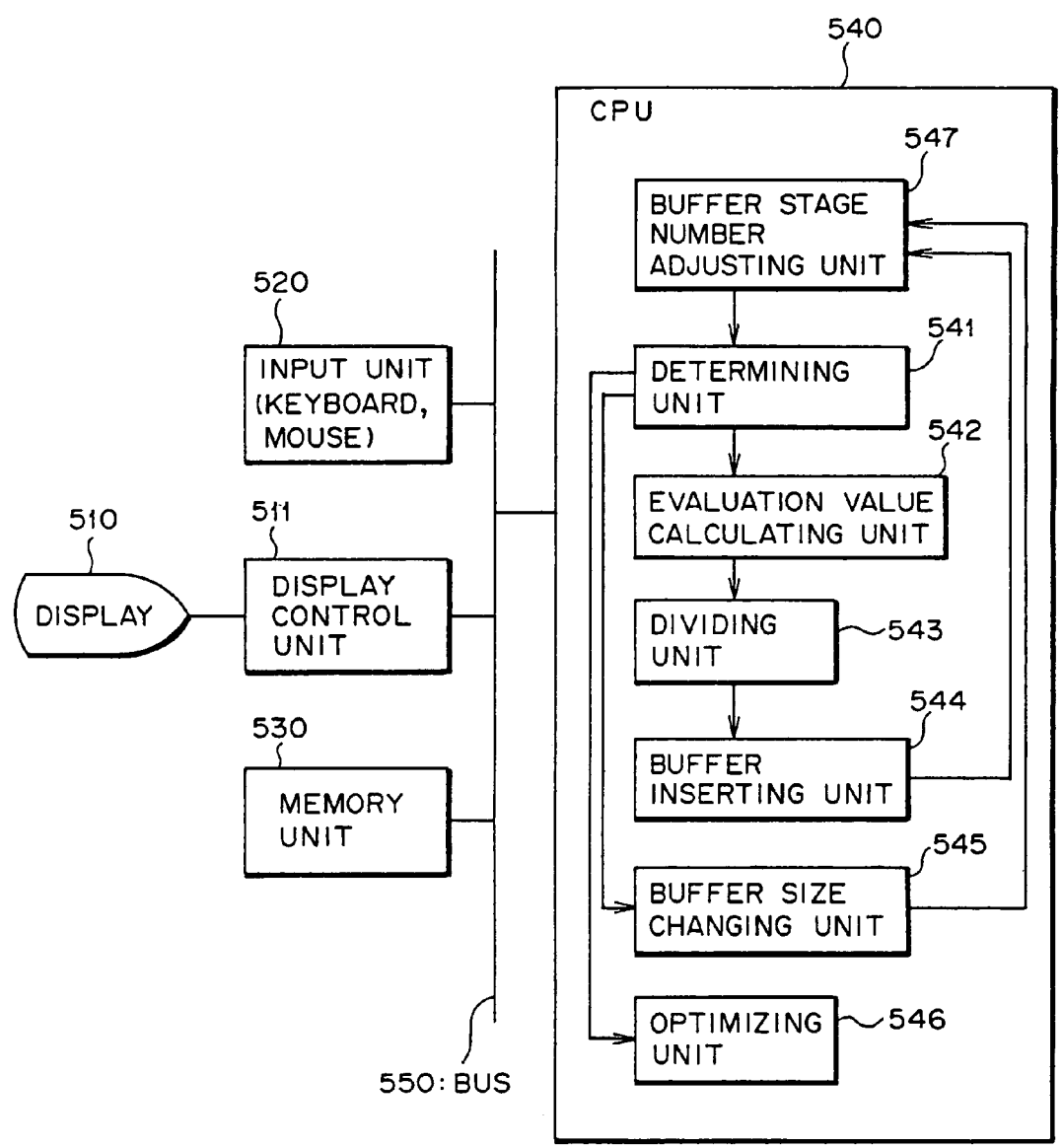
FIG. 15 is a block diagram illustrative of a function of an optimizing apparatus for optimizing signal lines within a circuit as a second embodiment of the present invention.

FIG. 15 is a block diagram showing a functional arrangement of an optimizing apparatus for optimizing signal lines within a circuit as a second embodiment of the present invention. As shown in FIG. 15, the optimizing apparatus of the second embodiment is similarly arranged to the apparatus of the first embodiment shown in FIG. 1. However, the arrangement of the second embodiment includes the CPU 540 added with a function as a buffer stage number adjusting unit 47.

The buffer stage number adjusting unit 547 serves as a function unit that inserts one ore more buffer elements 503 into paths extending from the clock supplying element 501 to each of the FFs 502 so that the number of cell stages become equal among the all paths extending from the clock supplying element 501 to the FFs 502. In this case, the cells include, in addition to the buffer element 503, a logic gate or a selector to be incorporated into the clock system net.

The function of the buffer stage number adjusting unit 547 can be implemented in such a manner that an optimizing program is installed into a processing unit (memory unit 530) from a recording medium such as a hard disk, a magnetic tape, a floppy disk, an optical disk, a magnet-optical disk a CD-ROM and so on, the installed program is read to a RAM or the like, and then the program is executed by the CPU 540 to realize the function as an operation of the CPU 540.

Now, a procedure for optimization effected by the optimizing apparatus of the second embodiment arranged as described above will be explained with reference to a flowchart (steps S511 to S518, S521 and S522) shown in FIG. 16.

Figure 2:
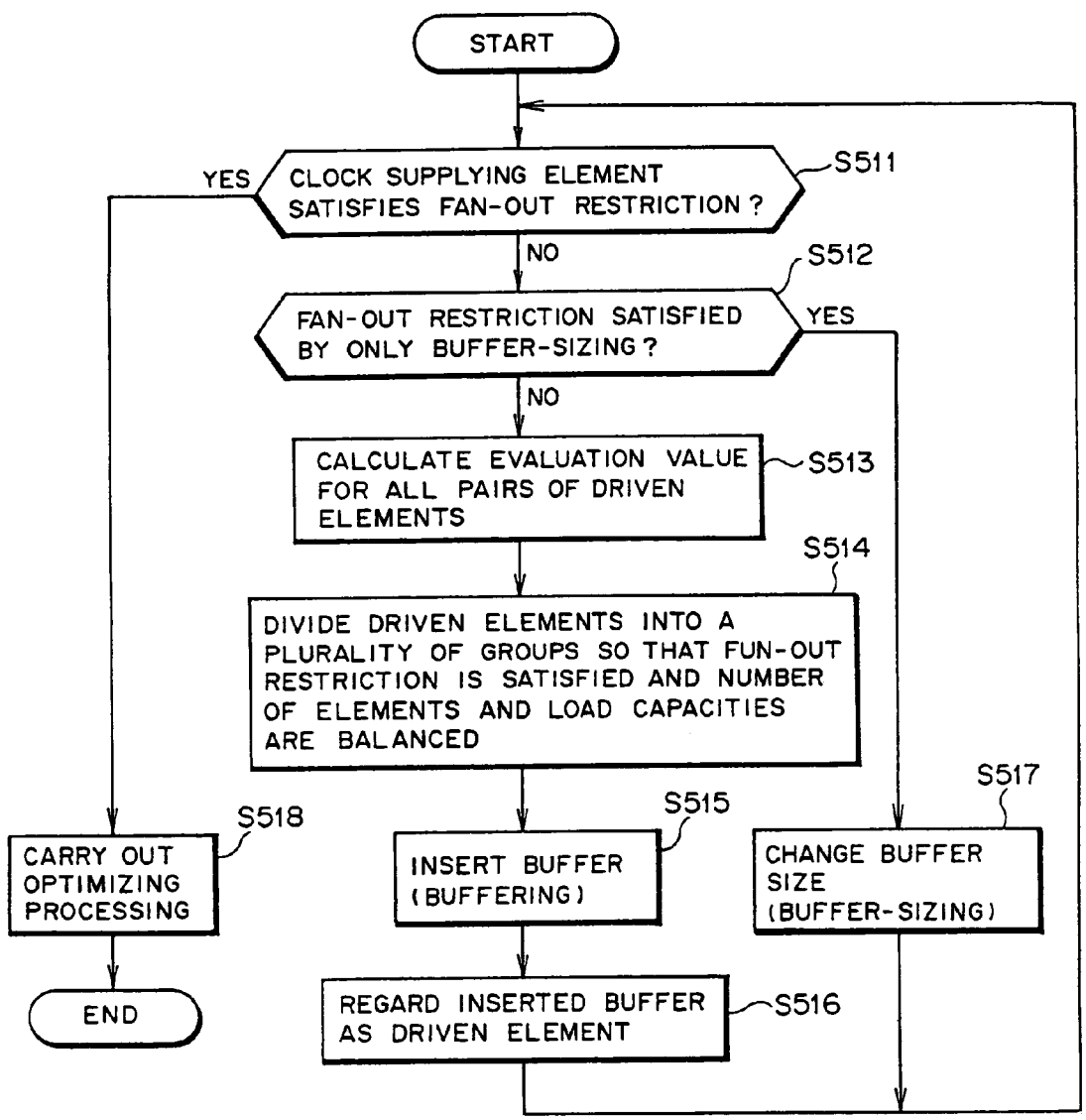
FIG. 2 is a flowchart illustrative of procedures of a method of optimizing the signal lines within the circuit as the first embodiment of the present invention.
Figure 3E:
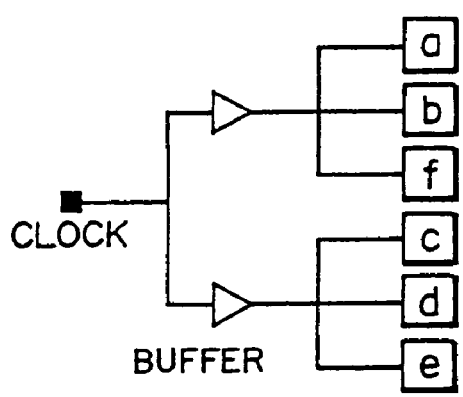
Figure 16:
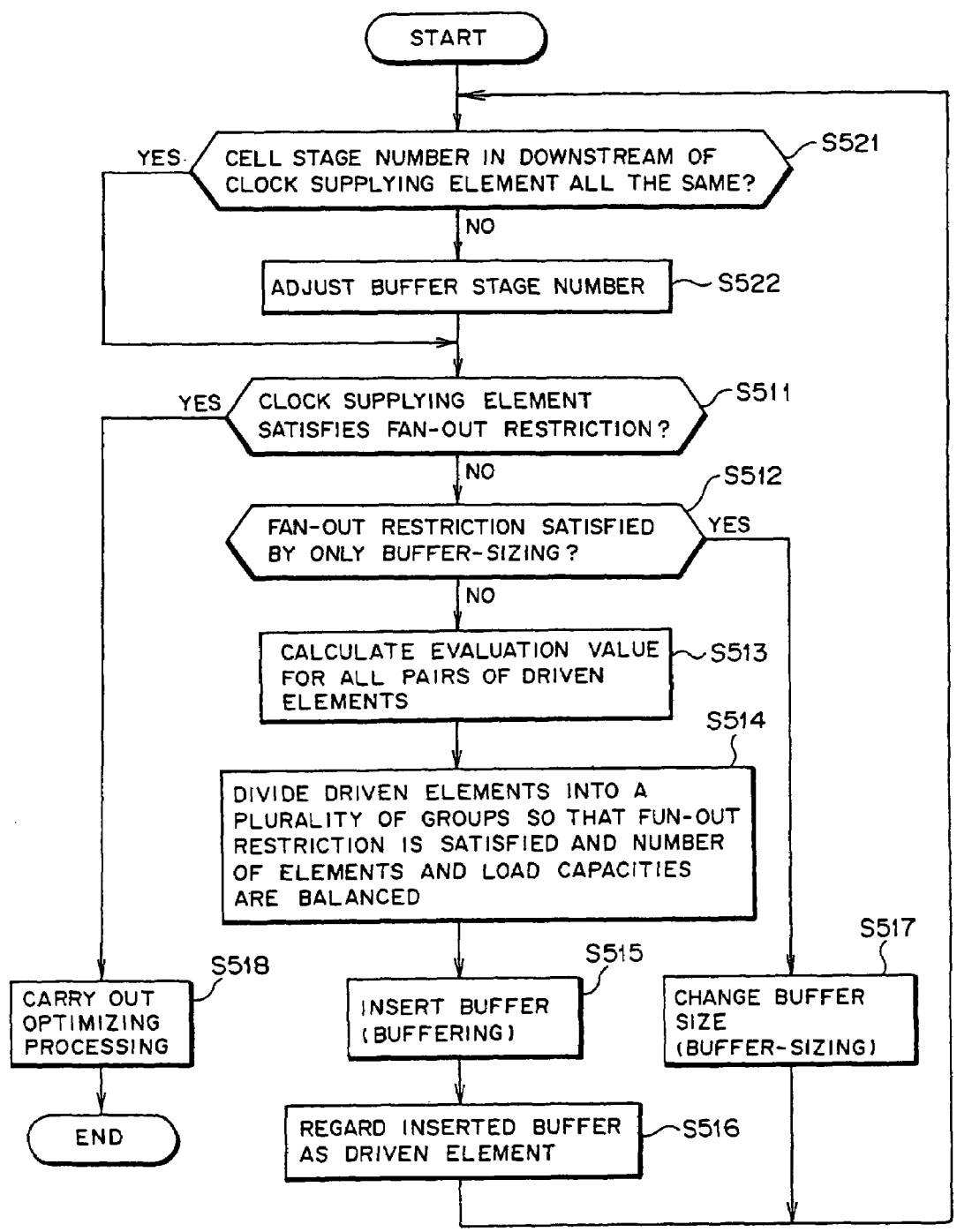
FIG. 16 is a flowchart illustrative of procedures of a method of optimizing the signal lines within the circuit as the second embodiment of the present invention.

As shown in FIG. 16, the arrangement of the second embodiment additionally includes steps S521 and S522 before the step S511 shown in FIG. 2. Thus, if processing reaches step S516 or S517, then the processing will return to step S521. In this case, the additionally provided steps S521 and S522 will be described and rest of the steps will not be described.

That is, according to the arrangement of the second embodiment, the buffer stage number adjusting unit 547 determines whether or not the all of the paths extending from the clock supplying element 501 to each of the FFs 502 include the same number of buffer stages (step S521). If it is determined that they include the same number of stages (YES route), then processing proceeds to step S511 in which processing same as those of the first embodiment is carried out. On the other hand, if it is determined that they does not include the same number of stages (NO route), then the buffer element 503 is inserted into paths extending from the clock supplying element 501 to the FFs 502 so that all paths extending from the clock supplying element 501 to the FFs 502 include the same number of cell stages (buffer stage number adjusting step S522). Thereafter, processing proceeds to step S511 in which processing same as that of the first embodiment is carried out.

Figure 17A:
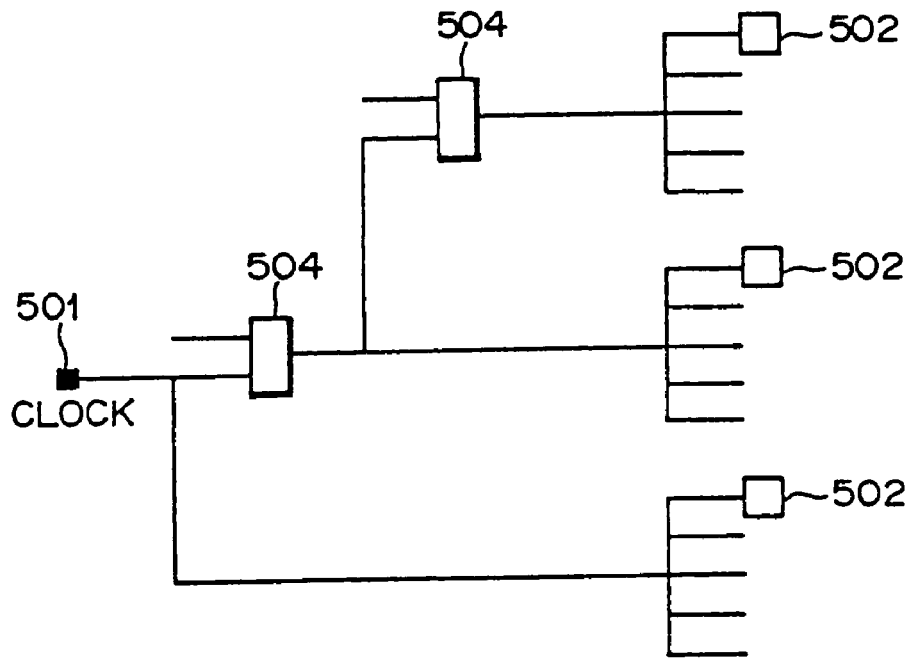
FIGS. 17A and 17B are diagrams of examples for explaining how adjustment in number of buffer stages is carried out.
Figure 17B:
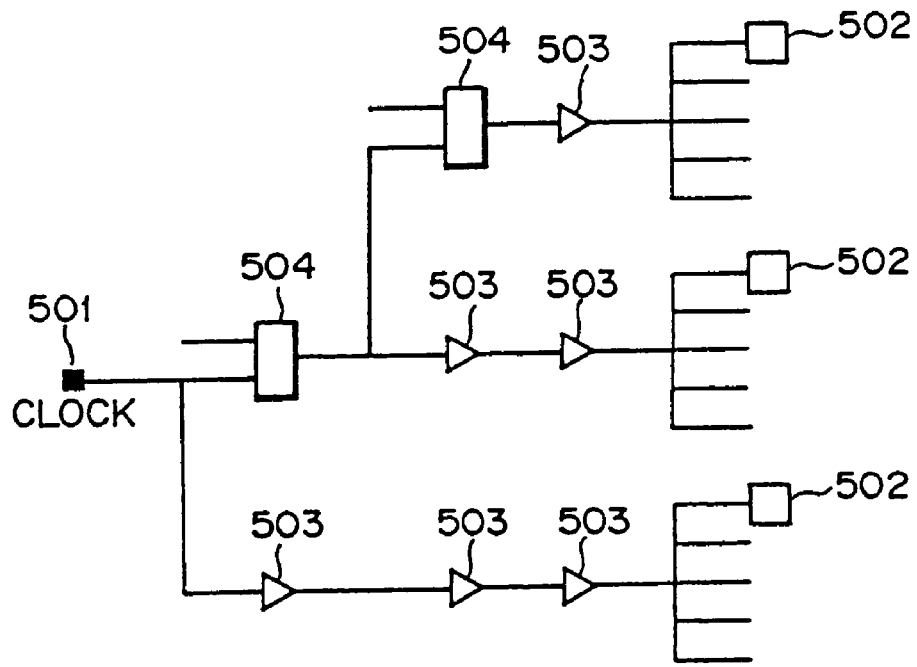

As for example shown in FIG. 17A, if a circuit is provided with a cell 504 such as a logic gate or selector, each of the paths extending from the clock supplying element 501 to the FFs 502 comes to include a different number of cell stages. In this case, if the circuit is subjected to a processing of the above-described steps S521 and S522, then the buffer element 503 is inserted so that all paths extending from the clock supplying element 501 to the FFs 502 come to include the same number of cell stages as shown in FIG. 17B.

In this way, according to the second embodiment of the present invention, effects or advantages similar to those of the first embodiment can be obtained. Moreover, since all paths extending from the clock supplying element 501 to the FFs 502 come to include the same number of cell stages, clock skew causing at each of the FFs 502 can be more positively reduced and clock distribution can be more positively optimized.

[3] Description of a Third Embodiment.

Figure 18:
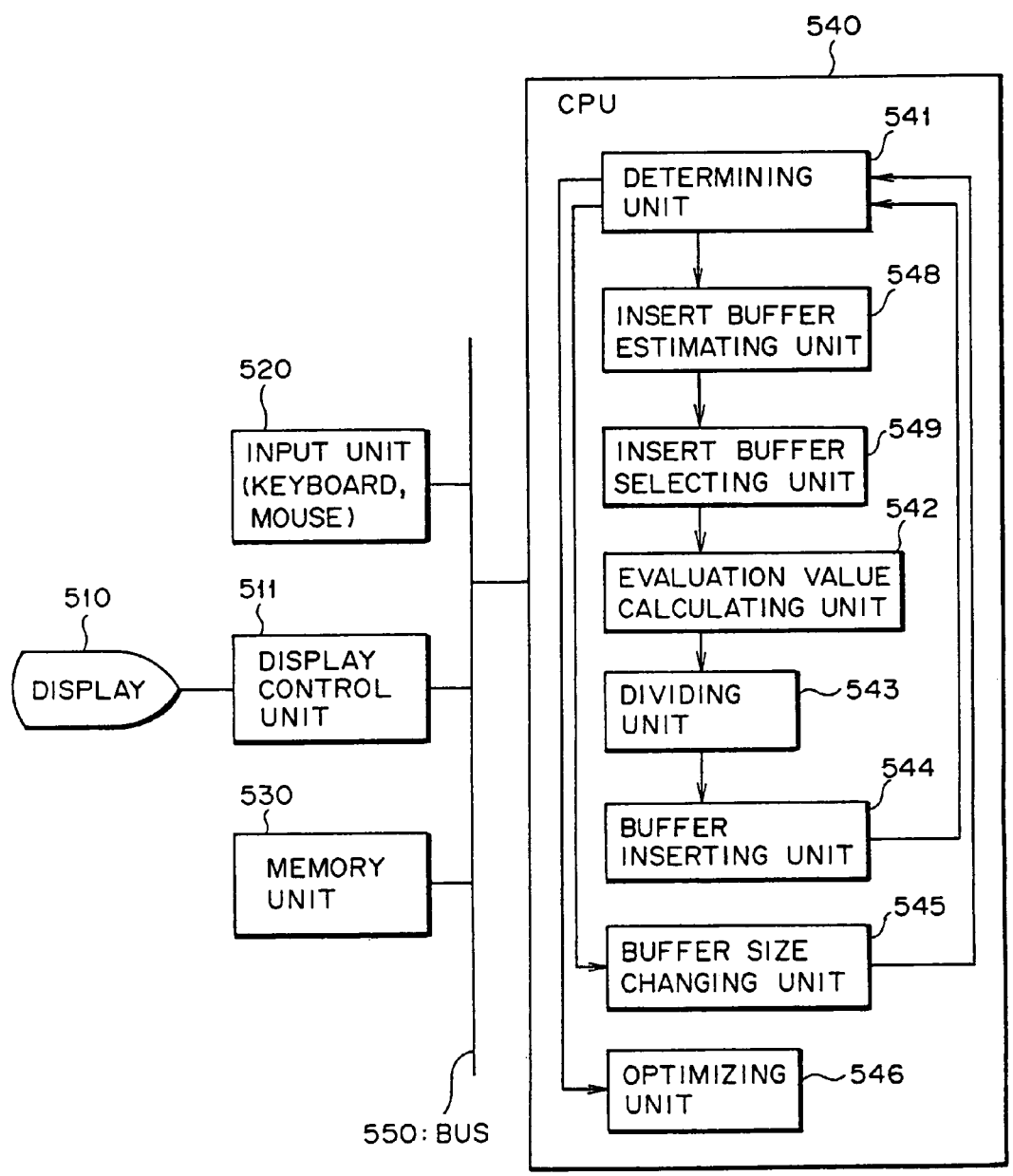
FIG. 18 is a block diagram illustrative of a function of an optimizing apparatus for optimizing signal lines within a circuit as a third embodiment of the present invention.

FIG. 18 is a block diagram showing a functional arrangement of an optimizing apparatus for optimizing signal lines within a circuit as a third embodiment of the present invention. As shown in FIG. 18, the optimizing apparatus of the third embodiment also is arranged similarly to the apparatus of the first embodiment shown in FIG. 1. However, the arrangement of the third embodiment is additionally provided with an insert buffer estimating unit 548 and an insert buffer selecting unit 549 at the CPU 540.

When the determining unit 541 determines that the clock tree arrangement of the current status does not satisfy a fan-out restriction and buffer-sizing operation is insufficient for making the clock tree satisfy the fan-out restriction, then the insert buffer estimating unit 548 estimates the number of stages of buffer elements that are to be inserted into the clock tree based on a load capacity and a number of driven elements of the clock tree.

Figure 20A:
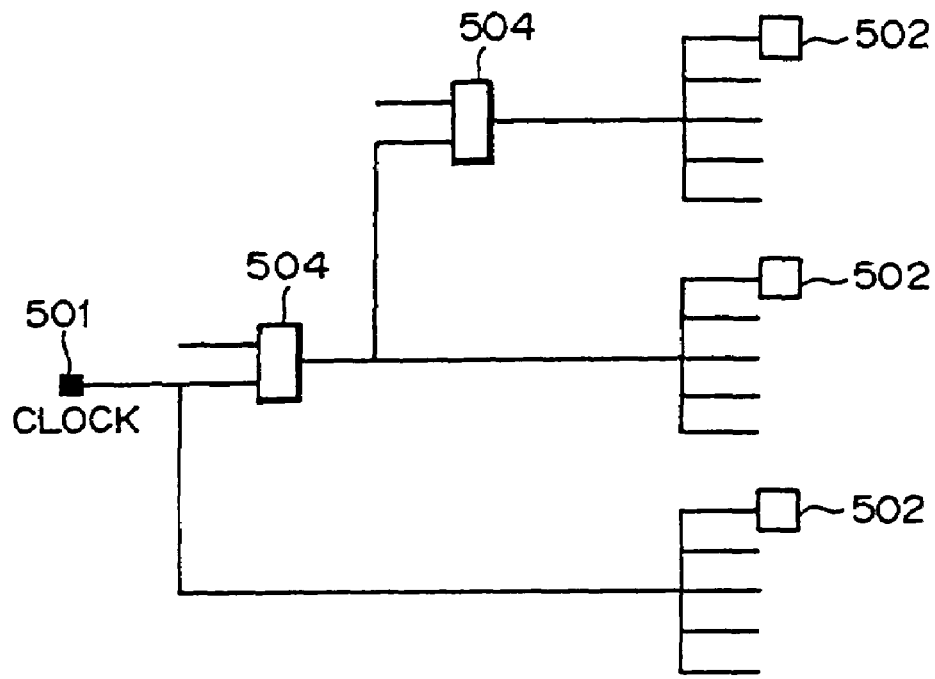
FIGS. 20A and 20B are diagrams of examples for explaining how adjustment in number of buffer stages is carried out by using inverter buffer elements.
Figure 20B:
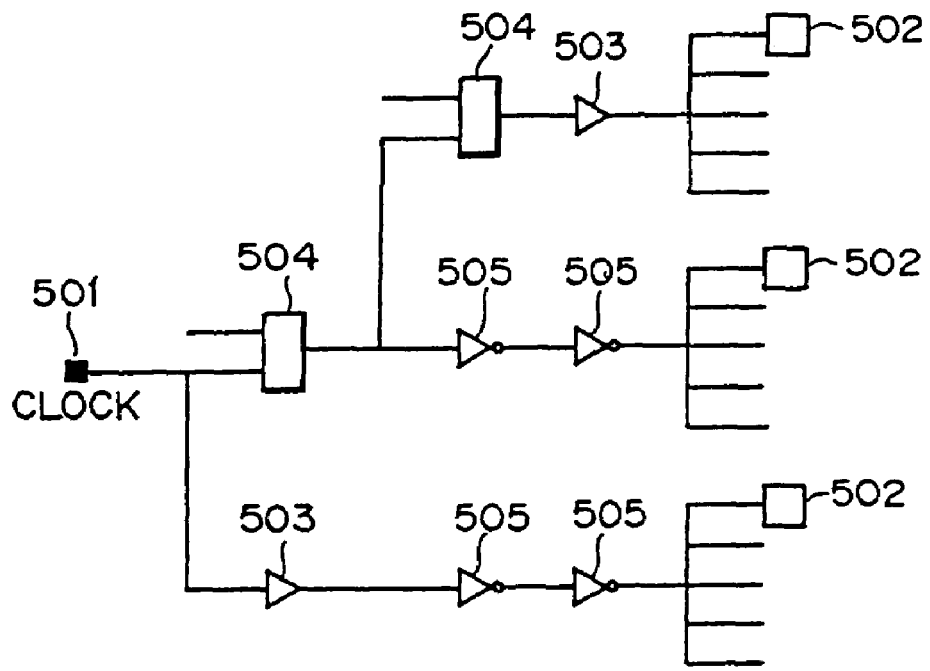

Further, when the insert buffer estimating unit 548 delivers an estimation that buffer elements of two or more number of stages are to be inserted into the clock tree, then as shown in FIG. 20B, the insert buffer selecting unit 549 selects inverter buffer elements 505 as the buffer element to be inserted by the buffer inserting unit 545, and issues a command that a combination of even number of inverter buffers 505 are inserted into the clock tree.

The functions of the insert buffer estimating unit 548 and the insert buffer selecting unit 549 can also be implemented in such a manner that an optimizing program is installed into a processing unit (memory unit 530) from a recording medium such as a hard disk, a magnetic tape, a floppy disk, an optical disk, a magnet-optical disk, a CD-ROM and so on, the installed program is read to a RAM or the like, and then the program is executed by the CPU 540 to realize the function as an operation of the CPU 540.

Now, a procedure for optimization effected by the optimizing apparatus of the third embodiment arranged as described above will be explained with reference to a flowchart (steps S511 to S518, S531 and A532) shown in FIG. 19.

As shown in FIG. 19, the arrangement of the third embodiment additionally includes steps S531 and S532 between steps S512 and S513 shown in FIG. 2. In this case, the additionally provided steps S531 and S532 will be described and rest of the steps will not be described.

That is, according to the arrangement of the third embodiment, when it is determined that the clock tree arrangement of the current status does not satisfy a fan-out restriction (NO route of step S511) and buffer sizing operation is insufficient for making the clock tree satisfy the fan-out restriction (NO route of step S512), then the insert buffer estimating unit 548 estimates the number of stages of buffer elements that are to be inserted into the clock tree based on a load capacity and a number of driven elements of the clock tree (step S531).

When the insert buffer estimating unit 548 delivers an estimation that buffer elements of two or more number of stages are to be inserted into the clock tree, then the insert buffer selecting unit 549 selects inverter buffer elements 505 as the buffer element to be inserted by the buffer inserting unit 545, and issues a command that a combination of even number of inverter buffers 505 are inserted into the clock tree (step S532). Conversely, if it is estimated that buffer elements of odd number of stages are necessary to be inserted into the clock tree, a single stage of an ordinary TRUE buffer element 503 is selected and inserted. Thereafter, processing proceeds to step S513 and processing similar to that of the first embodiment is carried out.

For example, if a circuit such as that shown in FIG. 20A is subjected to the processing described with the steps S531 and S532, and it is determined that buffer elements of two or more stages are to be inserted at a part of the circuit as shown in FIG. 20B, the inverter buffer elements of continuous two stages are inserted.

As described above, according to the third embodiment of the present inanition, effects or advantages similar to those of the first embodiment can be obtained. Moreover, similarly to the second embodiment, all paths extending from the clock supplying element 501 to the FFs 502 come to include the same number of cell stages. Furthermore, the inverter buffer element tends to exhibit more clearly shaped clock signal rising edge than that of the ordinary TRUE buffer element 503. Therefore, the circuit including the combination of inverter buffer elements will have a higher reliability in operation responding to the clock signal than the circuit exclusively composed of the ordinary TRUE buffer elements 503.

[4] Description of Fourth Embodiment

Figure 21:
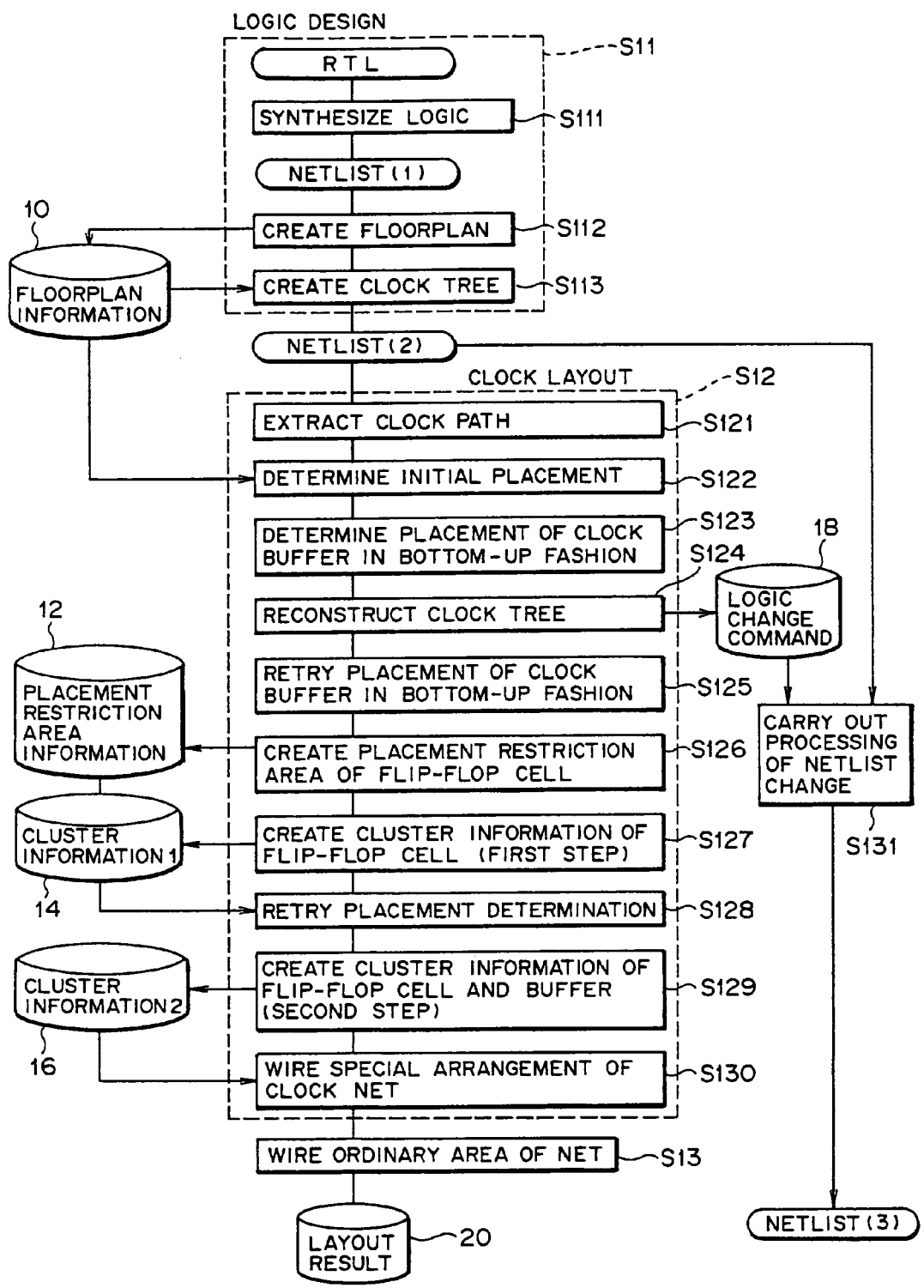
FIG. 21 is a flowchart for explaining an outline of a method of designing a circuit (LSI layout method) as a fourth embodiment of the present invention.

FIG. 21 is a flowchart for explaining an outline of an LSI layout designing method (circuit designing method) as a fourth embodiment of the present invention. Also in the embodiment of the present invention, similarly to the conventional example shown in FIG. 50, the process of determining the LSI layout is composed of, a logic design stage S11, a clock layout determining stage S12, and a wiring stage S13 for an ordinary net other than clock signal lines.

The logic designing stage S11 is composed of step S111 for synthesizing logic, step S112 utilizing a floorplan introduced by the present invention, and step S113 for creating a clock tree.

In step S111 of synthesizing logic, similarly to a conventional arrangement, a hardware description language (HDL) described in a register transfer level (RTL) of elements constituting the LSI is formed into a logic which is capable of being reduced into a layout. Then, there is created a netlist (1) having placed a plurality of modules each of which is composed of a plurality of flip-flop cells.

In step S112 for utilizing a floorplan, an operator tries to determine placement of the modules on the first netlist (1) in accordance with the floorplan so that wiring length becomes short. The result of the trial placement is stored in a floorplan information file 10.

In step S113, a second netlist (2) is created in accordance with the floorplan information stored in the floorplan information file 10 so that the floorplan is taken into consideration and a path extending from the clock source to a flip-flop cell at each end of the clock tree includes the largest number of buffer stages. The second netlist (2) includes modules (floorplan block) connected to the clock tree and buffer cells. Then, a logic of cells connected to the clock tree is constructed so that the logic represents the connection relationship in the clock tree in accordance with the second netlist (2), and then the logic is stored in a database 267 (see FIG. 46).

Then, the second netlist (2) and the floorplan information are utilized in the clock layout determining stage S12.

In the clock layout determining stage S12, initially, a clock path is extracted from the netlist (2) at step S121.

Then, at step S122, an initial placement is tried to arrange for only the flip-flop cells connected to a data line so that the floorplan information is utilized and the clock path extracted at step S121 is disregarded.

Figure 50:
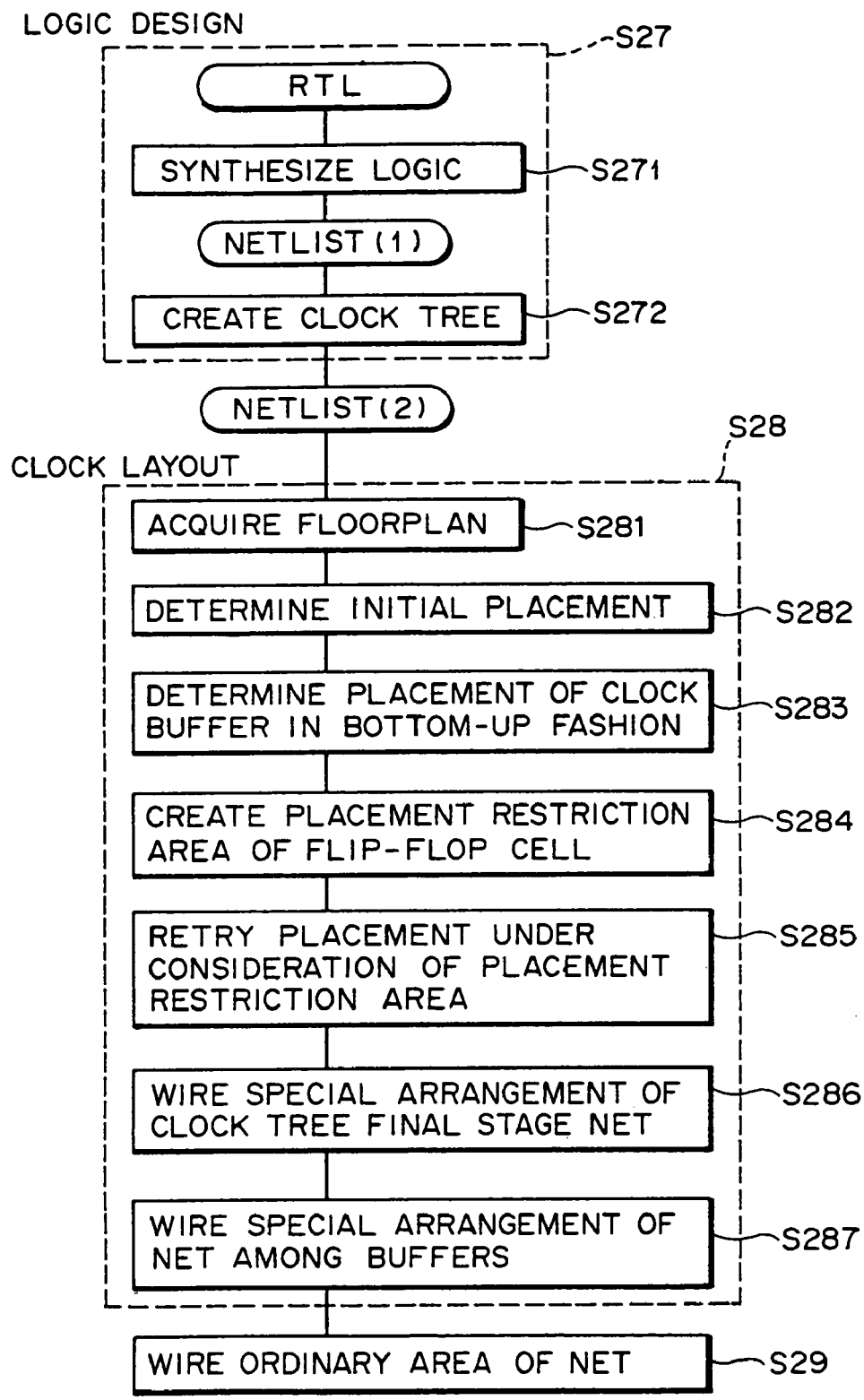
FIG. 50 is a flowchart for explaining a conventional method of arranging an LSI layout (method of designing a circuit)
Figure 51:
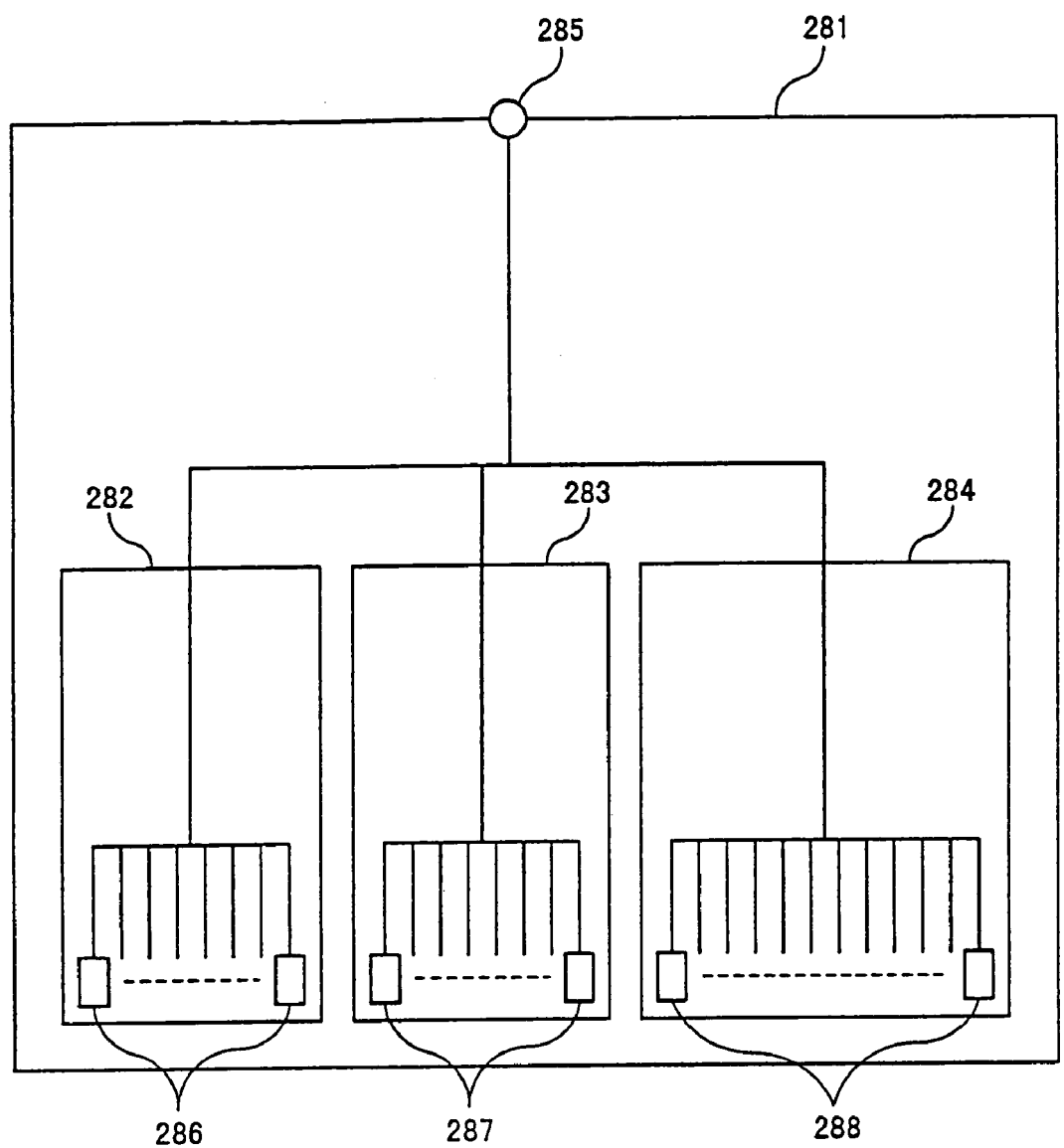
FIG. 51 is a diagram showing an example of clock tree before buffer cells are introduced into modules of the LSI according to a conventional method.
Figure 52:
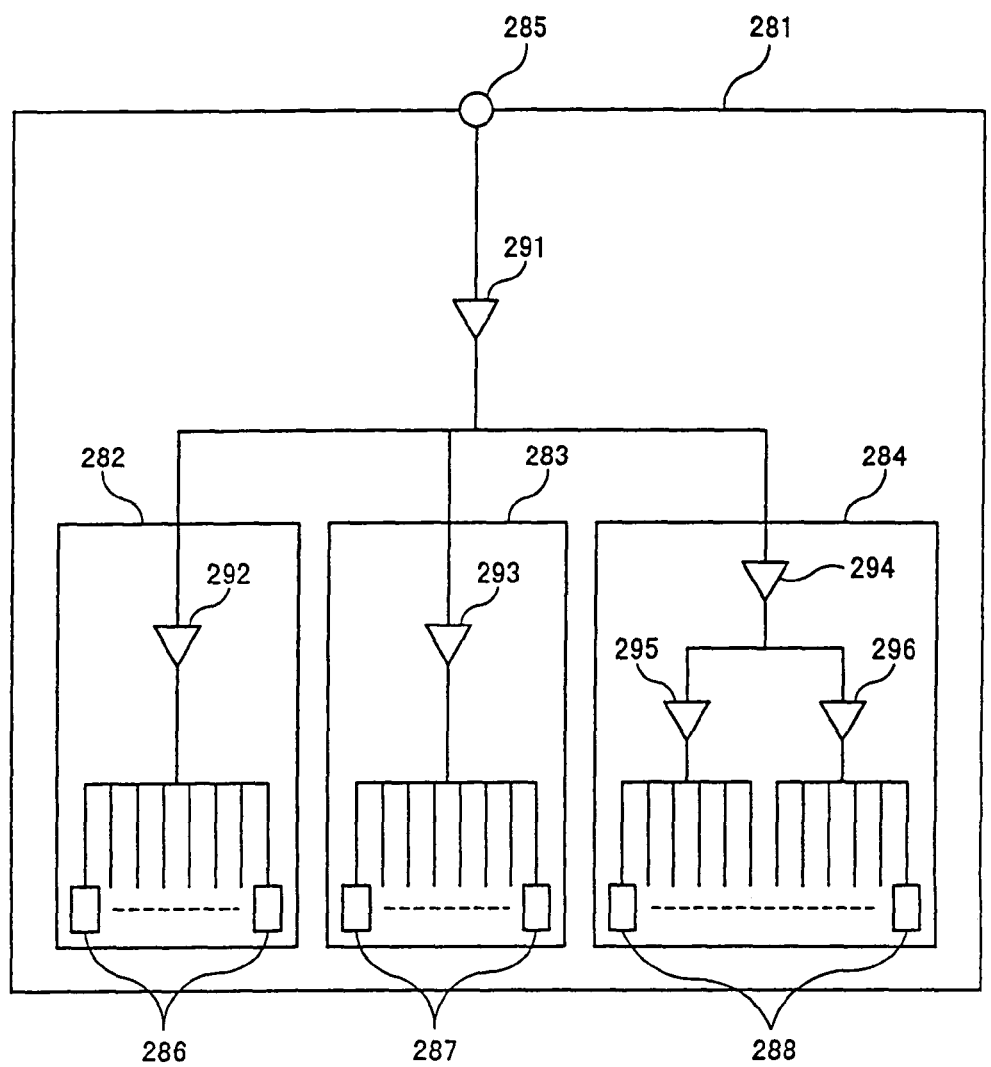
FIG. 52 is a diagram showing an example of clock tree after buffer cells are introduced into modules of the LSI according to the conventional method.
Figure 53:
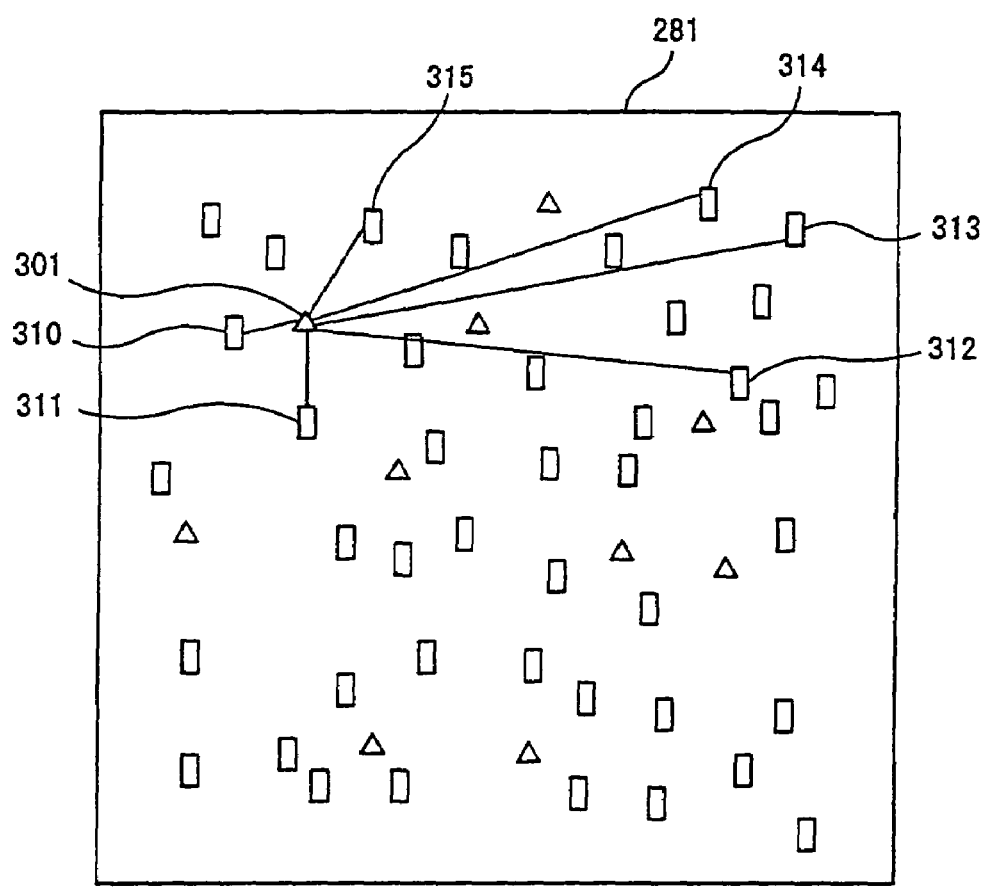
FIG. 53 is a diagram showing an example of a module of an LSI in which buffer cells and flip-flop cells are subjected to an initial placement according to the conventional method.
Figure 56:
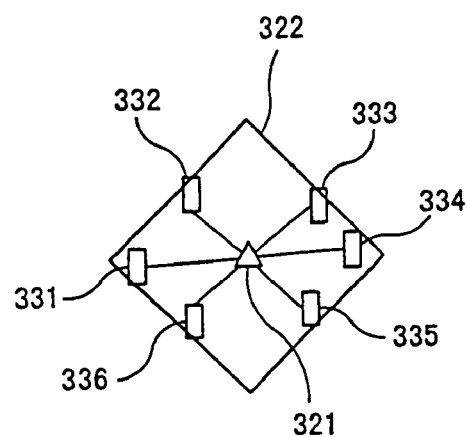
FIGS. 56 and 57 are diagrams each showing an example in which cell placement is retried according to the conventional method.
Figure 57:
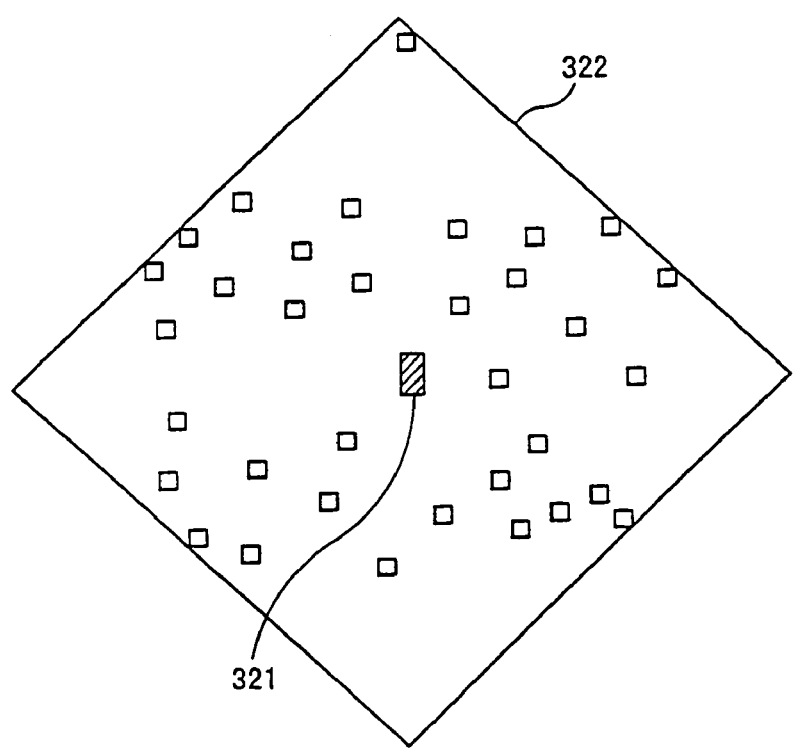

At step S123, buffer cells concerning input and output operation of a clock signal (hereinafter sometimes referred to as clock buffer cell) are subjected to placement process in a bottom-up manner by using a conventional scheme which has been described with reference to step S283 of FIG. 50.

Then, at step S124, a reconstruction processing of the clock tree final stage which will be described with reference to FIGS. 25 to 35, is carried out at step S124.

Then, at step S125, the clock buffer cells are again subjected to the placement in a bottom-up manner, and then at step S126, a placement restriction area (see FIG. 38) for the flip-flop cells is created based on the placement of the buffer cell, and the created placement restriction area is supplied to a placement restriction area information file 12.

At step S127, cluster information (see FIG. 39) concerning a group of flip-flop cells is created and the created cluster information is generated to a first cluster information file 14.

Figure 40:
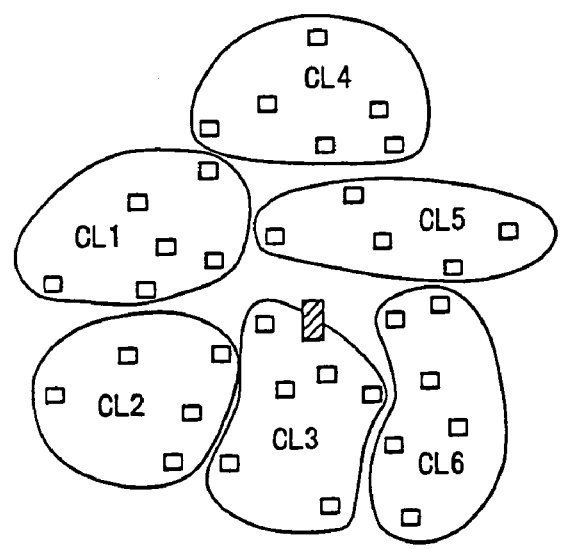
FIG. 40 is a diagram for explaining second cluster information which is created in such a manner that the cluster shown in FIG. 39 is subjected to retry of placement and thereafter step S129 of the flowchart shown in FIG. 21 is effected to increase proximity degree among cells.

At step S128, the previously created flip-flop cell placement restriction information and the cluster information are inputted into the computer so that cells other than the buffer cells are again subjected to placement processing (see FIG. 40).

At step S129, cluster information about the flip-flop cells and each buffer cell is created (see FIG. 41) based on the result of the retried placement at step S128, and the crated cluster information is generated to a second cluster information file 16.

At step S130, the contents of the second cluster information are supplied to the computer, wherein special wiring of the clock net, or wiring within the cluster (see FIG. 43) and route wiring (see FIG. 44) are carried out. According to the processing carried out so far, the placement processing for all cells and wiring for clock paths are completed.

At step S13, wiring is effected on the remaining ordinary net so as to complete layout processing. The finally obtained layout result is supplied to a layout result file 20.

Logic of the layout data base is modified due to the reconstruction of the clock tree final stage net at step S124. Therefore, at step S131, the contents of the second netlist (2) is subjected to a modifying processing in accordance with the contents of the previously created logic change command file 18 so that a third netlist (3) having a logic coincident with the logic on the database 267 is created.

Figure 22:
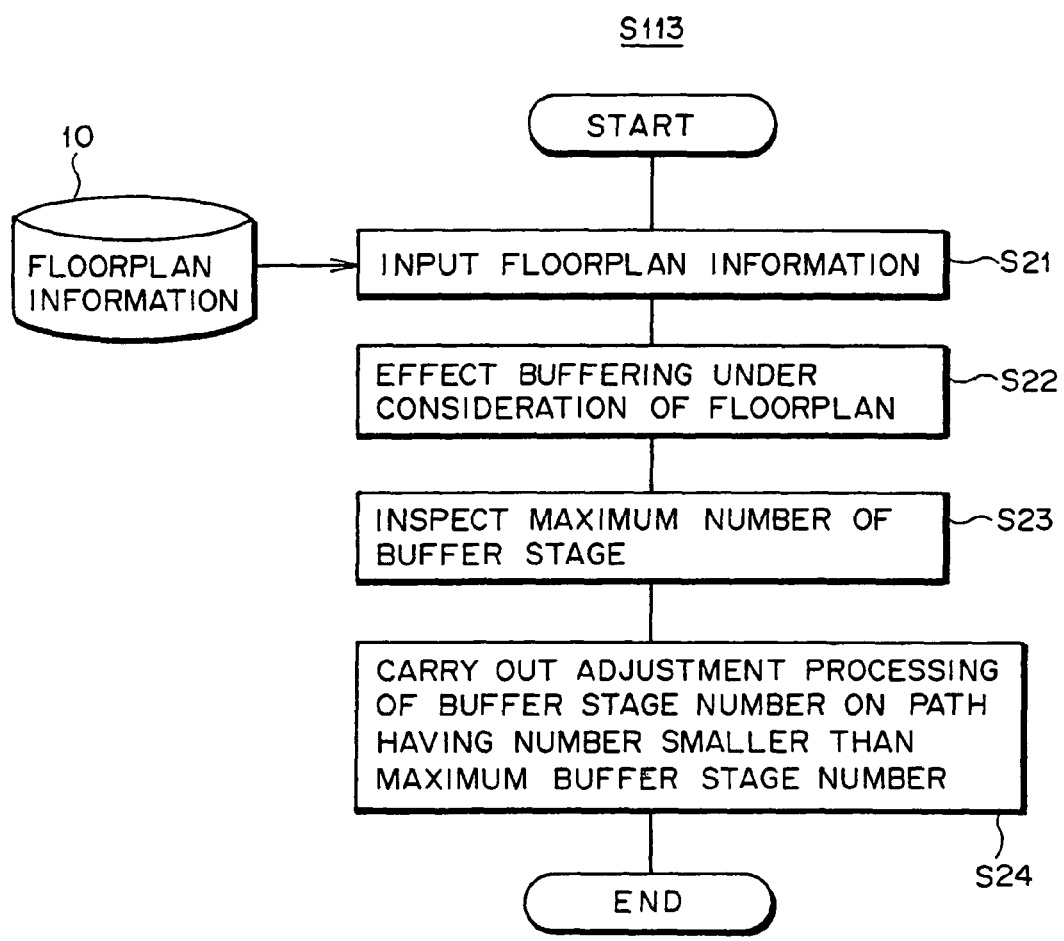
FIG. 22 is a flowchart for explaining in more detail contents of processing effected at step S113 of the flowchart shown in FIG. 21.

FIG. 22 is a flowchart for explaining in detail the processing contents of step S113 in FIG. 21.

In FIG. 22, at step S21, the contents of the floorplan information file 10 is supplied to the computer and at step S22 the first netlist (1) is subjected to the buffering processing (see FIG. 23) with the floorplan taken into consideration.

Then, at step S23, it is examined which branch extending from the clock source to the end of flip-flop contains the largest number of buffer stages among the largest module within the first netlist. At step S24, branches of clock paths other than the branch having the largest number of buffer stages are provided with a proper number of buffer cells so that the branches come to have the number of buffer stages that is coincident with the largest number of buffer stages. Thus, the buffer stage adjusting processing is carried out (see FIG. 24). In this way, all paths from the clock source to the flip-flops placed at each terminal end of the clock tree come to have the same signal propagation delay time, with the result that the clock skew can be suppressed.

Figure 23:
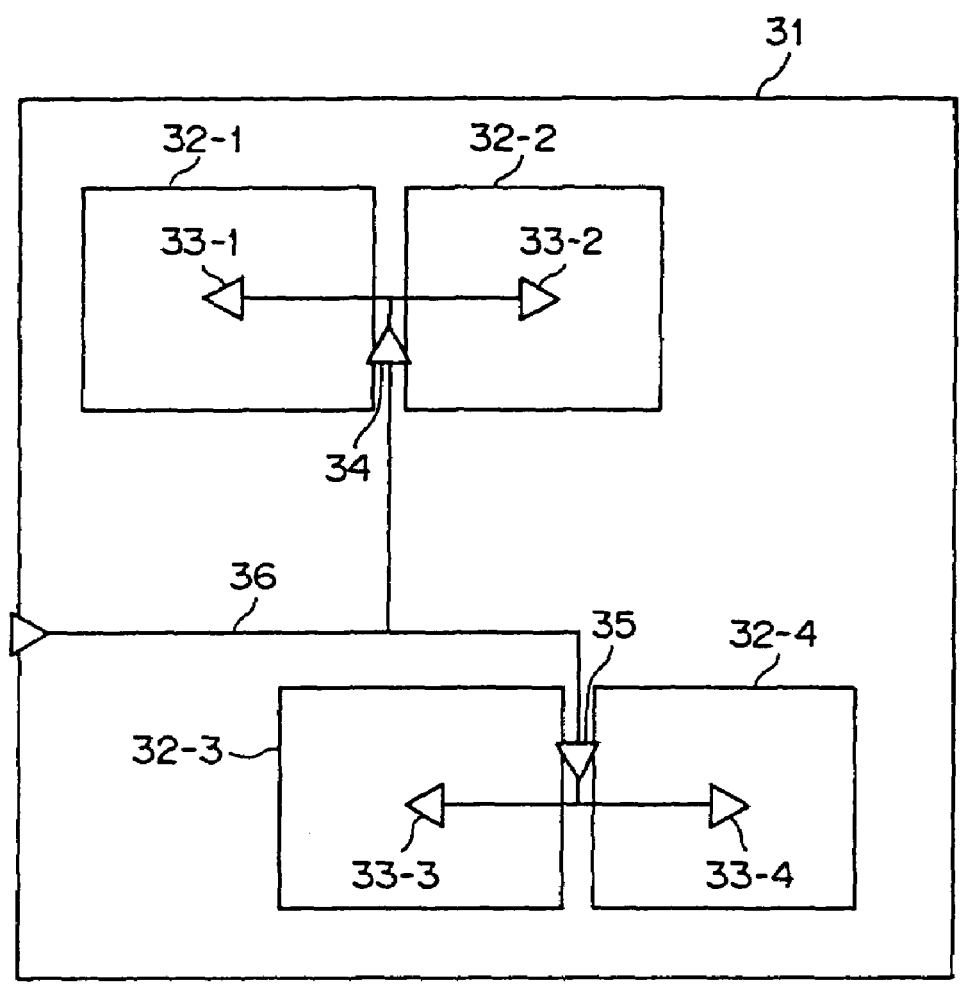
FIG. 23 is a diagram showing a clock tree having undergone a buffering processing with floorplan information taken into consideration.

FIG. 23 is a diagram showing a clock tree after undergoing the buffering operation which is carried out with the floorplan information taken into consideration. In the diagram, reference numeral 31 depicts a semiconductor chip, 32-1 to 32-5 modules driven by a single buffer cell, respectively. Each of the modules contains a plurality of flip-flop cells (in FIG. 23, the cells are not shown). In FIG. 23, although each of the models actually contain plural number of flip-flop cells as well as buffer cells, only the buffer cells 33-1 to 33-4 for driving the flip-flop cells are shown as a representative of respective modules. When the circuit is subjected to the buffering operation of step S22 in FIG. 22, modules placed close to each other are driven by a common clock buffer. In FIG. 23, a buffer cell 34 is placed so that two modules 32-1 and 32-2 placed close to each other can be driven by the buffer cell 34 in common. Similarly, a buffer cell 35 is placed so that two modules 33-3 and 33-4 placed close to each other can be driven by the buffer cell 35 in common. As a result, a net for driving the floorplan block can be shortened as compared with the conventional example shown in FIG. 62.

Figure 24:
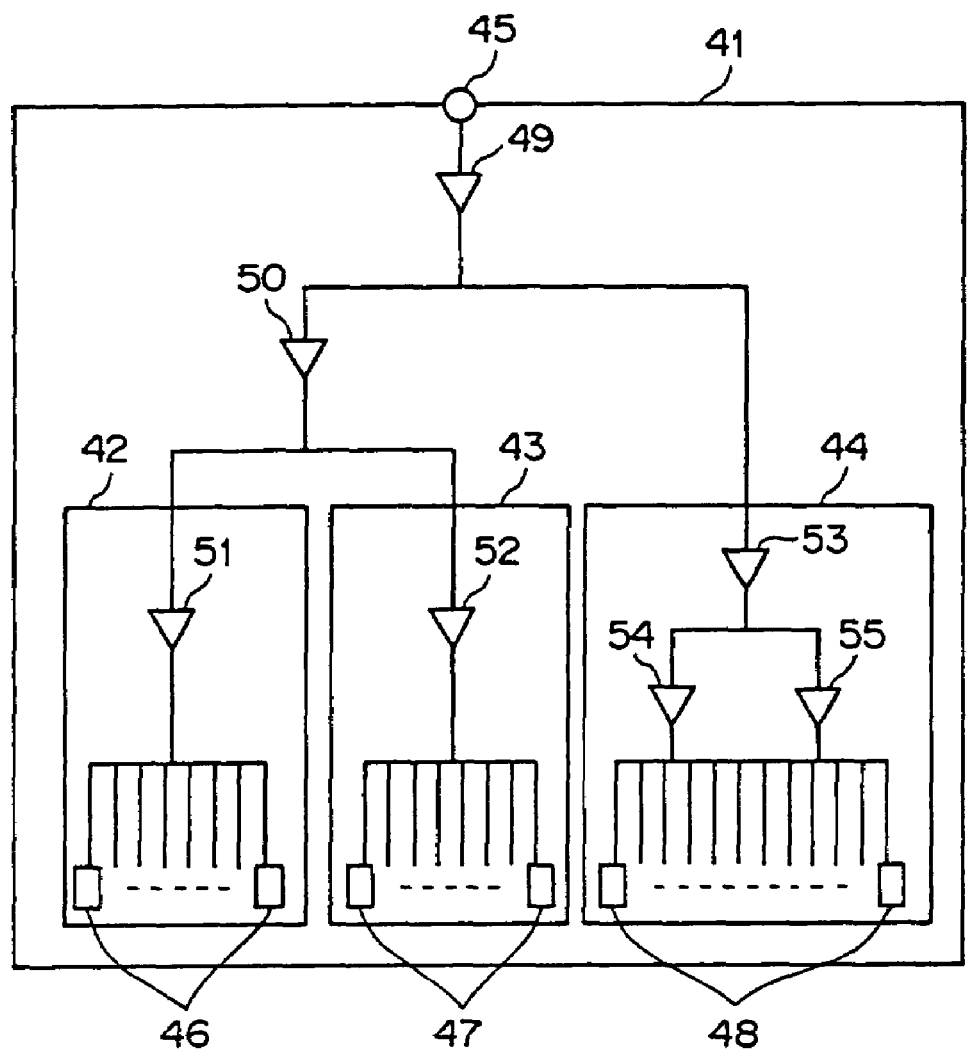
FIG. 24 is a diagram for explaining a result of adjustment in number of buffering stage effected at step S24 of the flowchart shown in FIG. 22.

FIG. 24 is a diagram for explaining the result of adjustment of number of stages of buffers carried out at step S24 of FIG. 22. In FIG. 24, reference numeral 41 depicts a large module, 42 to 44 small modules, 45 a clock source, 46 to 48 flip-flop cells, and 49 to 55 buffer cells. Owing to an operation of step S24, the buffer cell 50 is additionally provided. In this way, the same number of buffer stages are provided between the clock source 45 and the end terminal flip-flop cell 46, between the clock source 45 and the end terminal flip-flop cell 47, and between the clock source 45 and the end terminal flip-flop cell 48, whereby the signal delay times between the clock source 45 and each of the end terminal flip-flop cells become equal to one another.

Figure 25:
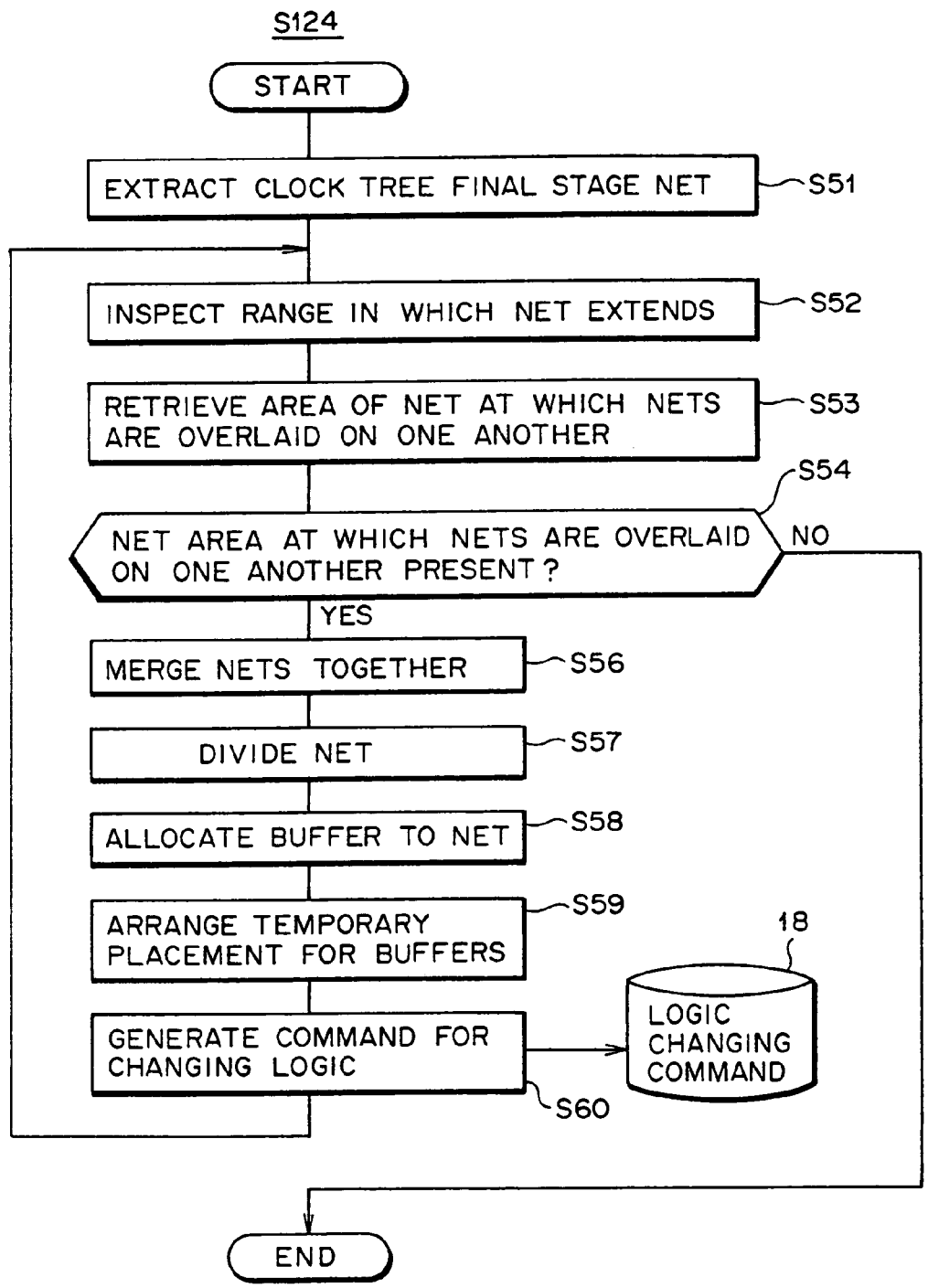
FIG. 25 is a flowchart for explaining in more detail contents of processing effected at step S124 of the flowchart shown in FIG. 21.

FIG. 25 is a flowchart for explaining in detail step S124 in FIG. 21. In FIG. 25, initially at step S51, a clock tree final stage net is extracted from the netlist in which clock buffers are completely subjected to a placement processing in a bottom-up manner at step S123 of FIG. 21. Thereafter, a range in which the net extracted at step S53 extends is inspected. Then at step S53, a net having an area overlaid on another net is retrieved. If a net having an area overlaid on another net is not found (NO route of step S54), then the processing routine of the flowchart is completed and processing proceeds to step S125 of FIG. 21. If a net having an area overlaid on another net is found (YES route of step 54; see FIG. 26), then the nets overlaid on one another are merged (combined) with each other at step S56 (see FIG. 28). Thereafter, at step S57, the net deriving from the merger is divided into nets so that divided nets have no area overlaid on one another (see FIG. 31). At step S58, a buffer cell is allocated to each of the divided nets (see FIG. 32), and at step S59 the allocated buffer cells are temporarily placed at the center of respective nets (see FIG. 34). This placement operation is referred to as temporary placement. Thereafter, at step S60, logic changing information is supplied to a logic changing command file 18 as a logic changing command file. Then, the processing again returns to step S52 in which a range in which the net extends is examined. These processes are repeated until no net having an area overlaid-on another net is found.

Figure 26:
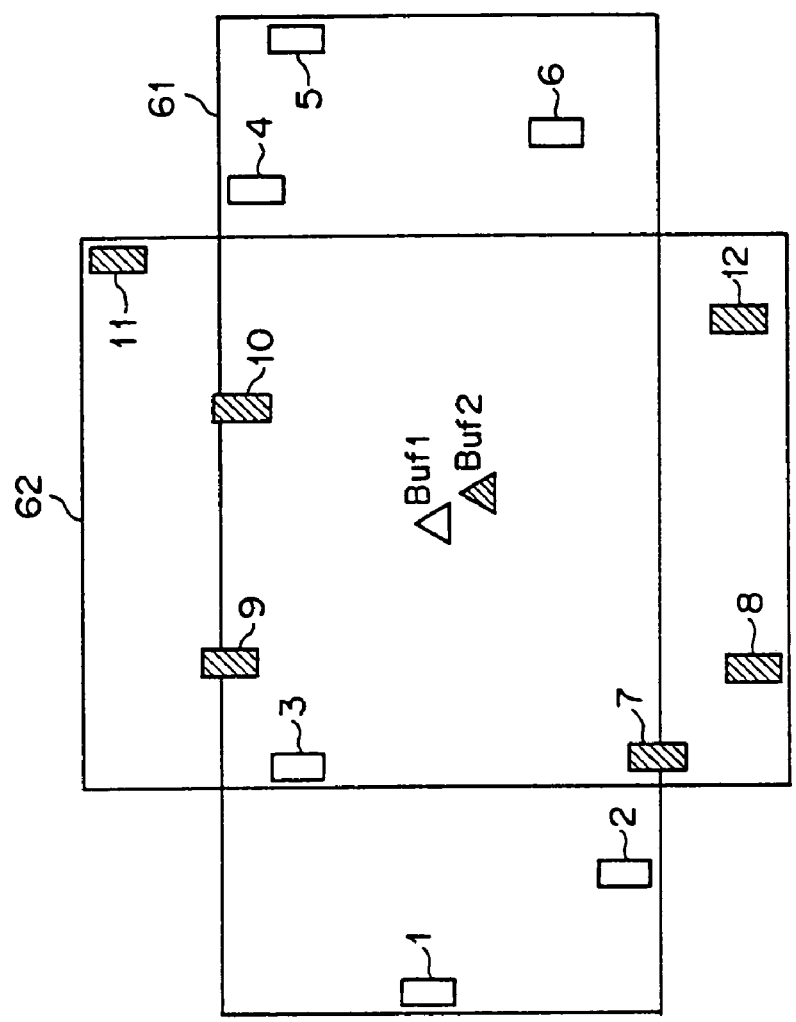
FIG. 26 is a diagram showing net areas of the final stage net when the nets are overlaid on another as a result of determination delivered at step S54 of the flowchart shown in FIG. 25.

FIG. 26 is a diagram showing a range of nets under the final stage when it is determined at step S54 of FIG. 25 that a net has an area overlaid on another net. In FIG. 26, reference numeral 61 depicts a range of net elements which are driven by a buffer cell Buf1. Reference numeral 62 depicts a range of net elements which are driven by a buffer cell Buf2. As shown in the figure, each of the net ranges 61 and 62 has a portion overlaid on the other net. According to the example of the figure, flip-flop cells 1 to 6 are placed in the net range 61 while flip-flop cells 7 to 12 are placed in the net range 62.

Figure 27:
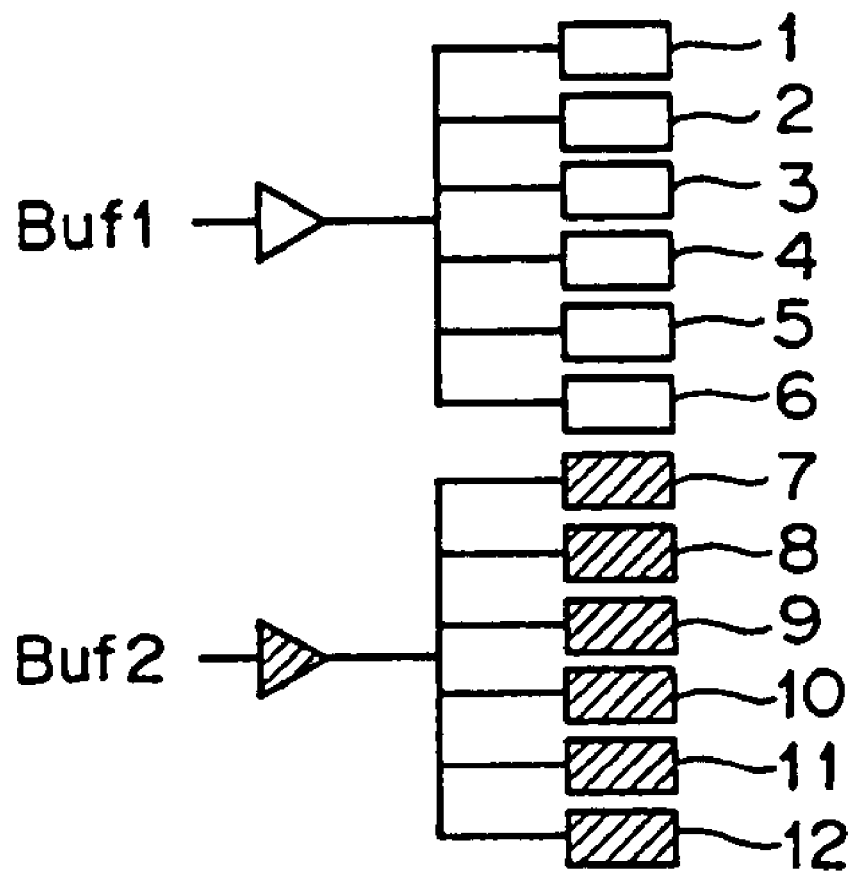
FIG. 27 is a diagram for explaining a logic of clock net in the net area shown in FIG. 26.

FIG. 27 is a diagram for explaining logic of clock net of the net range shown in FIG. 26. As shown in FIG. 27, if the clock tree is not subjected to the reconstruction processing of the clock tree, the flip-flop cells 1 to 6 are placed under driving of the buffet cell Buf1 while the flip-flop cells 7 to 12 are placed under driving of the buffer cell Buf2.

Figure 28:
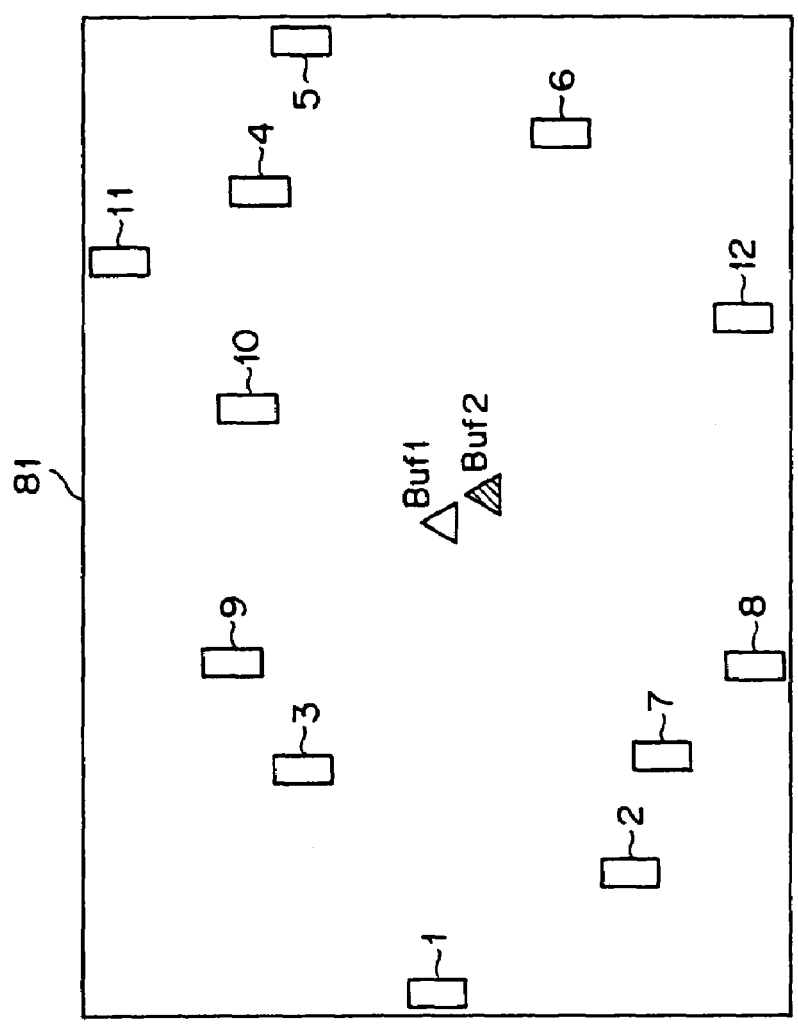
FIG. 28 is a diagram illustrative of a merge of nets at step S56 of the flowchart shown in FIG. 25.

FIG. 28 is a diagram showing a process of merger of a net with another net effected at step S56 of FIG. 25. As shown in FIG. 28, the net ranges 61 and 62 shown in FIG. 26 are merged with each other to produce a single net range 81 in which all of the flip-flop cells 1 to 12 and the buffer cells Buf1 and Buf2 are accommodated therein.

Figure 29:
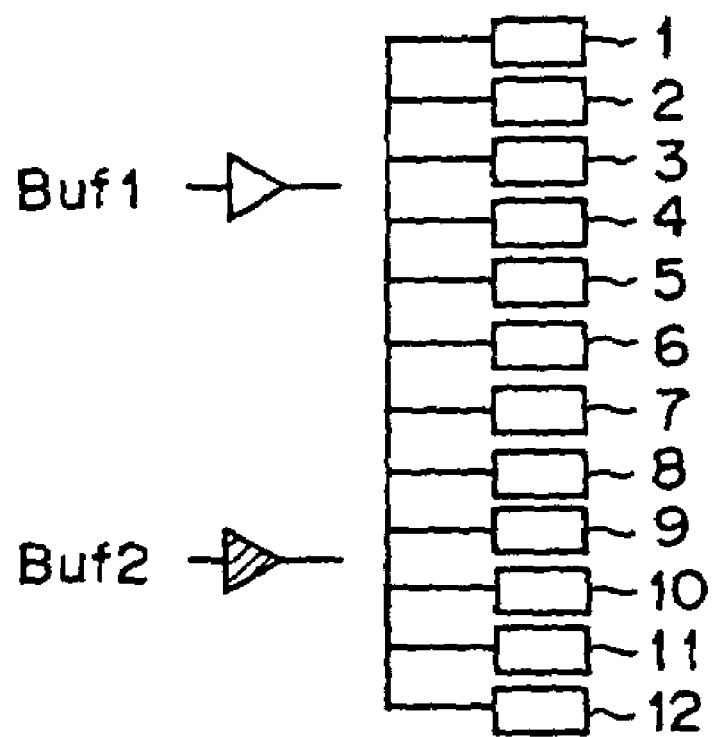
FIG. 29 is a diagram for explaining a logic of clock net in the net area shown in FIG. 28.

FIG. 29 is a diagram for explaining logic of clock net of the net range shown in FIG. 28. As shown in FIG. 29, if the net ranges are merged together, it is uncertain that which of the buffer cells Buf1 or Buf2 is obliged to drive the flip-flop cells 1 to 12.

Figure 30:
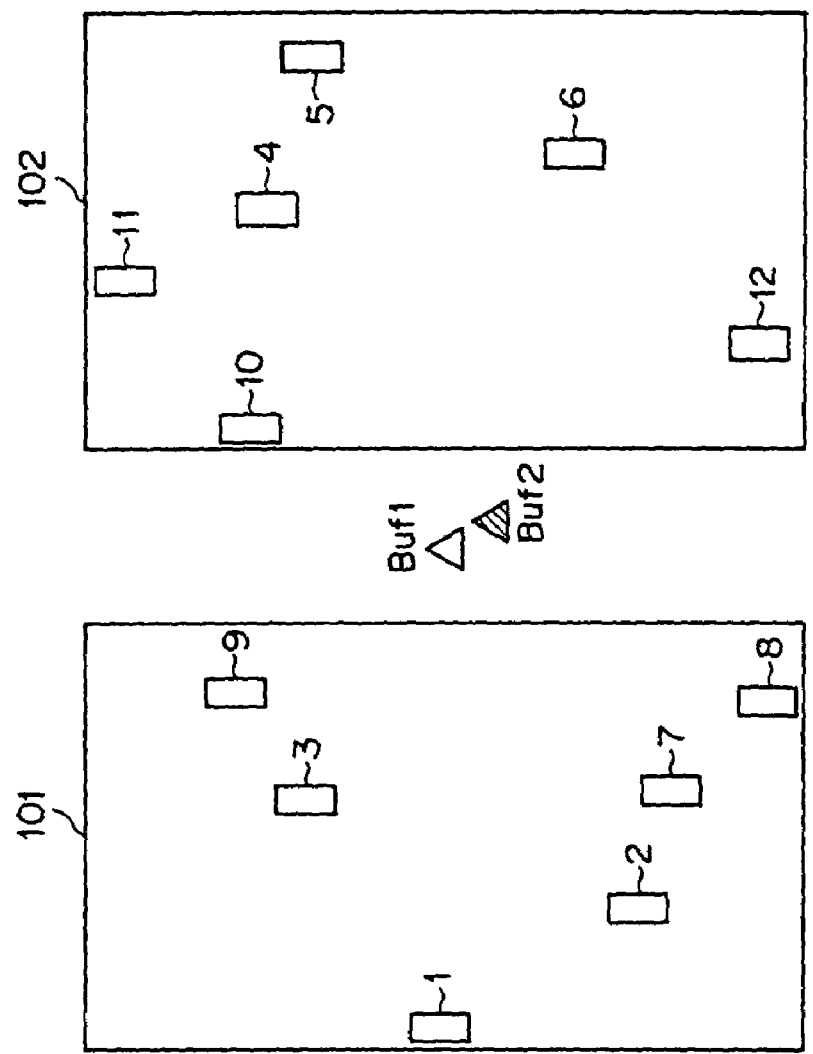
FIGS. 30 and 31 are diagrams for explaining dividing processing of a net effected at step S57 of the flowchart shown in FIG. 25.
Figure 31:
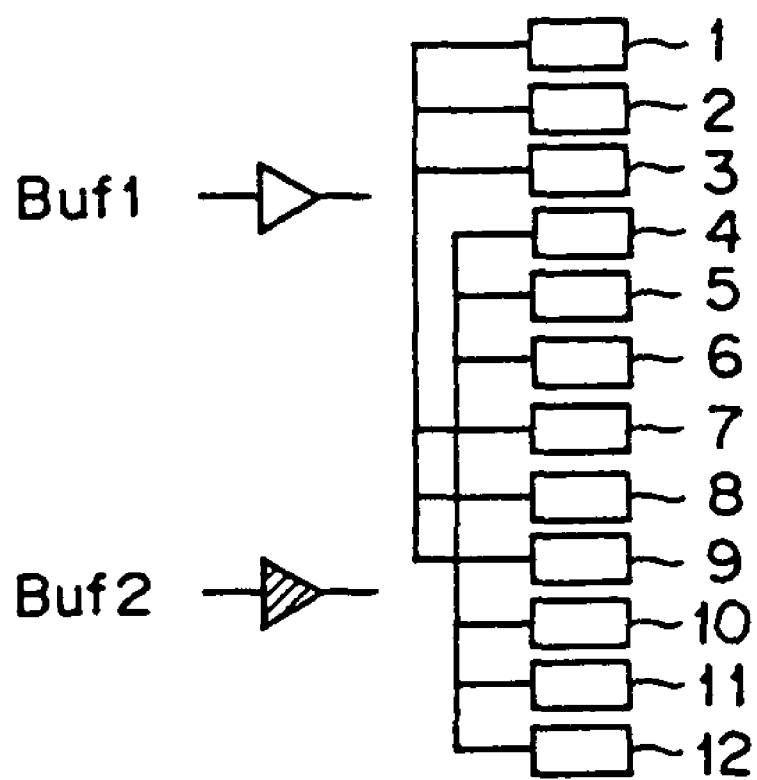

FIGS. 30 and 31 are diagrams for explaining dividing processing of the net of step S57 of FIG. 25. As shown in FIGS. 30 and 31, the merged net 81 shown in FIG. 28 is divided into nets 101 and 102 so that the nets have no net portion overlaid on the other. With the division of the net., the net 101 is made to include flip-flops 1, 2, 3, 7, 8, and 9 while the net is made to include flip-flops 4, 5, 6, 10, 11, and 12. The net 101 is driven by the buffer cell Buf1 while the net 102 is driven by the buffer cell Buf2.

Figure 32:
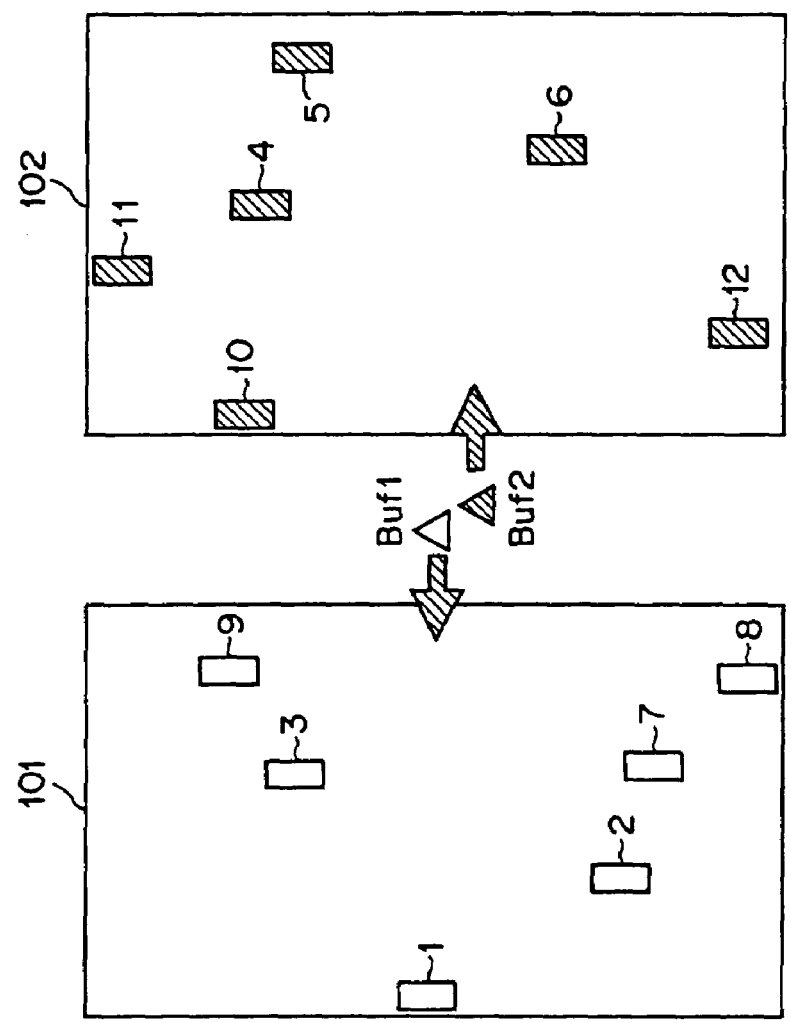
FIG. 32 is a diagram for explaining a buffer allocation effected at step S58 of the flowchart shown in FIG. 25.

FIG. 32 is a diagram for explaining a buffer allocation process of step S58 of FIG. 25. As shown in FIG. 32, the buffer cell Buf1 is assigned to the net 101 to drive the net 101 while the buffer cell Buf2 is assigned to the net 102 to drive the net 102.

Figure 33:
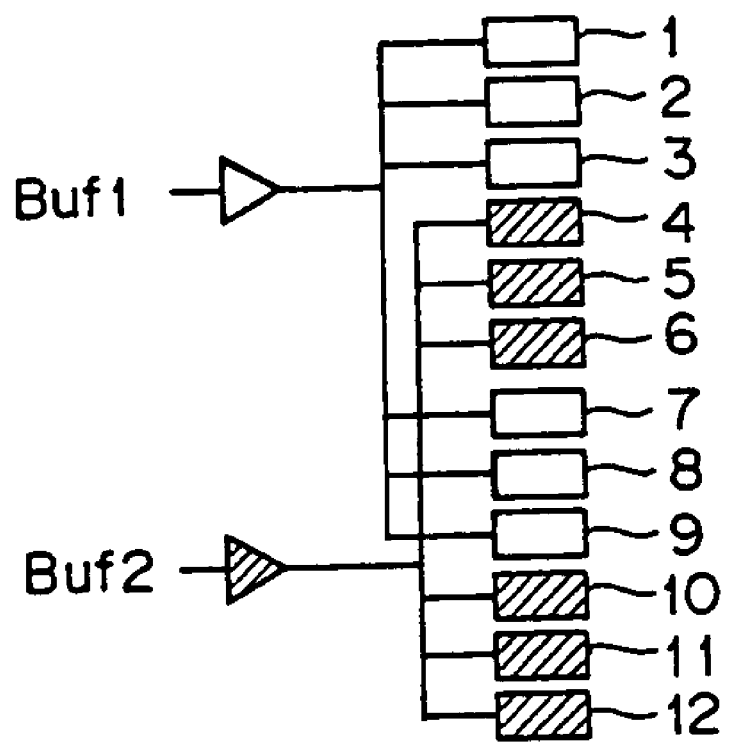
FIG. 33 is a diagram for explaining a clock net logic after the nets are allocated with buffer cells as shown in FIG. 32.

FIG. 33 is a diagram for explaining logic of clock net after the buffer cell allocation shown in FIG. 32 is effected. As shown in FIG. 33, the buffer cell Buf1 is connected to each of the flip-flops 1, 2, 3, 7, 8, and 9 included in the net 101 to drive these flip-flops while the buffer cell Buf2 is connected to each of the flip-flops 4, 5, 6, 10, 11, and 12 included in the net 102 to drive these flip-flops. It is noted that a buffer cell allowable to be changed in the logic of clock tree is a buffer cell of a true-system buffer cell in which "0" output is generated in response to "0" input while "1" output is generated in response to "1" input.

Figure 34:
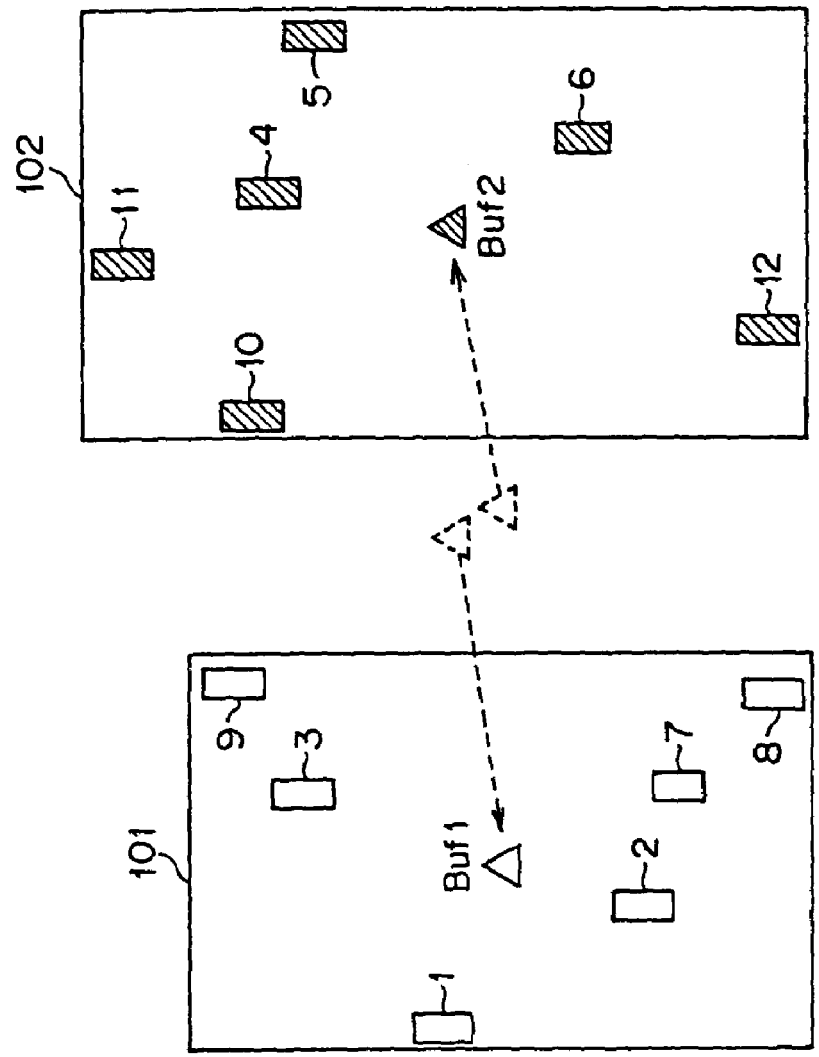
FIG. 34 is a diagram showing a temporary placement of buffer cells effected at step S59 of the flowchart shown in FIG. 25.

FIG. 34 is a diagram showing a temporary placement of buffer cells effected at step S59 of FIG. 25. As shown in FIG. 34, the buffer cell Buf1 is placed at the center of the net 101 while the buffer cell Buf2 is placed at the center of the net 102.

Figure 35:
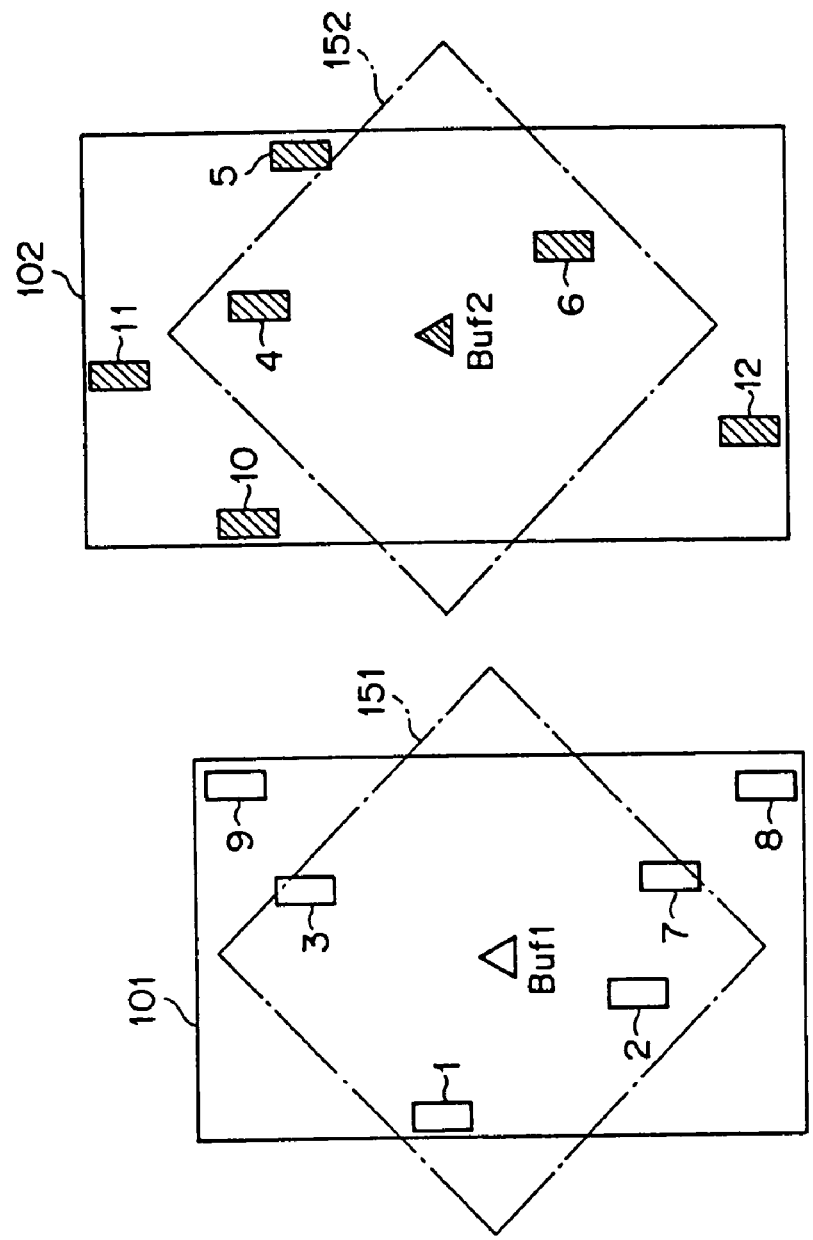
FIG. 35 is a diagram for explaining how a placement restriction area is defined at step S126 of the flowchart shown in FIG. 21.

FIG. 35 is a diagram for explaining a process of creating a placement restriction area effected at step S126 of FIG. 21. As shown in FIG. 35, a placement restriction area 151 of a lozenge shape is created so that the placement restriction area 151 has the buffer cell Buf1 placed at the center of the net 101 shown in FIG. 34 and the placement restriction area 151 includes the flip-flop cells within the net 101 as many as possible. Similarly, a placement restriction area 152 of a lozenge shape is created so that the placement restriction area 152 has the buffer cell Buf2 placed at the center of the net 102 shown in FIG. 34 and the placement restriction area 152 includes the flip-flop cells within the net 102 as many as possible. The size of the placement restriction area may be as small as a range having a distance from the center thereof to the edge thereof which is determined by a route length regulated in accordance with a request of an LSI which is an object of the designing. Information of placement restriction area created as described above is stored in the placement restriction area information file 102 (see FIG. 21).

Figure 36:
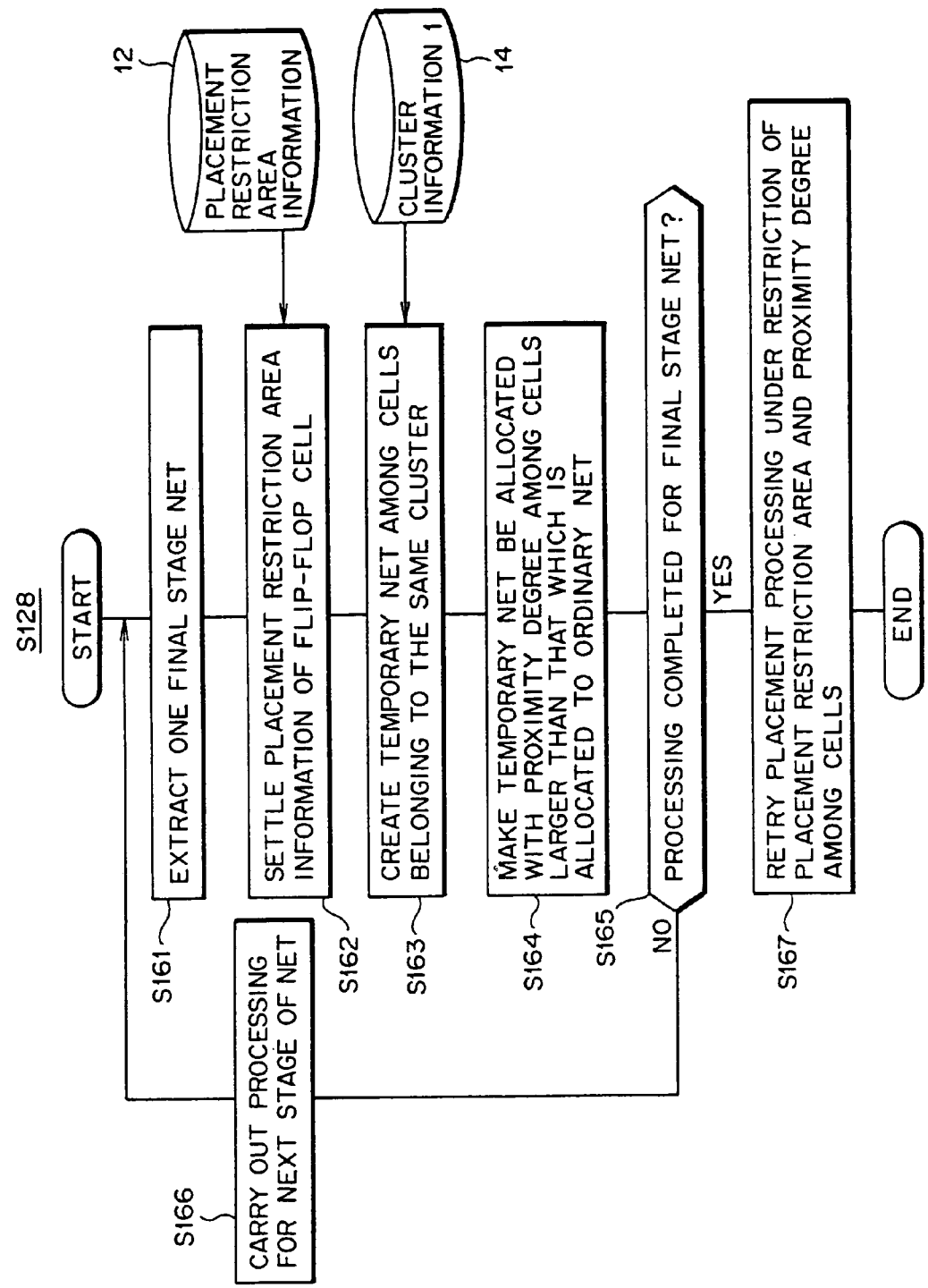
FIG. 36 is a flowchart for explaining in detail a retry of placement processing effected at step S128 of the flowchart shown in FIG. 21.

FIG. 36 is a flowchart for explaining in detail the retry of placement processing effected at step S128 of FIG. 21. As shown in FIG. 36, initially, one clock tree final stage net is extracted at step S161.

Thereafter, at step S162, the contents of the placement restriction area information file 12 (see FIG. 21) is read and a placement restriction area (see lozenge area shown in FIG. 37) is settled for flip-flop cells.

Figure 38:
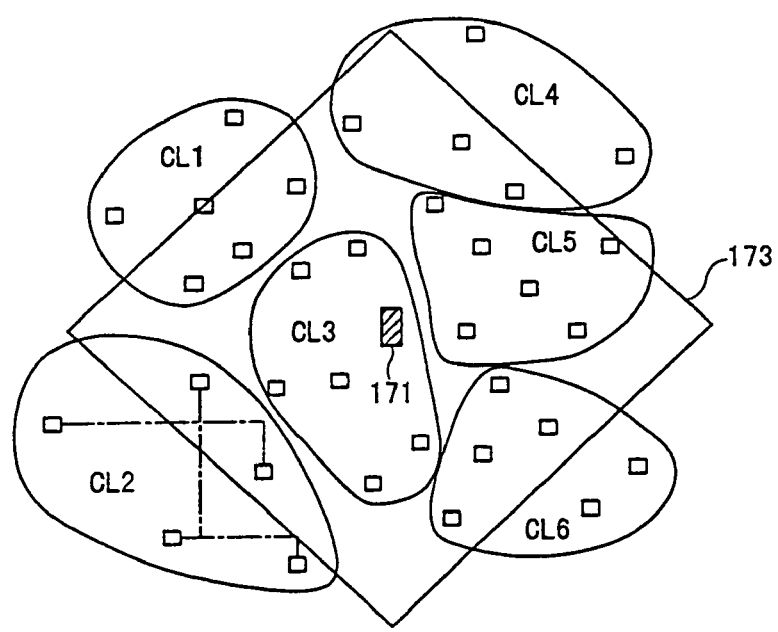
FIG. 38 is a diagram showing a temporary net created at step S163 of the flowchart shown in FIG. 36.

Thereafter, the first cluster information file 14 is read at step S163, whereby a temporary net is created among the flip-flop cells which are bound as a group in a form of cluster (see. FIG. 38).

Then, at step S164, a temporary placement with a proximity degree among cells larger than the proximity degree among cells within an ordinary net is settled for the created temporary net information. That is, the temporary net is settled so that the net is enclosed within the placement restriction area.

Processing of steps S161 to S164 is effected on all clock tree final stage nets (i.e., processing returns from NO route of step S165 to step S161 through step S166). If all the final stage nets undergo the above processing (YES route of step S165), then placement processing for the flip-flop cells is retried at step S167 under the conditions of the placement restriction area and the cell proximity degree, whereby the retry of placement processing is completed.

Figure 37:
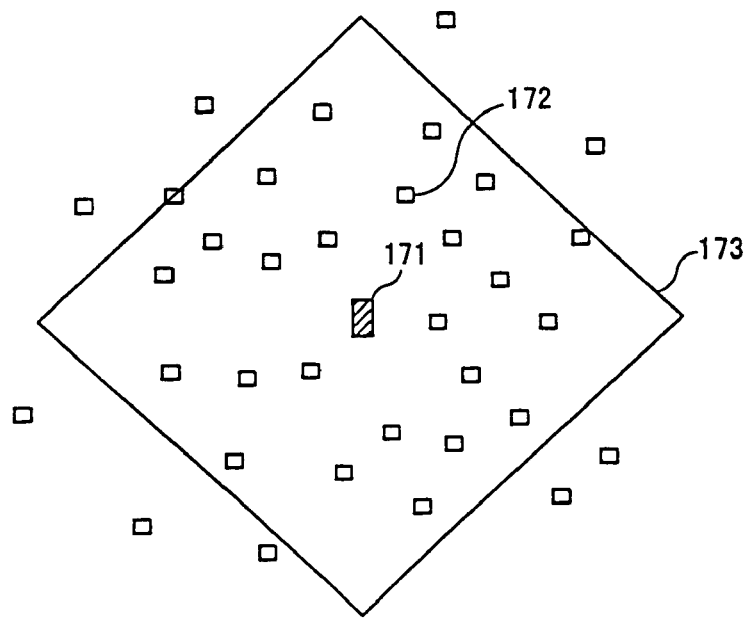
FIG. 37 is a diagram for explaining placement restriction area information of flip-flop cells settled at step S162 of the flowchart shown in FIG. 36.

FIG. 37 is a diagram for explaining the placement restriction area information for the flip-flop cells settled at step S162 of FIG. 36. In FIG. 37, reference numeral 171 depicts a buffer cell, 172 a number of flip-flop cells driven by the buffer cell 171, and 173 a placement restriction area of the flip-flop cells. The placement restriction area is the same as that shown in FIG. 35.

FIG. 38 is a diagram showing a temporary net created at step S163 of FIG. 36. As shown in FIG. 38, the flip-flop cells shown in FIG. 37 are divided into a plurality of groups, or clusters CL1 to CL6 in accordance with cluster information, and cells within each group are temporary connected to one another to create a temporary net.

Figure 39:
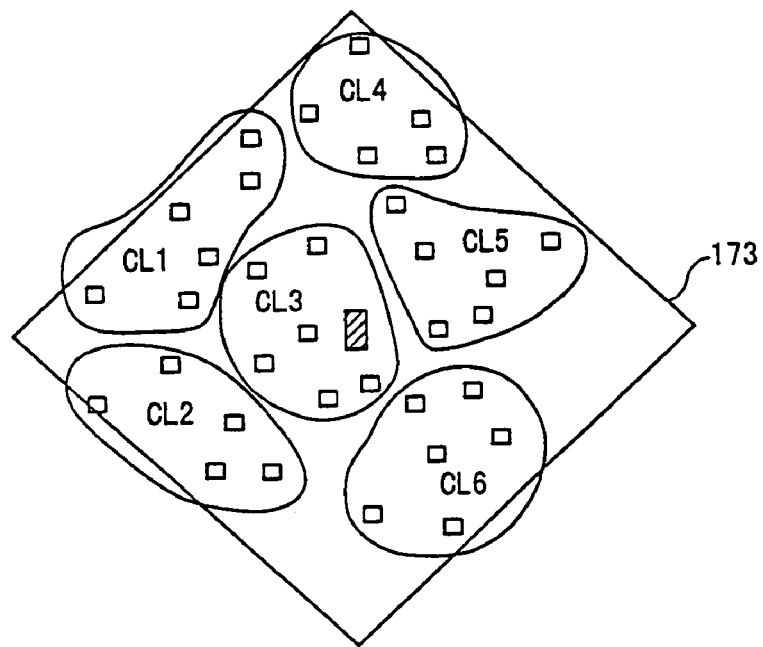
FIG. 39 is a diagram for explaining a placement processing retry of the temporary net effected at step S167 of the flowchart shown in FIG. 36.

FIG. 39 is a diagram for explaining a retry of placement processing of the temporary net effected at step S167 of FIG. 36. As shown in FIG. 39, the clusters CL1 to CL6 are enclosed within the placement restriction area 173.

FIG. 40 is a diagram for explaining a process of creating the second cluster information effected at step S129 of FIG. 21 in such a manner that the proximity degree among cells are further increased after the placement of cluster shown in FIG. 39 is retried. As shown in FIG. 40, the second cluster information is obtained such that the clusters CL1 to CL6 are again arranged to have a shorter wiring length among the flip-flop cells than a wiring length among the flip-flop cells within the clusters CL1 to CL6 which are subjected to the retry of placement as shown in FIG. 39. The second cluster information is stored in the second cluster information file 16.

Figure 41:
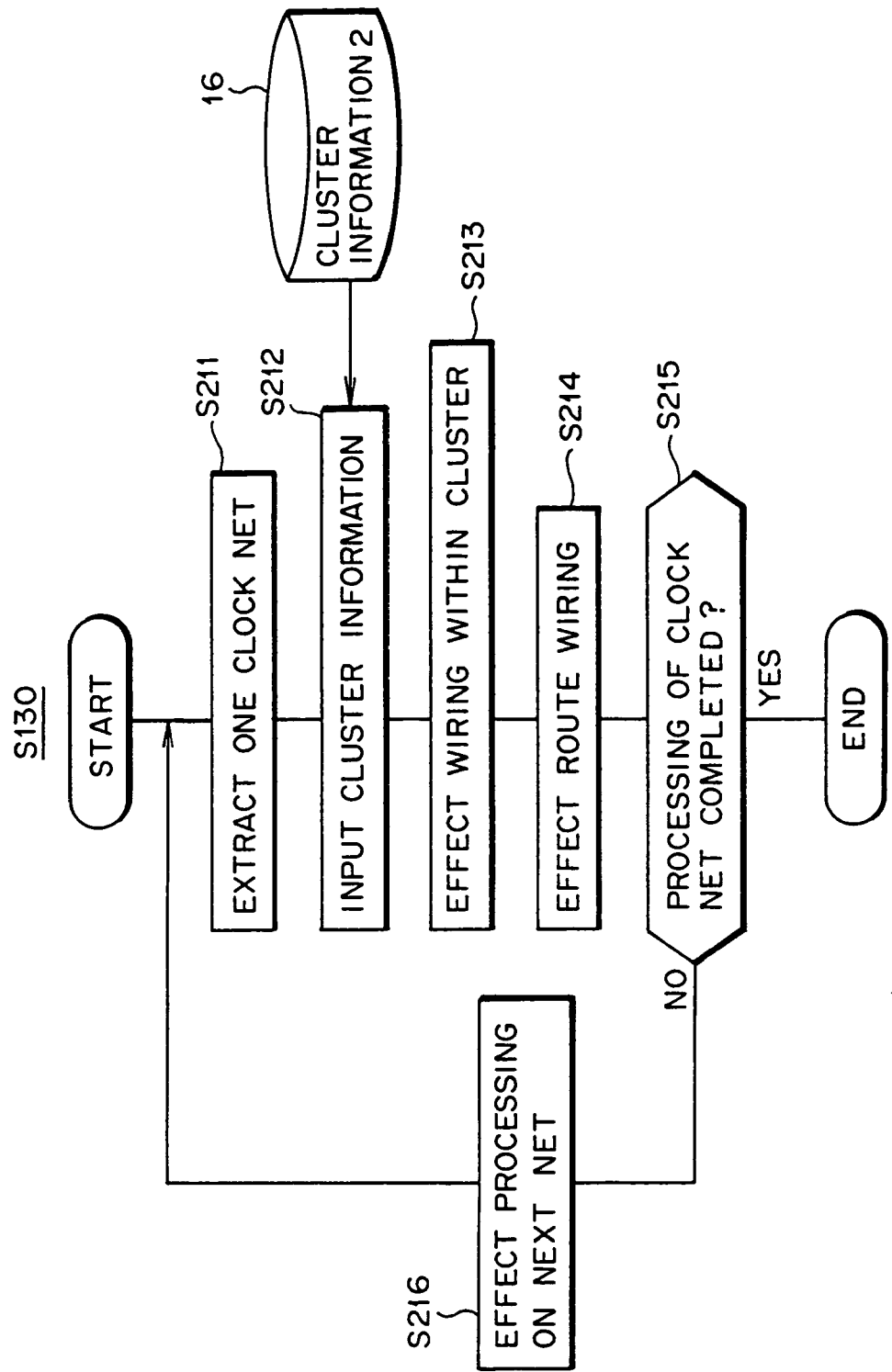
FIG. 41 is a flowchart for explaining in detail special wiring processing of the clock net effected at step S130 of the flowchart shown in FIG. 21.

FIG. 41 is a flowchart for explaining in detail the special wiring processing of clock net effected at step S130 of FIG.

21. In FIG. 41, one clock net is extracted at step S211, the contents of the second cluster information file 16 are read at step S212, and wiring within the cluster is effected based on the supplied cluster information at step S213. At step S214, route wiring is effected from the buffer cell to each cluster signal line. At step S215, it is determined whether or not the processing is completed over the all clock nets. If it is determined that the processing is not completed over the all clock nets, then the next clock net is identified at step S216 and processing of step S211 to S214 is repeated. If it is determined that the processing is completed over the all clock nets, then the process of special wiring is finished.

Figure 42:
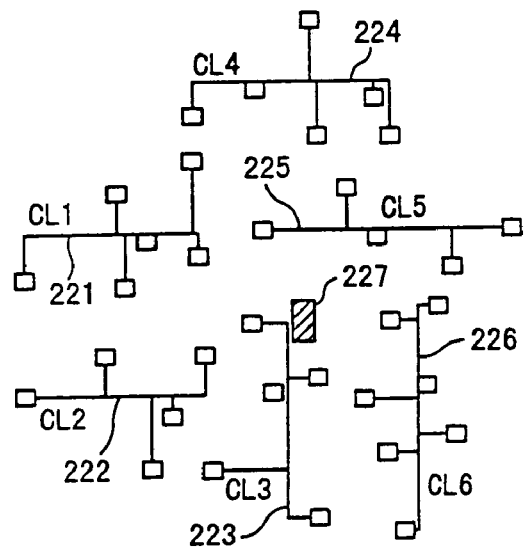
FIG. 42 is a diagram for explaining wiring processing within a cluster effected at step S213 of the flowchart shown in FIG. 41.
Figure 58:
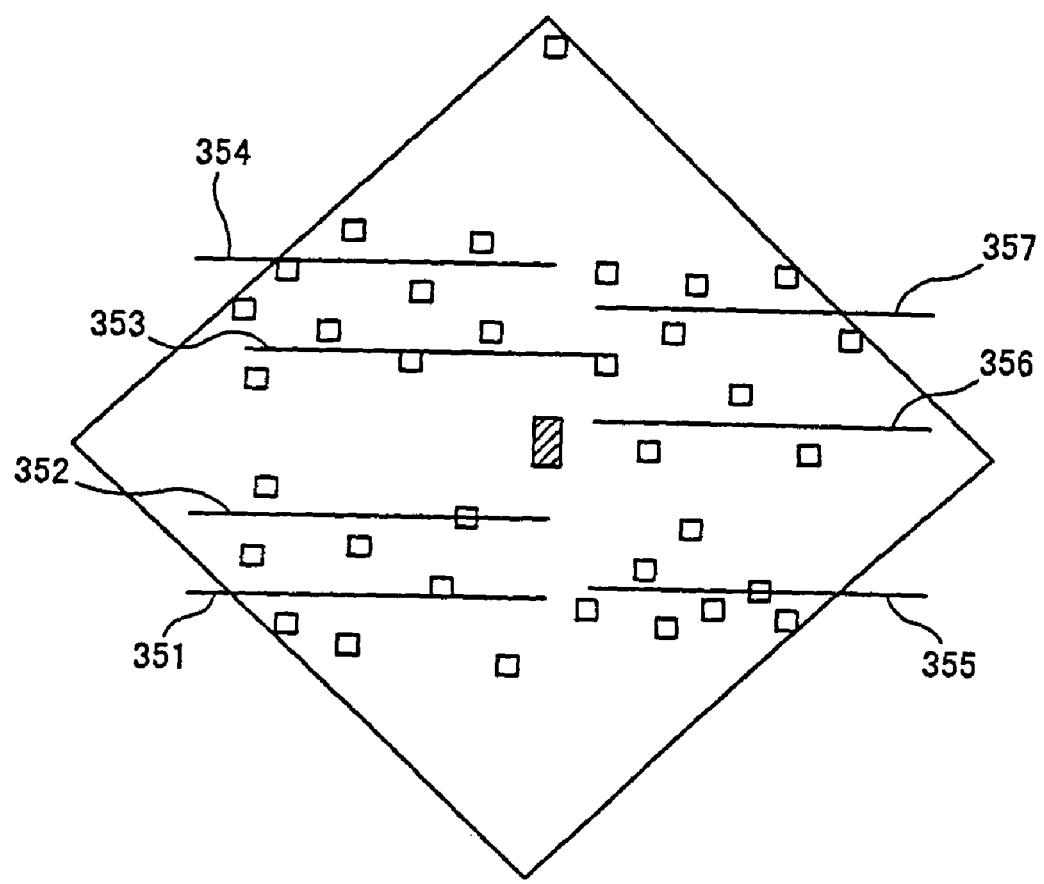
FIG. 58 is a diagram showing an example of settlement of cluster bar information according to the conventional method.
Figure 59:
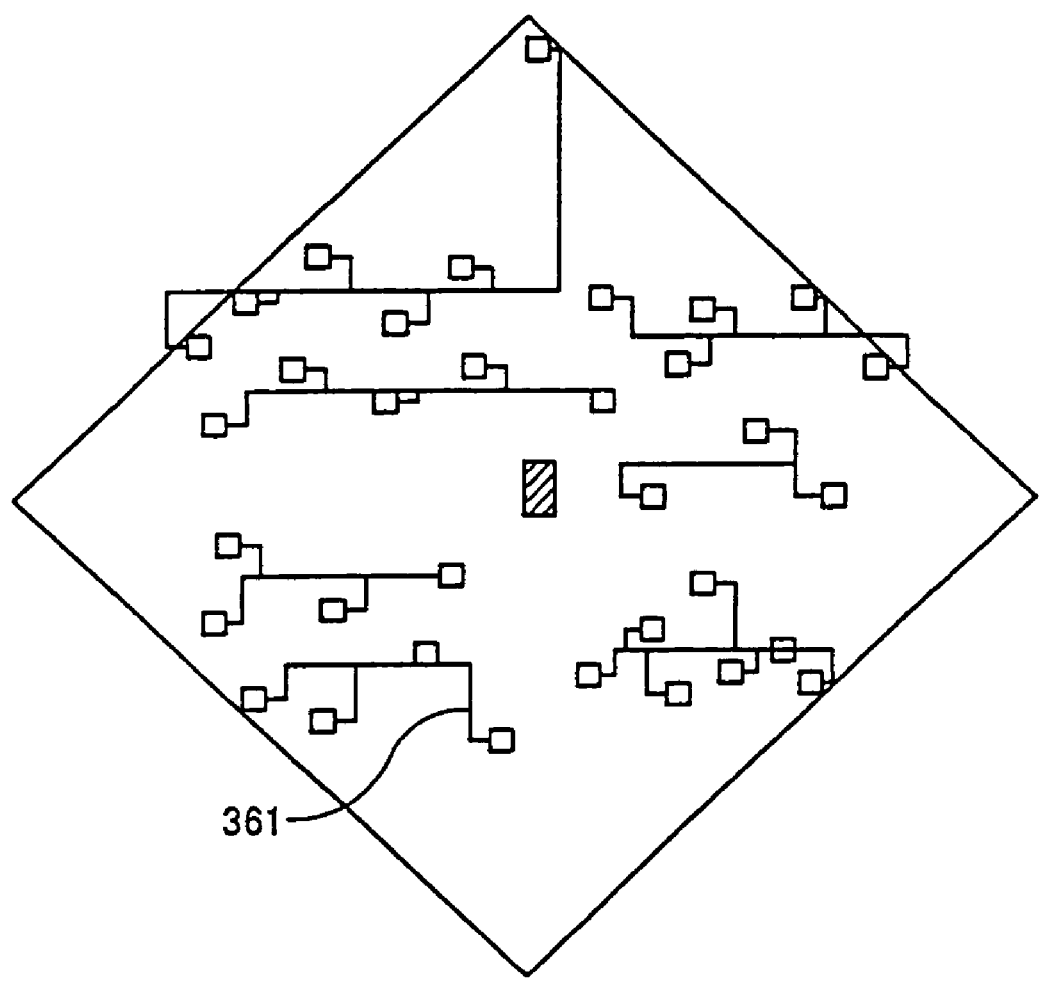
FIG. 59 is a diagram showing an example of branch wiring connecting each flip-flop cell to the cluster bar according to the conventional method.
Figure 60:
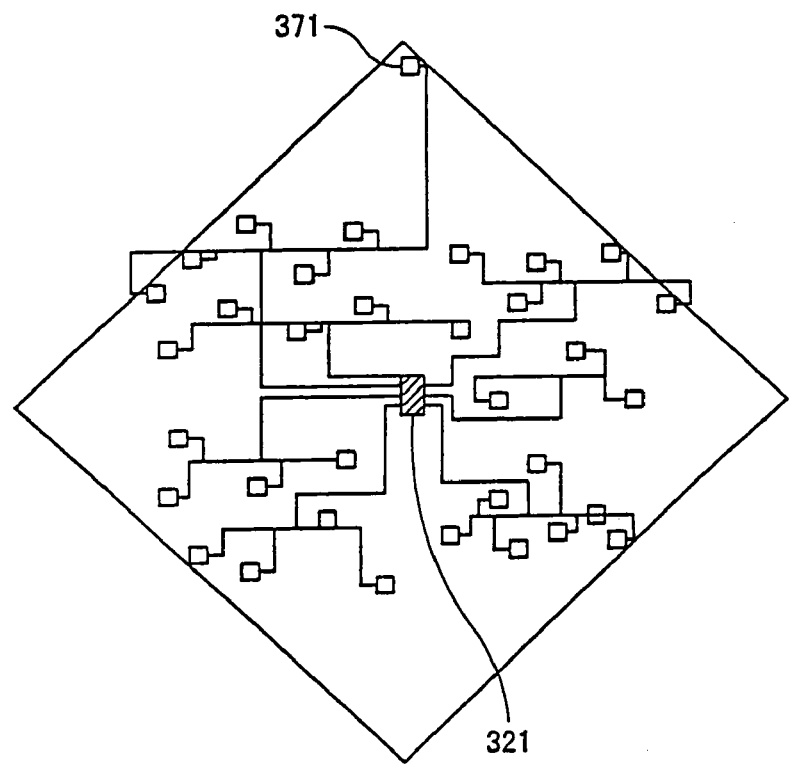
FIG. 60 is a diagram showing an example of route wiring extending from a driving buffer cell to the cluster bar according to the conventional method.

FIG. 42 is a diagram for explaining the wiring processing within the cluster effected at step S213 of FIG. 41. As shown in FIG. 42, the clusters CL1 to CL6 are provided with signal lines 221 to 226, respectively, within each cluster in accordance with the second cluster information shown in FIG. 40 without introducing conventional cluster bars extending in the lateral direction which are described with reference to FIG. 58. In this stage of processing, the buffer cell 227 is subjected to wiring.

Figure 43:
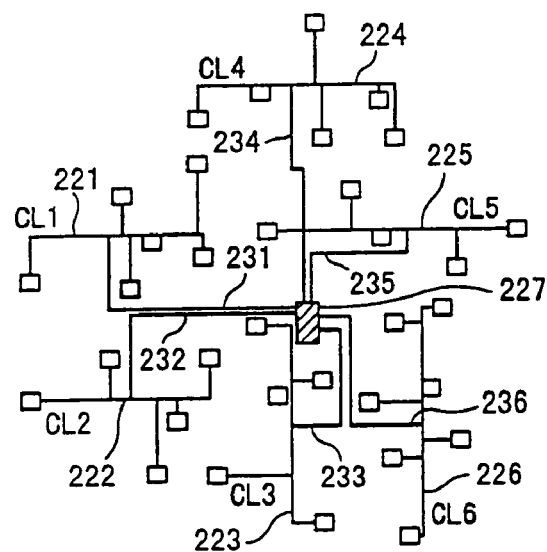
FIG. 43 is a diagram illustrative of a manner of wiring route lines effected at step S214 of the flowchart shown in FIG. 41.

FIG. 43 is a diagram for explaining route wiring processing effected at step S214 of FIG. 41. As shown in FIG. 43, the cluster signal lines 221 to 226 shown in FIG. 42 and the buffer cell 227 are connected to each other through route signal lines 231 to 236, respectively.

While in the above description the manner of connection is applied to the connection between the flip-flop cells and the buffer cell, the manner of connection can also be similarly applied to the connection between buffer cells.

Figure 44:
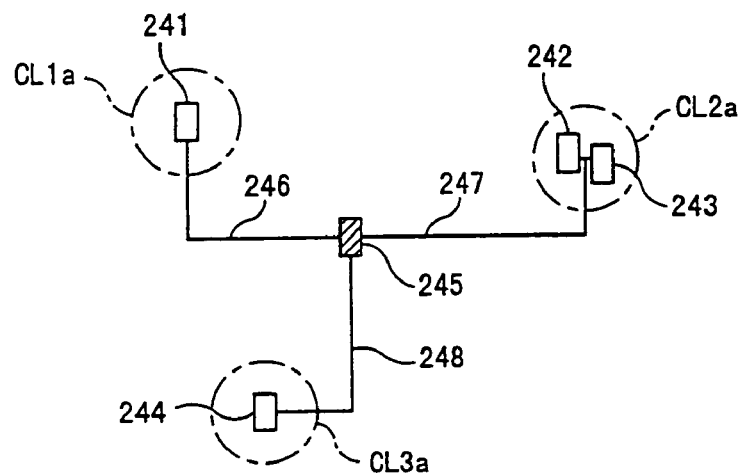
FIG. 44 is a diagram showing an example in which the cluster wiring in buffer nets and the route wiring connecting the clusters to one another are accomplished.
Figure 61:
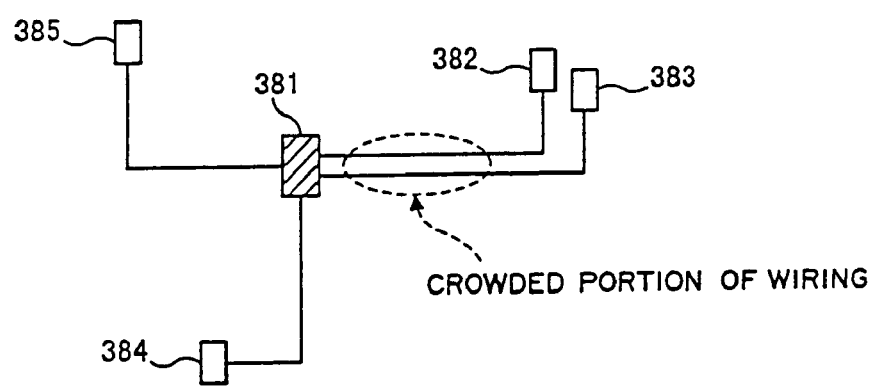
FIG. 61 is a diagram for explaining a special wiring extending between buffer nets according to the conventional method.
Figure 63:
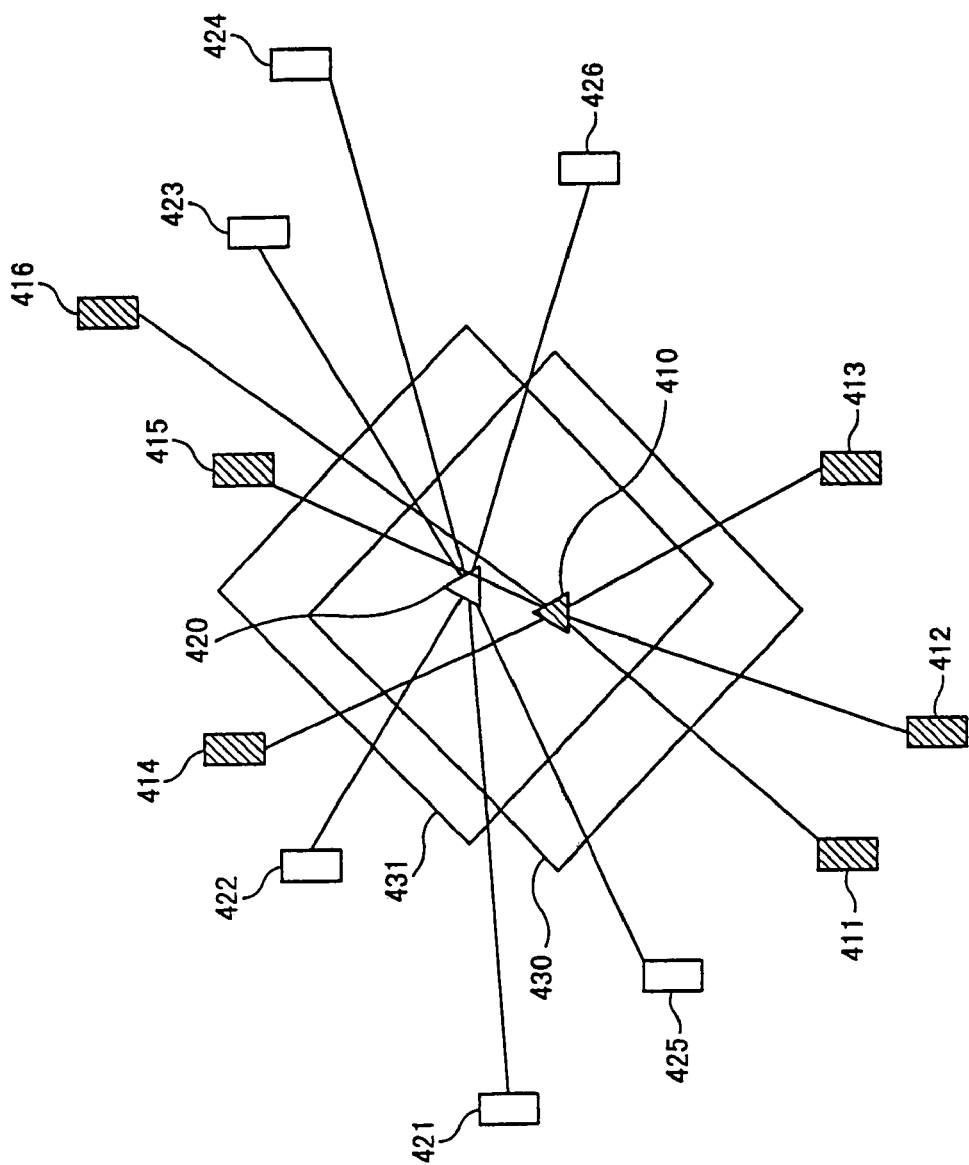
FIG. 63 is a diagram showing an example a placement in which placement restriction areas overlap with each other.
Figure 64:
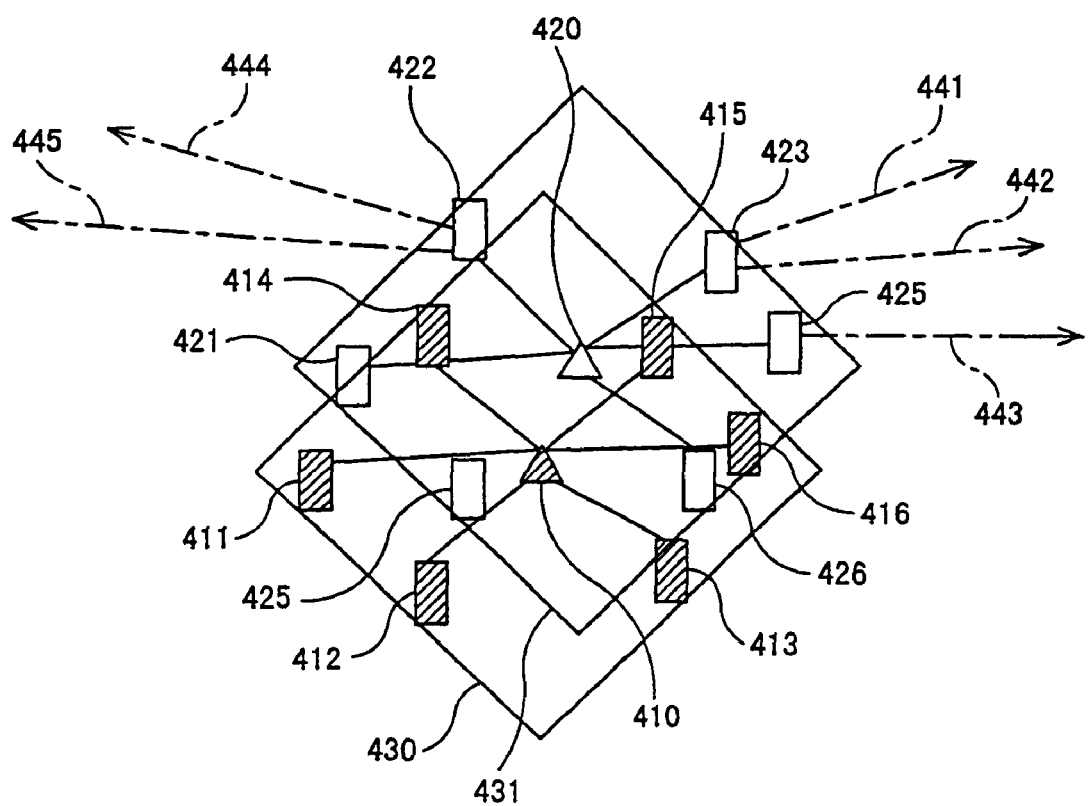
FIG. 64 is a diagram for explaining how wiring congestion is taken place in the conventional method.

FIG. 44 is a diagram showing a result of cluster wiring and route wiring effected among buffers in the net. In FIG. 44, reference numerals CL1a, CL2a, and CL3a depict clusters containing a plurality of buffer cells, respectively. A buffer cell 241 within the cluster CL1a, a buffer cell 242 within the cluster CL2a, and a buffer cell 243 within the cluster CL3a are driven by a buffer cell 245. The buffer cell 245 is connected to each of the clusters CL1a, CL2a, and CL3a through a single route signal line 246, 247, and 248. As a result, even if any of the clusters contains a plurality of buffer cells to be driven by the buffer cell 245, it becomes possible to avoid a problem of crowded wiring which is sometimes caused due to a number of signal lines in the conventional example described with reference to FIG. 61.

The wiring processing of steps S211 to S214 is effected on all clock nets to complete the clock net wiring processing. If all cells are subjected to placement processing and all clock trees are subjected to the wiring processing by the processing up to step S130 of FIG. 21, then ordinary net wiring other than the clock nets is effected as a final processing. Thus, the process of layout determination is completed.

Figure 45:
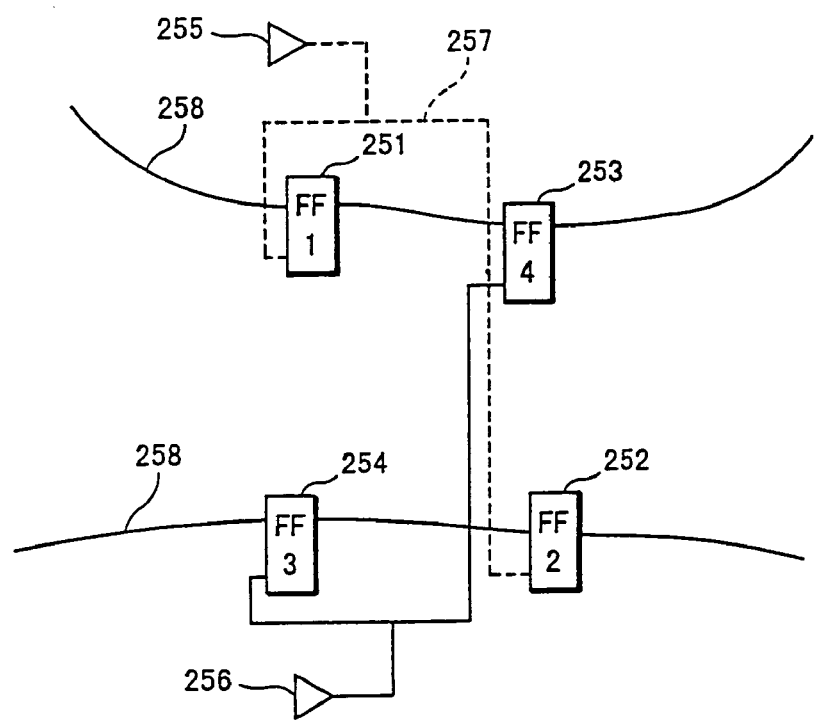
FIG. 45 is a diagram for explaining a case in which flip-flop cells are subjected to an initial placement while clock nets are not taken into consideration at step S122 of the flowchart shown in FIG. 21.
Figure 65:
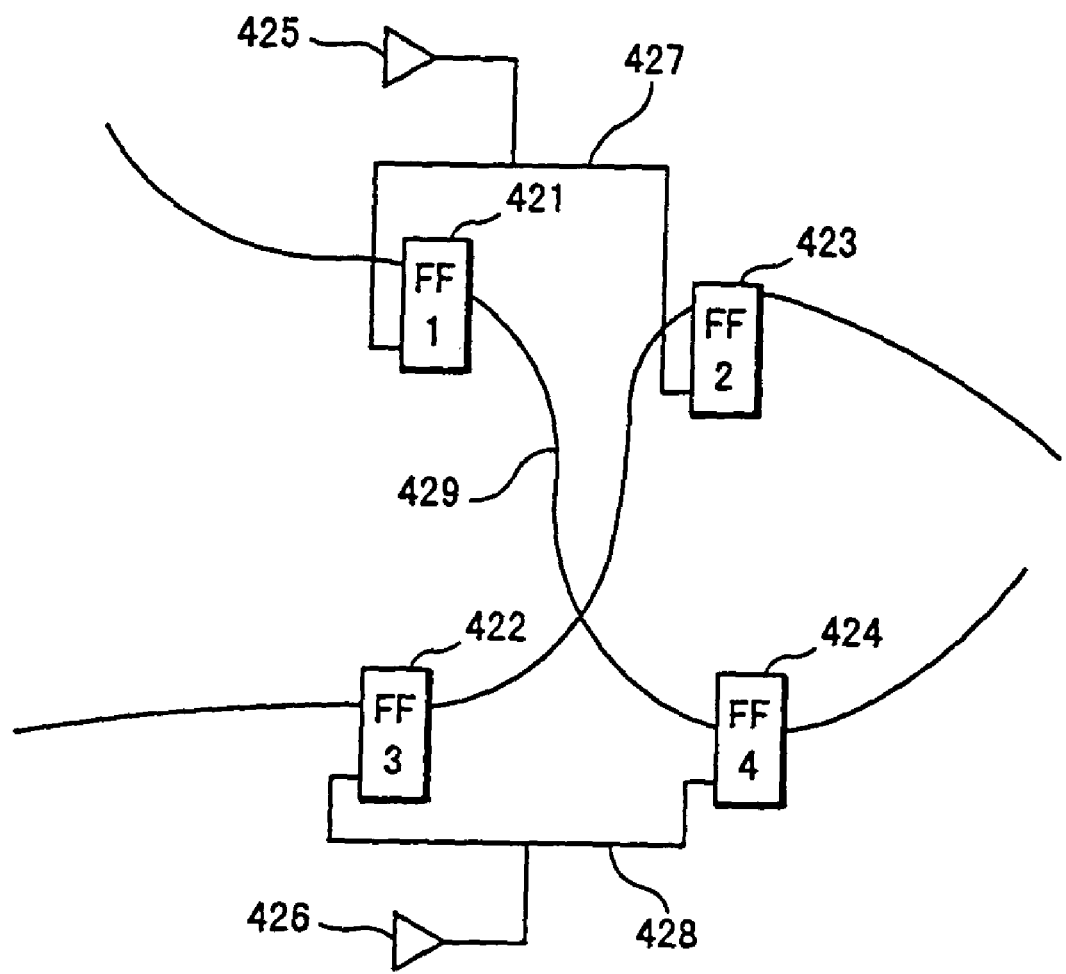
FIG. 65 is a diagram for explaining a placement processing with a clock net taken into consideration according to the conventional method.

FIG. 45 is a diagram for explaining a process which is carried out when flip-flops are subjected to an initial placement processing while the clock net is disregarded. In FIG. 45, reference numerals 251 to 254 depict flip-flops, 255 and 256 clock buffer cells, 257 a clock net for connecting the clock buffer cell and each of the flip-flop cells, and 258 a data path net for connecting the flip-fop cells to one another. According to the embodiment of the present invention, when the flip-flop cells are subjected to the initial placement processing, placement of the flip-flop cells is determined so that the clock net is not taken into consideration and the placement is restricted only by the data path net. Thus, it becomes possible to avoid the problem that the conventional technology shown in FIG. 65 has been encountered, shorten the data path nets, and decrease the degree of complexity in wiring. In this case, the clock net can be relieved from wiring complexity when the clock tree is subjected to the reconstruction processing of the clock tree effected at step S124 of FIG. 21.

Figure 46:
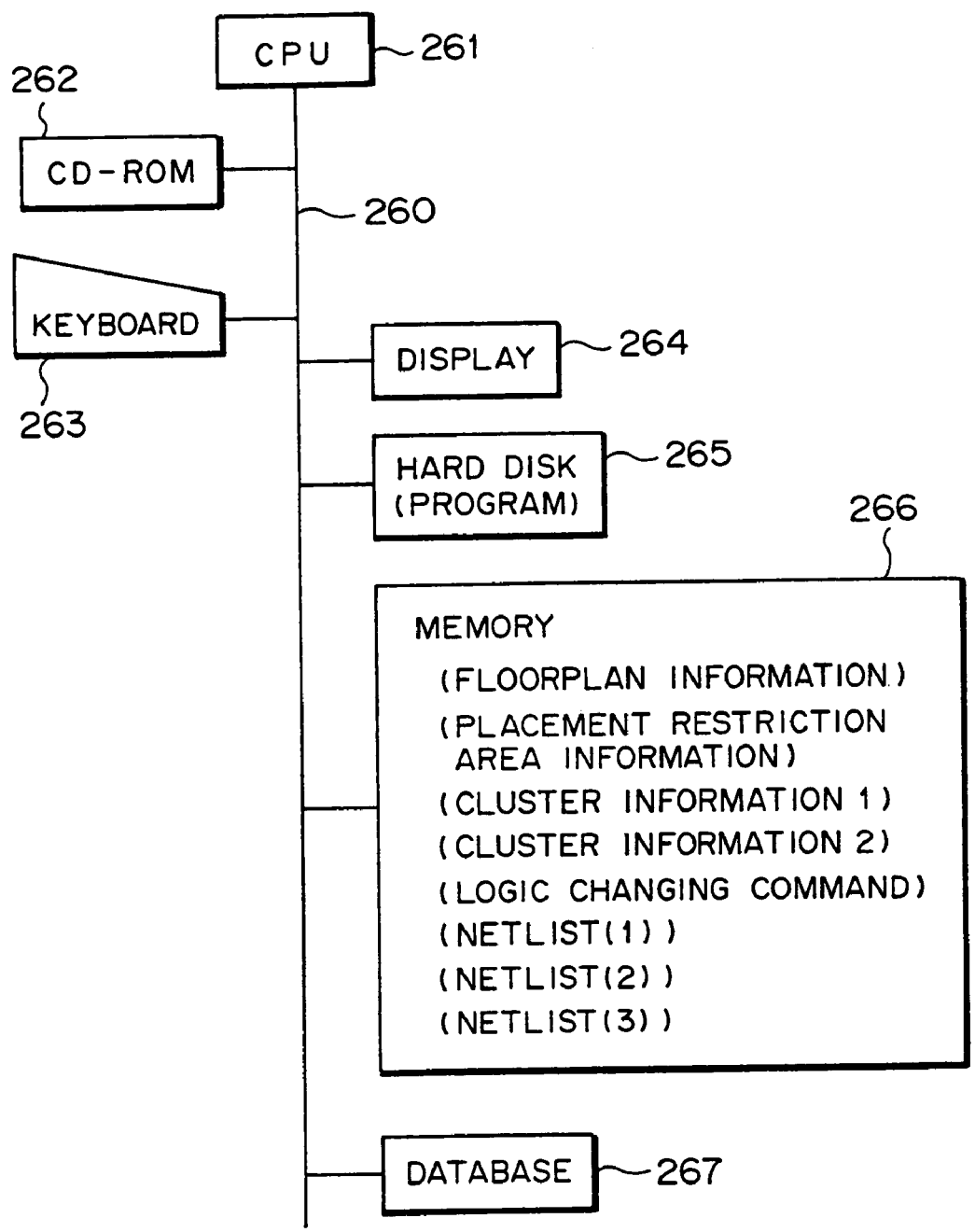
FIG. 46 is a block diagram showing an arrangement of a computer system for implementing a method of the fourth embodiment according to the present invention.
Figure 47:
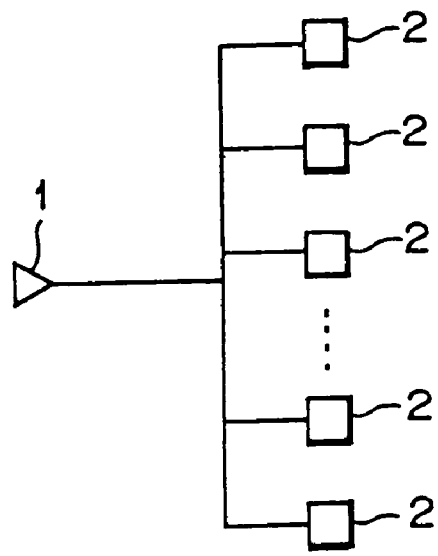
FIG. 47 is a diagram for explaining fan-out restriction.
Figure 48A:
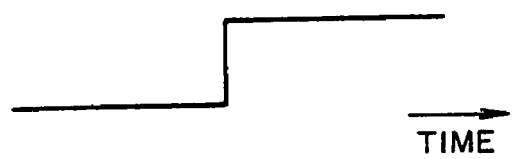
FIGS. 48A and 48B are diagrams showing an ordinary clock signal waveform and a clock signal waveform under condition that the fan-out restriction is not satisfied, respectively.
Figure 48B:
Figure 49:
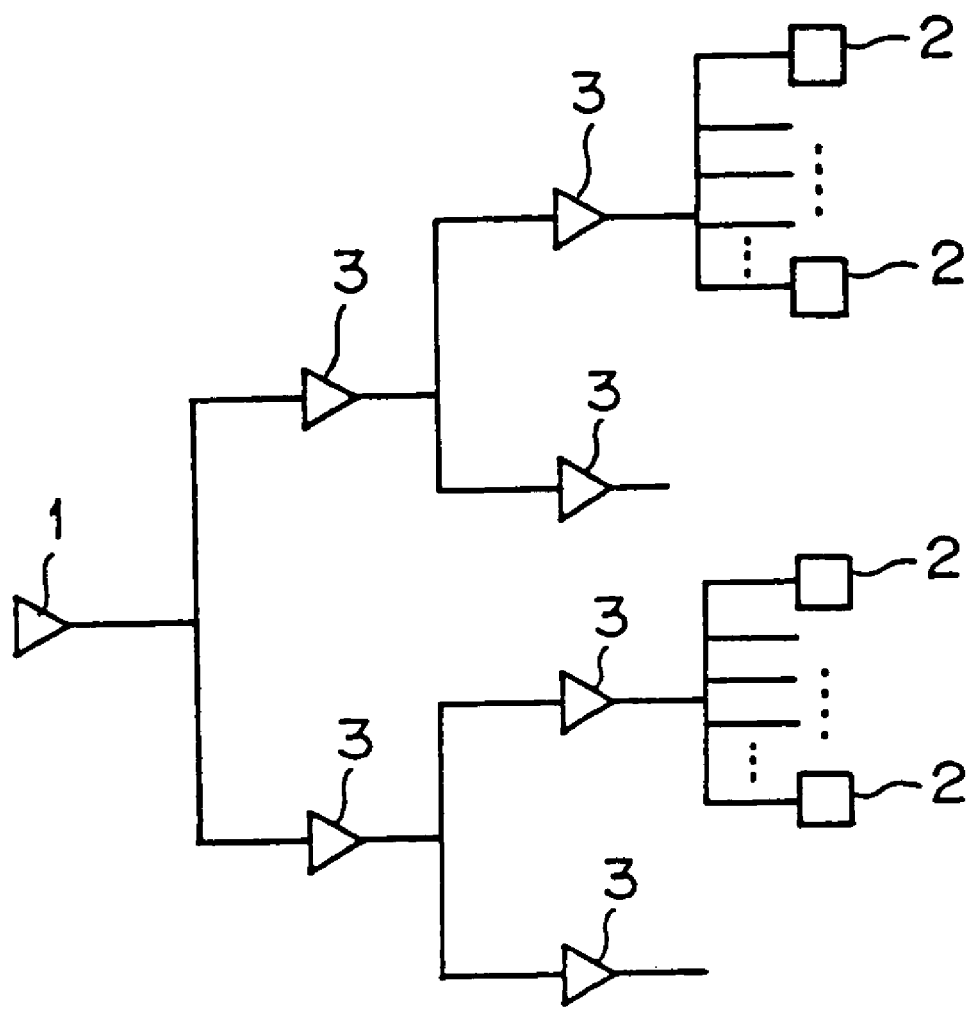
FIG. 49 is a diagram showing an example of a clock tree having undergone a general buffering operation.

FIG. 46 is a block diagram showing an arrangement of a computer system for implementing the method according to the present invention. As shown in FIG. 46, a bus 260 is connected with a central processing unit (CPU) 261, a CD-ROM drive 262, a keyboard 263, a display 264, a hard disk 265, a memory 266, and a database 267. Meanwhile, the program for determining layout of an LSI according to the present invention including the flowchart shown in FIG. 21 may be stored in advance in the hard disk. Alternatively, the program for determining layout of an LSI including the flowchart shown in FIG. 21 may be stored in the CD-ROM, and then the program may be installed from the CD-ROM drive 262 to the hard disk 265. The memory 266 is utilized for storing therein the floorplan information, the placement restriction area information, the first cluster information, the second cluster information, and the first to third netlists which are described with reference to the flowchart of FIG. 21.

When an operator carries out the method of the present invention, the operator operates the keyboard 263 while viewing the screen of the display 264, whereby the process of determining the layout of an LSI is carried out in accordance with the flowchart of FIG. 21.

[5] Other Disclosure

The present invention is not limited to the above described embodiments but various modifications can be effected upon implementing the present invention without departing from the gist of the present invention.

For example, in the description of the first to third embodiment, description has been made on a case where a tree-like clock system net is created. However, the present invention is not limited to the above application but the present invention can be applied to any circuit.

Further, an apparatus for implementing the present invention may be arranged so that the apparatus has all the functions described with the first to fourth embodiments. Alternatively, the apparatus may be arranged so as to have at least two of the four functions described with the first to fourth embodiments. In any case of the above implementation, it becomes possible to obtain effects or advantages described with the above embodiments.

INDUSTRIAL APPLICABILITY

As described above, according to the present invention, a plurality of elements and driven elements are divided into groups so that each group has the same or substantially the same number of elements and load capacity. Therefore, these groups are well balanced in terms of signal distribution through the tree-like signal lines. Accordingly, delay of signal from the signal supplying source to each of the elements is optimized, skew can be positively reduced, and a circuit as an object of the designing will have an arrangement which can cope with a request for increasing the processing speed.

Accordingly, it is considered that the present invention can be suitably utilized for optimizing the delay of signal transmitted from the signal supplying source to each of the elements, when designing an integrated circuit such as a VLSI or the like, and hence skew causing by the delay can also be optimized. Thus, it is considered that the applicability of the present invention is extremely high.

The invention claimed is:

1. A method of designing a circuit having a clock signal supplying source and a plurality of flip-flop cells which are supplied with a clock signal from the clock signal supplying source, the method for designing the circuit comprising:

synthesizing logic of circuit designing contents described in a register transfer level so as to create a first netlist which regulates a connection relationship between the flip-flop cells constituting a circuit to be designed;

executing a floorplan by using the first netlist so as to create a clock tree of the circuit to be designed, and creating a second netlist containing one or more buffer cells for driving the flip-flop cells based on the clock tree;

arranging a clock layout of the circuit to be designed based on floorplan information and the second netlist obtained by executing the floorplan so that the clock layout contains an initial placement of the buffer cells, the flip-flop cells, and clock signal lines connecting the one or more buffer cells and the flip-flop cells; and effecting an ordinary net wiring except for the clock signal lines after arranging the clock layout, wherein in the initial placement, a number of buffer stages are adjusted so that each of the circuit path extending from the clock signal supplying source to the flip-flop cells consists of the same number of buffer stages so that signal delay times of clock signals supplied from the clock signal supplying source to each of the flip-flop cells are equal.

2. A method of designing a circuit according to claim 1, wherein when the initial placement is effected, a placement processing for cells is effected based on the second netlist and the floorplan information while disregarding the net on the clock tree, and then placement positions are determined for the flip-flop cells that should be connected to the clock tree.

3. A method of designing a circuit according to claim 1, wherein after the number of buffer stages is adjusted, the final stage net of the clock tree is extracted from the initial placement of the flip-flop cells, a net area of the extracted final stage net is inspected, a plurality of nets overlaid on one another in the net area are merged together, the merged net is divided so that divided net areas are free from being overlaid, and a buffer cell is allocated to each of the divided nets, whereby a net reconstruction is carried out so that the net areas are free from being overlaid.

4. A method of designing a circuit according to claim 2, wherein when the clock layout is effected, a placement position of the buffer cell on the clack tree is determined in a bottom-up manner based on the flip-flop placement result which has been obtained by carrying out the cell placement processing while disregarding the net on the clock tree, cluster information of the flip-flop cells is created for each final stage buffer of the clock tree in accordance with the placement information of the flip-flop cells driven by the buffer, placement restriction area information is created about each of the buffer cells, and then a placement processing is retried on the cells other than the buffer cell with retried placement restriction area information and the cluster information utilized as a restriction value.

5. A method of designing a circuit according to claim 4, wherein after the placement processing is retried, cluster information is created for each net of the clock tree from the placement position of the driven cells, the driven cells having been arranged as a cluster are subjected to cluster wiring in each created cluster, and wiring is arranged so that signal lines extend from a driving cell to each of the clusters in a radiating manner.

6. A method of designing a circuit according to claim 3, wherein after the placement processing of the buffer cell on the clock tree is determined in the bottom-up fashion, the clock tree is reconstructed, and when the reconstruction processing is carried out, a logic change command is issued to a netlist file upon changing clock logic, and the second netlist is changed in accordance with the logic change command, whereby a third netlist is created so as to contain a clock logic which is coincident with a clock logic on a layout database.

7. A recording medium having stored therein a program for forcing a computer to aid in designing a circuit having a clock signal supplying source and a plurality of flip-flop cells which are supplied with a dock signal from the clock signal supplying source, the program forcing the computer to carry out sequentially the following, comprising:

synthesizing logic of circuit designing contents described in a register transfer level so as to create a first netlist which regulates a connection relationship between the flip-flop cells constituting a circuit to be designed;

executing a floorplan by using the first netlist so as to create a clock tree of the circuit to be designed, and creating a second netlist containing one or more buffer cells for driving the flip-flop cells based on the clock tree;

arranging a clock layout of the circuit to be designed based on floorplan information and the second netlist obtained by executing the floorplan so that the clock layout contains an initial placement of the buffer cells, the flip-flop cells, and clock signal lines connecting the one or more buffer cells and the flip-flop cell; and effecting an ordinary net wiring except for the clock signal lines after arranging the clock layout, wherein in the initial placement, the program causes the computer to adjust a number of buffer stages so that each of the circuit paths extending from the clock signal supplying source to the flip-flop cells consists of the same number of buffer stages so that signal delay times of clock signals supplied from the clock signal supplying source to each of the flip-flop cells are equal.

8. A recording medium having stored therein a program for forcing a computer to aid in designing a circuit according to claim 7, wherein when the initial placement is effected, a placement processing for cells is effected based on the second netlist and the floorplan information while disregarding a net on the clock tree, and then placement positions are determined for the flip-flop cells that should be connected to the clock tree.

9. A recording medium having stored therein a program for forcing a computer to aid in designing a circuit according to claim 7, wherein after the number of buffer stages is adjusted, the final stage net of the clock tree is extracted from the initial placement of the flip-flop cells, a net area of the extracted final stage net is inspected, a plurality of nets overlaid on one another in the net area are merged, the merged net is divided so that divided net areas are free from being overlaid, and a buffer cell is allocated to each of the divided nets, whereby a net reconstruction is carried out so that the net areas are free from being overlaid.

10. A recording medium having stored therein a program for forcing a computer to aid in designing a circuit according to claim 8, wherein when the clock layout is arranged, a placement position of the buffer cell on the clock tree is determined in a bottom-up manner based on the flip-flop placement result which has been obtained by carrying out the cell placement processing while disregarding the net on the dock tree, cluster information of the flip-flop cells is created for each final stage buffer of the clock tree in accordance with the placement information of the flip-flop cells driven by the buffer, placement restriction area information is created about each of the buffer cells, and then a placement processing is retried on the cells other than the buffer cell with retried placement restriction area information and the cluster information utilized as a restriction value.

11. A recording medium having stored therein a program for forcing a computer to aid in designing a circuit according to claim 10, wherein after the placement processing is retried, cluster information is created for each net of the clock tree from the placement position of the driven cells, the driven cells having been arranged as a cluster are subjected to cluster wiring in each created cluster, and wiring is arranged so that signal lines extend from a driving cell to each of the clusters in a radiating manner.

12. A recording medium having stored therein a program for forcing a computer to aid in designing a circuit according to claim 9, wherein after the placement processing of the buffer cell on the clock tree is determined in the bottom-up fashion, the clock tree is reconstructed, and when the reconstruction processing is carried out, a logic change command is issued to a netlist file upon changing clock logic, and the second netlist is changed in accordance with the logic change command, whereby a third netlist is created so as to contain a clock logic which is coincident with a clock logic on a layout database.

13. An apparatus for designing a circuit having a clock signal supplying source and a plurality of flip-flop cells which are supplied with a clock signal from the clock signal supplying source, comprising:

means for synthesizing logic of circuit designing contents described in a register transfer level so as to create a first netlist which regulates a connection relationship between the flip-flop cells constituting a circuit to be designed;

means for executing a floorplan by using the first netlist so as to create a clock tree of the circuit to be designed, and creating a second netlist containing one or more buffer cells for driving the flip-flop cells based on the clock tree;

means for arranging a clock layout of the circuit to be designed based on floorplan information and the second netlist obtained by executing the floorplan so that the clock layout contains an initial placement of the buffer cells, the flip-flop cells, and clock signal lines connecting the one or more buffer cells and the flip-flop cells; and means for effecting an ordinary net wiring except for the clock signal lines after arranging the clock layout, wherein in the initial placement, a number of buffer stages are adjusted so that each of the circuit path extending from the clock signal supplying source to the flip-flop cells consists of the same number of buffer stages so that signal delay times of clock signals supplied from the clock signal supplying source to each of the flip-flop cells are equal.

* * * * *

UNITED STATES PATENT AND TRADEMARK OFFICE
CERTIFICATE OF CORRECTION

| | |
|---|---|
| PATENT NO. | : 7,032,198 B2 |
| APPLICATION NO. | : 10/634815 |
| DATED | : April 18, 2006 |
| INVENTOR(S) | : Masahiro Sano et al. |

Page 1 of 1

It is certified that error appears in the above-identified patent and that said Letters Patent is hereby corrected as shown below:

Col. 35, line 49, change "clack" to --clock--.

Col. 36, line 17, change "dock" to --clock--

Col. 37, line 3, change "dock" to --clock--

Signed and Sealed this

Twenty-second Day of August, 2006

JON W. DUDAS
*Director of the United States Patent and Trademark Office*